(12) United States Patent
Sun et al.

(10) Patent No.: US 10,454,077 B2
(45) Date of Patent: Oct. 22, 2019

(54) MODULAR DESIGN OF A 48-VOLT LI-ION BATTERY FOR EASE OF ASSEMBLY AND DISASSEMBLY

(71) Applicant: Johnson Controls Technology Company, Holland, MI (US)

(72) Inventors: Qiong Sun, Farmington Hills, MI (US); George Yu, Milwaukee, WI (US); Xiaolong Zhong, Shanghai (CN); Wei Qu, Shanghai (CN); Rui Li, Shanghai (CN); Peng Song, Shanghai (CN); Binbin Fan, Shanghai (CN); Yang Yu, Shanghai (CN)

(73) Assignee: CPS TECHNOLOGY HOLDINGS LLC, New York, NY (US)

( * ) Notice: Subject to any disclaimer, the term of this patent is extended or adjusted under 35 U.S.C. 154(b) by 83 days.

(21) Appl. No.: 15/524,355

(22) PCT Filed: Nov. 3, 2015

(86) PCT No.: PCT/CN2015/093741
§ 371 (c)(1),
(2) Date: May 4, 2017

(87) PCT Pub. No.: WO2016/070802
PCT Pub. Date: May 12, 2016

(65) Prior Publication Data
US 2018/0277802 A1    Sep. 27, 2018

Related U.S. Application Data

(60) Provisional application No. 62/075,154, filed on Nov. 4, 2014.

(51) Int. Cl.
*H01M 2/02* (2006.01)
*H01M 10/0525* (2010.01)
(Continued)

(52) U.S. Cl.
CPC .............. *H01M 2/0242* (2013.01); *B60K 6/28* (2013.01); *B60L 50/64* (2019.02); *B60L 50/66* (2019.02);
(Continued)

(58) Field of Classification Search
CPC .. H01M 2/1077; H01M 10/643; H01M 2/105; H01M 10/0422; B60L 11/1877
See application file for complete search history.

(56) References Cited

U.S. PATENT DOCUMENTS 6,346,011 B1 * 2/2002 Ikeda .................. H01M 2/1077
439/500
6,399,238 B1 6/2002 Oweis et al.
(Continued)

FOREIGN PATENT DOCUMENTS

CN    102195100        9/2011
CN    102369628 A      3/2012
(Continued)

OTHER PUBLICATIONS

PCT/CN2015/093741 International Search Report and Written Opinion dated Jan. 21, 2016.
(Continued)

*Primary Examiner* — Imran Akram
(74) *Attorney, Agent, or Firm* — Fletcher Yoder, P.C.

(57) ABSTRACT

The present invention provides a battery that includes a plurality of serially connected battery cells. The battery includes an upper housing and a lower housing. The battery comprises: a wire harness assembly; a middle housing that includes a plurality of cell chambers for accommodating the top sections of the plurality of serially connected battery cells. The lower housing includes a plurality of cell chambers for accommodating the bottom sections of the plurality of serially connected battery cells 102; and the middle (Continued)

housing has a top surface for installing the wire harness assembly (1106) and the plurality of cell chambers beneath the top surface (1102) of the middle housing.

14 Claims, 44 Drawing Sheets

(51) Int. Cl.
| | |
|---|---|
| *H01M 2/30* | (2006.01) |
| *H01M 2/20* | (2006.01) |
| *H01M 10/48* | (2006.01) |
| *H01M 10/42* | (2006.01) |
| *B60K 6/28* | (2007.10) |
| *H02J 7/00* | (2006.01) |
| *G01R 31/36* | (2019.01) |
| *G01R 31/374* | (2019.01) |
| *G01R 31/382* | (2019.01) |
| *G01R 19/165* | (2006.01) |
| *H01M 10/633* | (2014.01) |
| *H01M 10/04* | (2006.01) |
| *B60L 50/60* | (2019.01) |
| *B60L 50/64* | (2019.01) |

(52) U.S. Cl.
CPC ..... *G01R 19/16542* (2013.01); *G01R 31/374* (2019.01); *G01R 31/382* (2019.01); *H01M 2/206* (2013.01); *H01M 2/305* (2013.01); *H01M 10/0422* (2013.01); *H01M 10/0525* (2013.01); *H01M 10/425* (2013.01); *H01M 10/4207* (2013.01); *H01M 10/4257* (2013.01); *H01M 10/482* (2013.01); *H01M 10/486* (2013.01); *H01M 10/633* (2015.04); *H02J 7/0014* (2013.01); *H02J 7/0016* (2013.01); *H02J 7/0026* (2013.01); *H02J 7/0031* (2013.01); *B60L 2240/547* (2013.01); *B60Y 2200/92* (2013.01); *B60Y 2400/112* (2013.01); *H01M 2010/4271* (2013.01); *H01M 2220/20* (2013.01); *Y02T 10/705* (2013.01); *Y02T 10/7011* (2013.01); *Y02T 10/7055* (2013.01); *Y10S 903/907* (2013.01)

(56) References Cited

U.S. PATENT DOCUMENTS

| | | | |
|---|---|---|---|
| 6,410,185 B1* | 6/2002 | Takahashi | B60K 6/28 |
| | | | 429/163 |
| 8,530,069 B2 | 9/2013 | Wood et al. | |
| 9,225,045 B2 | 12/2015 | Houchin-Miller et al. | |
| 2008/0220324 A1* | 9/2008 | Phillips | B25F 5/02 |
| | | | 429/120 |
| 2008/0286636 A1* | 11/2008 | Naito | H01M 2/105 |
| | | | 429/98 |
| 2010/0047676 A1* | 2/2010 | Park | H01M 2/105 |
| | | | 429/93 |
| 2011/0223468 A1 | 9/2011 | Ferber, Jr. | |
| 2011/0269008 A1* | 11/2011 | Houchin-Miller | |
| | | | B60L 11/1874 |
| | | | 429/120 |
| 2012/0164509 A1* | 6/2012 | Ogasawara | H01R 9/226 |
| | | | 429/121 |
| 2013/0252032 A1* | 9/2013 | Zhao | H01M 2/1077 |
| | | | 429/7 |
| 2013/0273412 A1* | 10/2013 | Okada | H01M 2/206 |
| | | | 429/158 |
| 2013/0302662 A1* | 11/2013 | Ogasawara | H01M 2/206 |
| | | | 429/158 |
| 2014/0093755 A1* | 4/2014 | Houchin-Miller | |
| | | | H01M 2/1077 |
| | | | 429/50 |
| 2014/0255748 A1* | 9/2014 | Jan | H01M 2/202 |
| | | | 429/120 |
| 2015/0329176 A1* | 11/2015 | Inoue | B62K 19/30 |
| | | | 180/220 |

FOREIGN PATENT DOCUMENTS

| | | |
|---|---|---|
| CN | 103326082 A | 9/2013 |
| CN | 203386860 U | 1/2014 |
| JP | 2012059663 A | 3/2012 |
| WO | 2008074034 | 6/2008 |

OTHER PUBLICATIONS

EP 15856333.8 European Search Report dated Feb. 20, 2018.
EP 15856333.8 Communication Pursuant to Article 94(3) dated Oct. 31, 2018.
CN 201580061475.4 Office Action dated Dec. 4, 2018.

\* cited by examiner

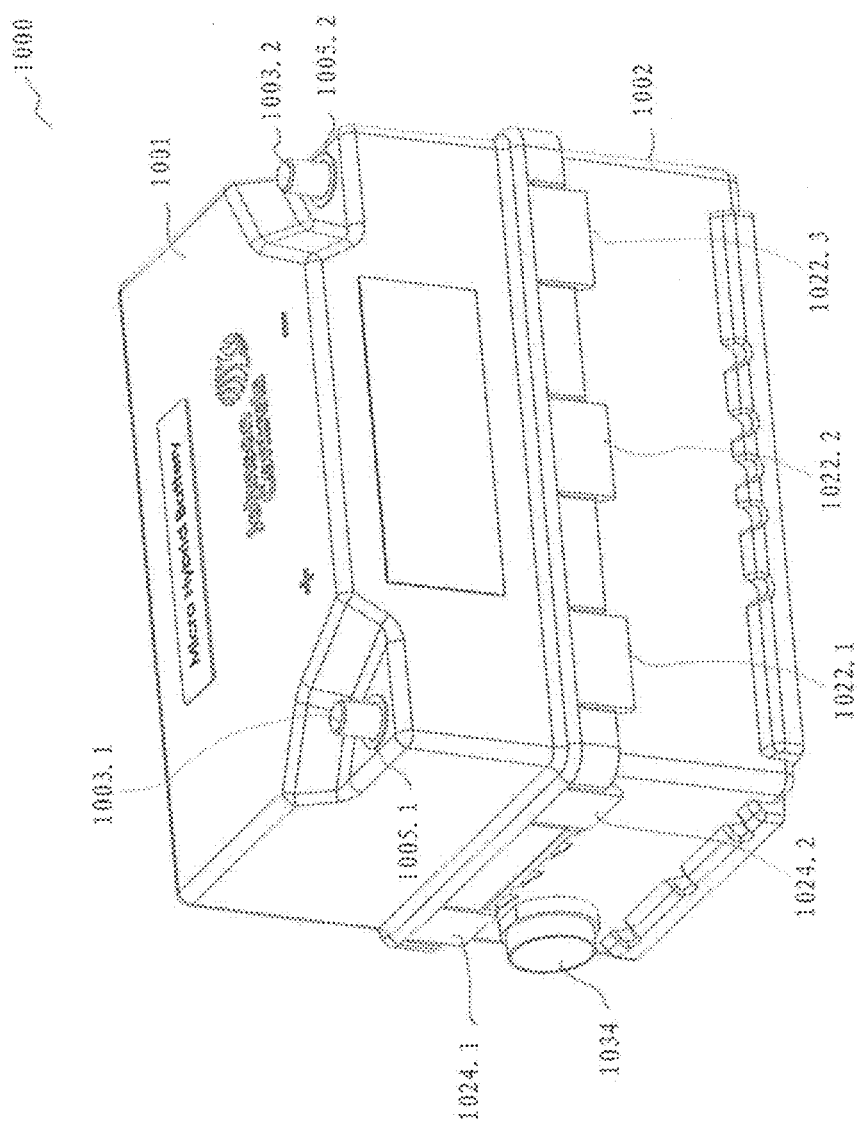

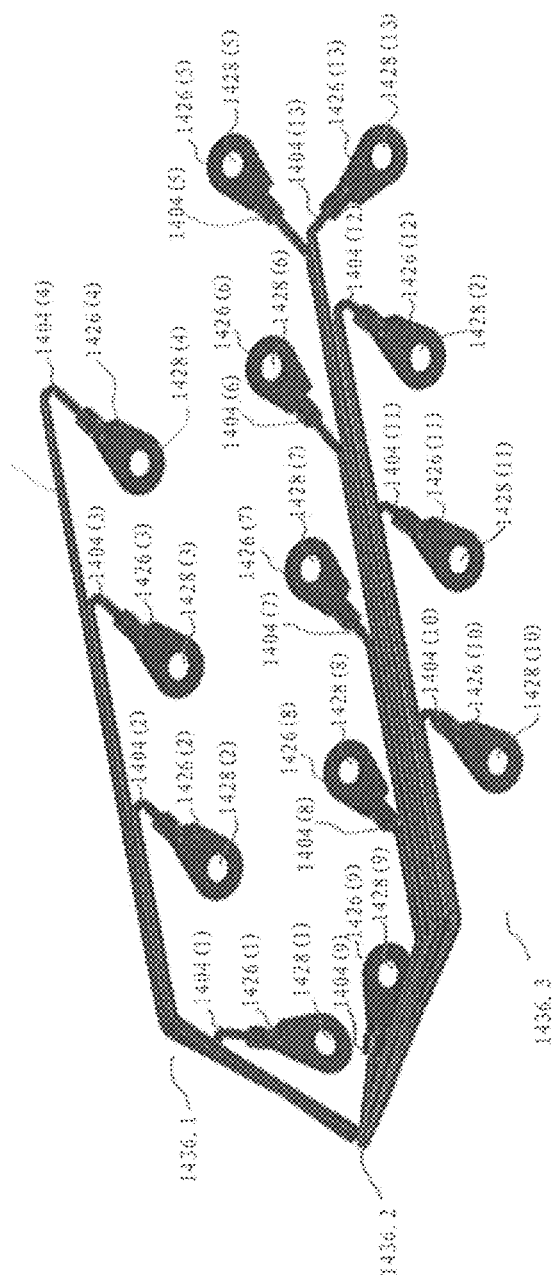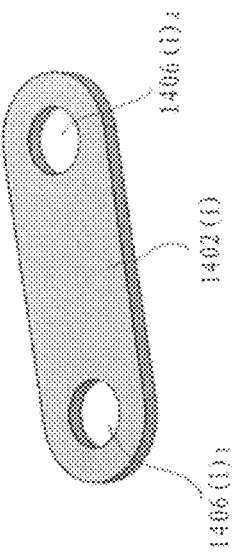
Fig. 14B

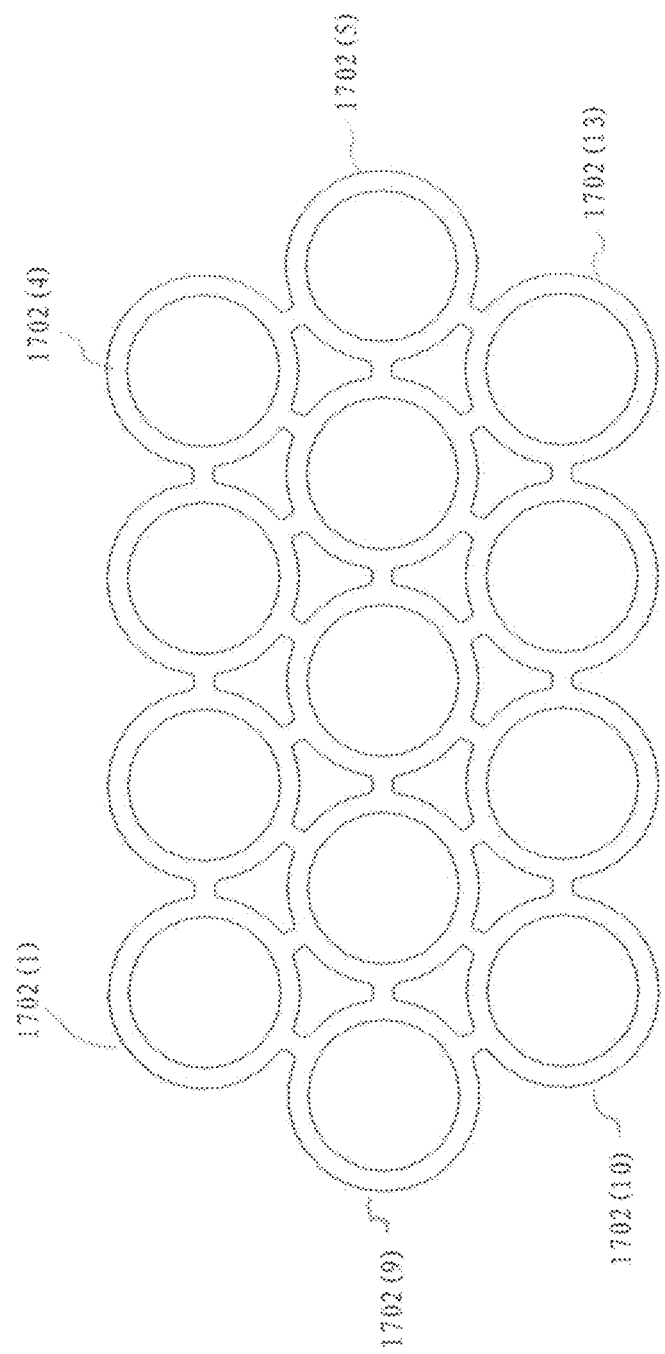

MODULAR DESIGN OF A 48-VOLT LI-ION BATTERY FOR EASE OF ASSEMBLY AND DISASSEMBLY

TECHNICAL FIELD

The present invention relates to a control system for a battery pack formed by a plurality of battery cells, and particularly to a control system for a battery pack formed by a plurality of serially-connected battery cells which is used for hybrid vehicles.

The present invention also relates to a battery formed by a plurality of battery cells, and particularly to a battery, which is formed by a plurality of serially-connected battery cells, for hybrid vehicles.

BACKGROUND OF THE INVENTION

In addition to needing a traditional engine, a hybrid vehicle needs to use a DC power source with a certain voltage as its supplemental power source, and a battery pack formed by a plurality of serially-connected battery cells can be used as the DC power source with a certain voltage. For example, several serially-connected battery cells each having a 3.6V DC voltage can form a battery pack with 48V DC voltage.

Although a DC power source with certain voltage can be conveniently formed by a plurality of serially-connected battery cells, some drawbacks exist in using such a DC power source to supply power to hybrid vehicles. Typically, manufacturing environment and/or manufacturing process of battery cells may cause random differences for the working parameters (such as the differences of the internal resistances and non-homogeneities in chemical materials or capacity of battery cells) among battery cells in a battery pack.

During the operation of a hybrid vehicle, random environment and/or operation conditions may dynamically cause further differences for the working parameters among the battery cells in a battery pack. For example, different charging and discharging patterns in battery cell application and non-homogeneities of cell thermal distribution due to the location of the cells in a battery pack (or module) may further aggravate the non-uniformity of the battery cells in a battery pack.

When differences of working parameters among the battery cells in a battery pack become too unbalanced, the battery back may not be able to properly operate a hybrid vehicle. For example, some of the battery cells in a battery pack may overheat; or the voltage differences among the battery cells in a battery pack become too large; or the battery pack may be unable to provide sufficient current to meet the instant operation needs of a hybrid vehicle. Under these fault conditions, the battery pack is unable to operate a hybrid vehicle properly.

Therefore, it is desirable to provide a battery pack control system to enable a battery pack, which is formed by a plurality of serially-connected battery cells, to properly, effectively and efficiently supply DC power source to hybrid vehicles.

It is also desirable to provide a battery structure that can be used to more efficiently manufacture a battery, which includes a plurality of serially-connected battery cells, with efficiency to assemble, high quality and low costs.

SUMMARY OF THE INVENTION

To achieve one of the above-mentioned objectives, the present invention provides a battery, which comprises:

a plurality of serially connected battery cells;
an upper housing and a lower housing;
a middle housing that includes a plurality of cell chambers for accommodating the top-half sections of the plurality of serially connected battery cells;
wherein the lower housing includes a plurality of cell chambers for accommodating the bottom-half sections of the plurality of serially connected battery cells;
wherein the middle housing has a top surface for installing the wire harness assembly and the plurality of cell chambers beneath the top surface of the middle housing.

BRIEF DESCRIPTION OF DRAWINGS

FIGS. 7C-D show a wave form of the first controls signal, the second control signal and switch driving signal;

FIG. 10 depicts a battery 1000 that comprises an upper (or top) housing 1001 and a lower (or bottom) housing 1002 according to the present invention;

FIG. 14B shows the voltage-sense-wire harness 1304 and one bus bar 1402(j) in the bus-bar harness 1302 in greater details;

FIG. 17 depicts the cell bottom foam 1109 shown in FIG. 11A in greater details;

FIGS. 20A-J show the steps of assembling the components shown in FIGS. 10-19 into a battery 1000 according to the present invention.

DESCRIPTION OF PREFERRED EMBODIMENTS

Various embodiments of the present invention will be described with reference to the accompany drawings which form a part of the description. In the following drawings, identical components are designated with identical reference numbers, and similar components are designated with similar reference numbers to avoid repeated descriptions.

Figure 1A:
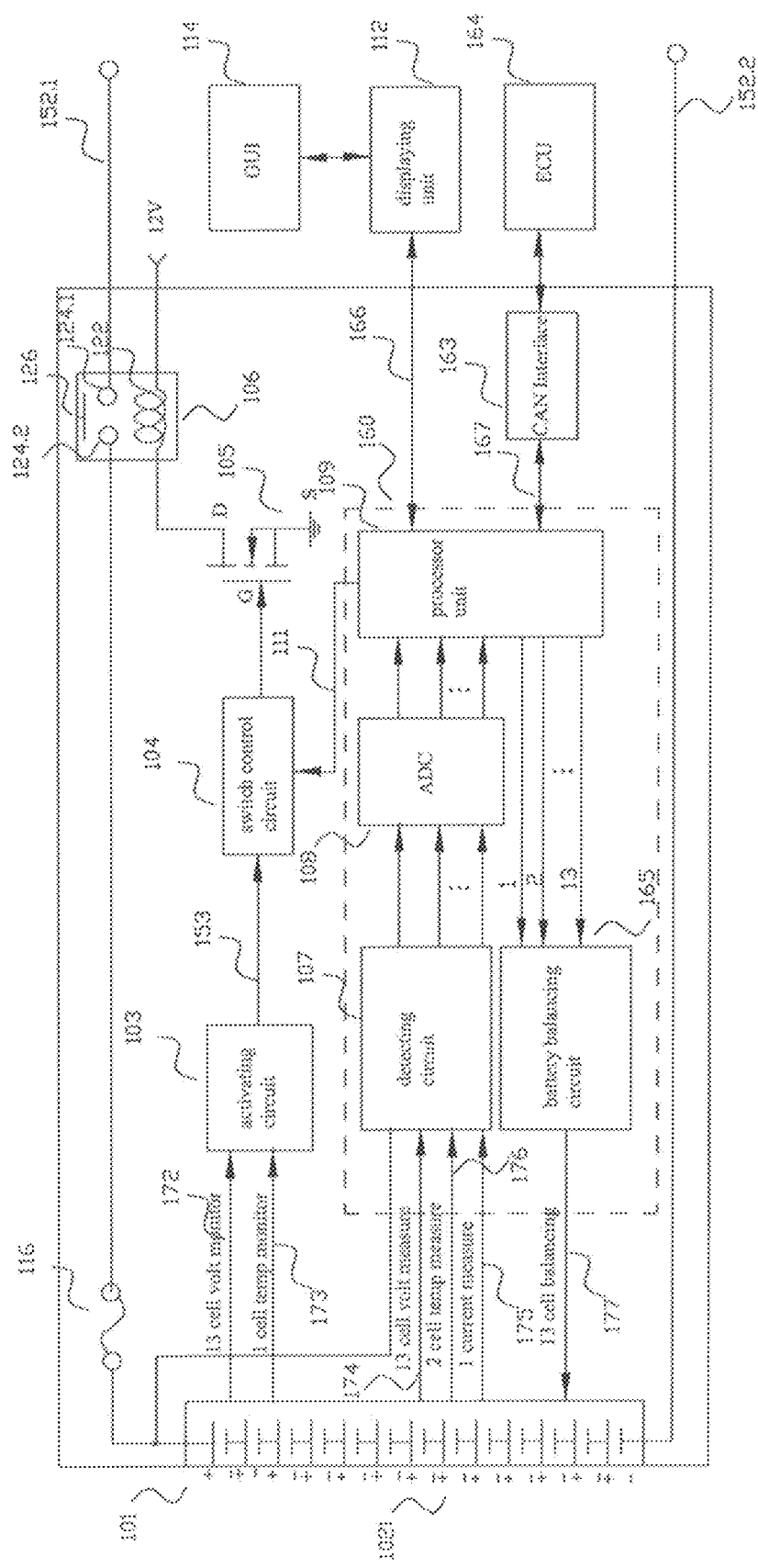
FIG. 1A shows a battery management system 100 according to a first embodiment of the present invention.

FIG. 1A shows a battery management system 100 for controlling a battery pack 101, which is formed by a plurality of serially connected battery cells 102(i) (i=1, 2, . . . , 13), according to a first embodiment of the present invention. As shown in FIG. 1A, the battery management system 100 comprises an activating circuit (or an instant activating circuit) 103, a supervision unit 160, a current protective device (fuse) 116, a switch control circuit (or switch driving circuit) 104, a switch transistor 105 and a switch device 106 (which includes a coil 122, a pair of stationary contactors (124.1, 124.2) and a movable sheet or a movable plate 126) and a CAN (Controller Area Network) Interface 163, which is a standard interface and adapted to communicate with the ECU 164 of a hybrid vehicle. Via the CAN interface 163, the battery management system 100 is connected to an ECU Engine Control Unit) 164 of a hybrid vehicle. The battery management system 100 is further connected to GUI (Graphics User Interface) 114 via a displaying unit 112.

As shown FIG. 1A, the battery pack 101 comprises a plurality of battery cells 102(i) (i=1, 2, . . . , n) that are serially connected to form the battery pack 101. Each battery cell 102(i) in the battery pack 101 has a specific voltage; the battery pack 101 formed by the serially-connected plurality of battery cells 102(i) (i=1, 2, . . . , n) can provide a DC power source with a pre-determined voltage to a hybrid vehicle. In the embodiment of the present invention, the normal voltage of each battery cell 102(i) is about 3.65V; the battery pack 101 has 13 battery cells 102(i) (i=1, 2, . . . , 13), and the normal power output of the battery pack 101 is around 48V. The battery pack 101 has two output terminals (the positive output terminal 152.1 and negative output terminal 152.2). The positive output terminal 152.1 is serially connected to a current protective device (fuse) 116 so that the current protective device (fuse) 116 will break the connection of the two output terminals when the current passing through the positive output terminal 152.1 exceeds a predetermined amount (such as 200 Amps, for example).

Referring to FIG. 1A, the activating circuit (or the instant activating circuit) 103 performs the function of detecting (measuring or sampling) one or more operation parameters (or one or more operation conditions) of the 13 battery cells 102(i) (i=1, 2, . . . , 13) in the battery pack 101. The one or more operation parameters include the working voltages of all 13 battery cells and temperature of one (or at least one) selected battery cell in the battery pack 101. As shown in FIG. 1A, the activating circuit (or the instant activating circuit) 103 has 13 connections 172 with the battery pack 101 for continuously measuring (or sampling) the voltages of the 13 battery cells and a connection 173 with the battery pack 101 for continuously measuring (or sampling) the temperature of one (or at least one) selected battery cell in the battery pack 101. The activating circuit (or the instant activating circuit) 103 sets three critical thresholds, through hardware approach, for the one or more operation conditions (or one or more operation parameters) of the 13 battery cells in the operation of a hybrid vehicle, namely, a high-critical-voltage threshold, a low-critical-voltage threshold, and/or a high-critical-temperature threshold. As one embodiment, the present invention uses the battery cells are lithium-ion battery cells. The maximum voltage of a lithium-ion battery cell is 4.1V and the normal voltage of a lithium-ion battery cell is 3.6V. Based on the characteristics of a lithium-ion battery cell, the high-critical-voltage threshold, low-critical-voltage threshold and high-critical-temperature threshold can be set at 3.9V, 2.1V and 55 degree C., respectively, according to one embodiment of the present invention.

After receiving the sampled voltages for the 13 battery cells and/or the sampled temperature of the selected battery cell in the battery pack 101, the activating circuit 103 compares them, through hardware approach, with the three critical thresholds. If any of the sampled voltages exceeds the high-critical-voltage threshold or the any of the sampled voltages is below the low-critical-voltage threshold, or the sampled temperature exceeds the high-critical-temperature threshold, the activating circuit 103 generates a control signal (a first control signal), through hardware approach. The first control signal can be a binary state signal in a format as shown in FIGS. 7C-D. Specifically, when any of the sampled voltages is above the high-critical-voltage threshold, or any of the sampled voltages is below the low-critical-voltage threshold, or the sampled temperature exceeds the high-critical-temperature threshold; the activating circuit 103 generates (or sets) the first control signal into a second voltage state (such as a high voltage level 704 as shown in FIG. 7C, or a low voltage level 708 as shown in FIG. 7D); when all of the sampled voltages are above the low-critical-voltage threshold, but below the high-critical-voltage threshold, and the sampled temperature is below the high-critical-temperature threshold, the activating circuit 103 generates (or sets) the first control signal into a first voltage state (such as a low voltage level 703 shown in FIG. 7C, or a high voltage level 707 as shown in FIG. 7D). The first control signal is then provided to the switch control signal circuit 104 via connection 153 to connect the battery pack 101 to or disconnect the battery pack 101 from the two output terminals 152.1 and 152.2.

Further referring to FIG. 1A, the supervision unit 160 performs the functions of detecting one or more operation parameters (or one or more operation conditions or) of the 13 battery cells 102(i) (i=1, 2, . . . , 13) and for monitoring and adjusting the operation conditions of the battery pack 101. As shown in FIG. 1A, the supervision unit 160 comprises a detecting circuit (a second detecting circuit) 107, a battery balancing circuit 165, an ADC (A-D Converter) 108 and a processor unit 109. The detecting circuit (a second detecting circuit) 107 has 13 connections 174 with the battery pack 101 for continuously measuring (or sampling) the voltages of the 13 battery cells, 2 connections 175 with the battery pack 101 for continuously measuring (or sampling) the temperatures of the selected two of the 13 battery cells in the battery pack 101, and a connection 176 with the battery pack 101 for continuously measuring (or sampling) the operation (or working) current from the serially-connected 13 battery cells in the battery pack. The ADC 108 receives the sampled voltages, sampled temperatures and sampled current from the detecting circuit (the second detecting circuit) 107 and converts them from analog format signals to digital format signals. The ADC 108 then sends the digitized sampled voltages, sampled temperatures and sampled current to the processor unit 109 for further processing the digitized sampled voltages, sampled temperatures and sampled current.

The processor unit 109 stores one or more cap-level thresholds in its memory device (shown in FIG. 8 as element 803) for comparing the sampled voltages, sampled temperatures and/or the sampled current of the 13 battery cells in operation. The one or more cap-level thresholds include a high-cap-voltage threshold, a low-cap-voltage threshold, a high-cap-temperature threshold, and/or a high-cap-current threshold. Based on the characteristics of a Lithium-ion VL6P battery cell, the high-cap-voltage threshold, low-cap-voltage threshold, high-cap-temperature threshold and high-cap-current can be selected as 3.8V, 2.4V, 50 degree C. and 200 Amps according to one embodiment of the present invention. Therefore, according to one embodiment of the present invention, the working voltage for each of the battery cells in the battery pack 101 is between 2.4V-3.8V.

After receiving the sampled voltages, sampled temperatures and/or the sampled current of the 13 battery cells from the ADC 108, the processor unit 109 compares them with the above-mentioned cap-level thresholds. If any of the sampled voltages exceeds the high-cap-voltage threshold or any of the sampled voltages is below (or equals to) the low-cap-voltage threshold, or the sampled temperature exceeds (or equals to) the high-cap-temperature threshold, or the sampled current exceeds (or equals to) the high-cap-current threshold, the processor unit 109 generates a control signal (i.e., a second control signal), through software (or programmable) approach. The second control signal can be a binary state signal in a format as shown in FIGS. 7C-D. Specifically, when the sampled temperature exceeds (or equals to) the high-cap-temperature threshold, any of the sampled voltages is below (or equals to) the low-cap-voltage threshold, or the sampled current exceeds (or equals to) the high-cap-current threshold, the processor unit 109 generates (or sets) the second control signal in a second voltage state (such as a high voltage level 704 shown in FIG. 7C, or a low voltage level 708 as shown in FIG. 7D). When all of the sampled voltages are above (or equals to) the low-cap-voltage threshold, but below (or equals to) high-cap-voltages, the sampled temperature is below the high-cap-temperature threshold, and the sampled current is below (or equals to) the high-cap-current threshold; the processor unit 109 generates (or sets) the second control signal into a first voltage state (such as a low voltage level 703 shown in FIG. 7C, or a high voltage level 707 as shown in FIG. 7D). The second control signal is then provided to the switch control circuit 104 via a connection 111 to connect the battery 101 to or disconnect the battery pack 101 from the two output terminals 152.1 and 152.2.

After receiving the digitized sampled voltages for the 13 battery cells in the battery pack 101 from the ADC 108, the processor unit 109 compares all voltages of the 13 sampled voltages among each other to determine whether to send balancing control signals (or battery cell balancing control signals) to the battery balancing circuit 165 for activating one or more battery balancing control circuit 720 (i) (i=1, 2, . . . , 13) (shown in FIG. 7B) to adjust the voltage(s) for one or more selected battery cells in the battery pack 101. As shown in FIG. 1A, the battery balancing circuit 165 has 13 connections 177 with each one being connected to a respective one of the 13 battery cells in the battery pack 101.

Further referring to FIG. 1A, as one embodiment of the present invention, in responding to the first control signal received from the activating circuit 103 through connection 153 or the second control signal from the supervision unit 160 through connection 111, the switch control circuit 104 generates a driving signal, which is also in binary state in a format shown in FIGS. 7C-D, and send the driving signal to the switch transistor 105. Specifically, in responding to a high voltage state of the first control signal or to a high voltage state of the second control signal, the switch control circuit 104 generates (or sets) a driving signal in high voltage state; but in responding to a low voltage state of the first control signal and the second control signal, the switch control circuit 104 generates (or sets) the driving signal generated from in low voltage state. The function of the switch control circuit (or switch driving circuit) 104 is to amplify the power of the first control signal from the activating circuit 103 and the second control signal from the supervision unit 160. The driving signal of the switch control circuit (or switch driving circuit) 104 has the same voltage phase with that of the first control signal or the second control signal. More specifically, when the first control signal or the second control signal is in a high voltage state, the driving signal is in high voltage state; when the first control signal and the second control signal is in a low voltage state, the driving signal is in a low voltage state. As one embodiment of the present invention, a standard LSD (low side driver) amplify circuit can perform the function of the switch control circuit (or switch driving circuit) 104.

As shown in FIG. 1A, the switch transistor 105 is an n-channel field-effect transistor, which has a gate (G), a drain (D) and a source (S). In FIG. 1A, the output of the switch control circuit 104 is coupled to the gate (G) of the n-channel field-effect transistor with its source (S) being connected to the ground and its drain (D) being connected the one end of the coil 122. The other end of the coil 122 is connected to the positive end of a power source (12V). In response to a high voltage input at its gate (G), the source (S) and drain (D) of the n-channel field-effect transistor 105 are electrically connected to conduct current; but in response to a low voltage input at its gate (G), the source (S) and drain (D) of the n-channel field-effect transistor 105 are electrically cut off. Therefore, when the first control signal from the activating circuit 103 or the second control signal from the supervision unit 160 is in high voltage state, the output of the switch control circuit 104 generates (or sets) a driving signal in high voltage state, which in turn electrically connects the source (S) and drain (D) of the switch transistor 105 to form a current path from the power source (12V) to the ground through the coil 122. The current in the coil 122 moves the movable sheet (or plate) 126 in contact with the pair of stationary contactors 124.1 and 124.2, thus connecting the voltage output of the battery pack 101 into the two output terminals 152.1 and 152.2. As one embodiment of the present invention, when the first control signal from the activating circuit 103 and the second control signal from the supervision unit 160 are both in low voltage state, the output of the switch control circuit 104 generates (or sets) the driving signal in a low voltage state, which in turn electrically disconnects the source (S) and drain (D) of the switch transistor 105 to cutoff the current path from the power source (12 V) to the ground. Without current in the coil 122, the movable sheet (or plate) 126 moves away from the pair of stationary contactors 124.1 and 124.2, thus disconnecting the voltage output of the battery pack 101 from the two output terminals 152.1 and 152.2.

Still referring to FIG. 1A, the processor unit 109 communicates with the displaying unit 112 through connection 166, which is in turn connected to a graphic user interface (GUI) 114, to display the operation (or working) conditions of the battery pack 101 so that a user can monitor and/or operate the battery pack 101 through the GUI 114. The processor unit 109 further communicates with the CAN interface 163 via connection 167, which further communicates with the ECU 164, which controls a hybrid vehicle (not shown).

The designed messages from the CAN interface 163 to the ECU 164 can define the contents that the applications to the battery pack 101 at various states (such as discharge, charge, sleep, etc.) are associated to the vehicle operating modes (run, parking, idle, brake). More specifically, the ECU 164 can analyze the applications to the battery pack 101 and decrease the pack loading, or command the pack contactor open to make pack performance return to normal application range, or avoid further deterioration. In operation, for example, the processor unit 109 can send working conditions and instructions to the ECU 164 to operate the hybrid vehicle based on the information from the processor unit 109. This is especially useful when the battery pack is 101 in some fault conditions, but can still operate the hybrid vehicle under certain limitations. In such a condition, the hybrid vehicle can be operated in so called "limp mode" even if the battery pack is 101 in some fault conditions until the hybrid vehicle comes to a desired place, such as a repair shop.

The designed CAN message profiles define the contents that the pack application at various state (discharge, charge, sleep, etc.) to associate the vehicle operating modes (run, parking, idle, brake). The thresholds of the pack or cell performances at these various situations are different. The ECU 164 can analyze the pack application, and decrease the pack loading, or command the pack contactor open to make pack performance return to normal application range, or avoid further deterioration.

Figure 1B:
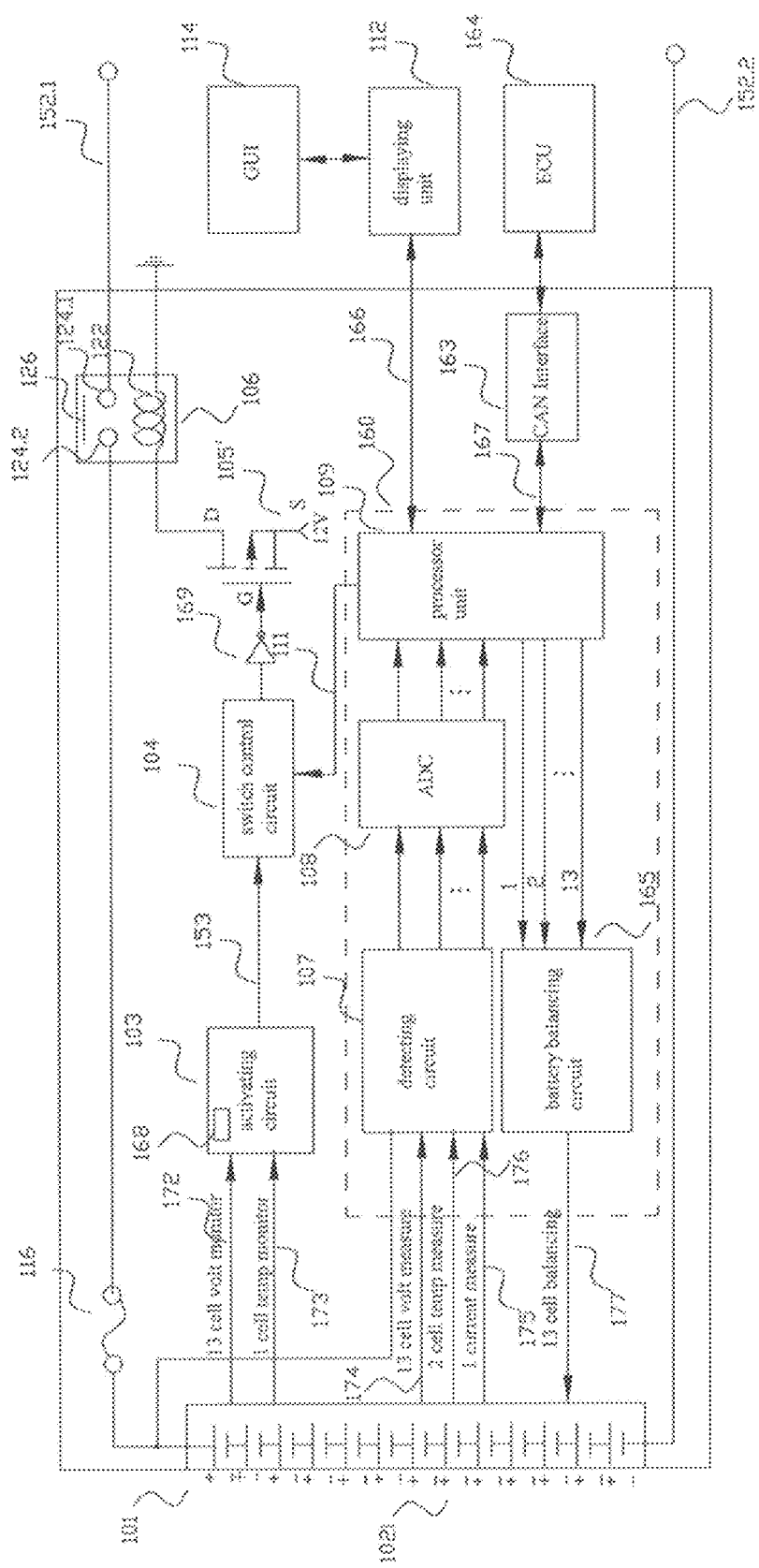
FIG. 1B shows a battery management system 100' according to a second embodiment of the present invention.

FIG. 1B shows a battery management system 100' according to a second embodiment of the present invention. All components in the control system 100' shown in FIG. 1B are same with those in the battery management system 100 shown in FIG. 1A, except that the n-channel transistor 105 in FIG. 1A is replaced by a p-channel transistor 105' in FIG. 1B, an inverter 169 is added between the switch control circuit 104 and a power source is added within the activating circuit 103. The battery management system 100' can use the power source 168 even if the power source for the whole battery management system 100' fails. The inverter 169 can invert the output from the switch control circuit 104 before applying the output from the switch control circuit 104 to the p-channel transistor 105'. As shown in FIG. 1B, the output of the inverter 169 is coupled to the gate (G) of the p-channel field-effect transistor 105' with its source (S) being connected to the positive end of a power source (12V) and its drain (D) being connected the one end of the coil 122. The other end of the coil 122 is connected to the ground. In response to a low voltage input at its gate (G), the source (S) and drain (D) of the p-channel field-effect transistor 105' are electrically connected to conduct current; but in response to a high voltage input at its gate (G), the source (S) and drain (D) of the p-channel field-effect transistor 105' are electrically cut off.

In FIG. 1B, in responding to a high voltage state of the first control signal or the second control signal, the driving signal generated from the switch control circuit 104 is also in high voltage state, but the inverter 169 inverts the high voltage state into a low voltage state. In responding to a low voltage state of the first control signal from the activating circuit 103 and the second control signal from the supervision circuit 160, the driving signal generated from the switch control circuit 104 is also in low voltage state, but the inverter 169 inverts the low voltage state into a high voltage state. Therefore, as one embodiment of the present invention, when the first control signal from the activating circuit 103 or the second control signal from the supervision circuit 160 is in a high voltage state, the output of the inverter 169 sends a driving signal in a low voltage state to the switch transistor 105', which in turn electrically connects the source (S) and drain (D) of the switch transistor 105' to form a current path from the power source (12V) to the ground through the coil 122. When the first control signal from the activating circuit 103' and the second control signal from the supervision circuit 160 are both in low voltage state, the output of the inverter 169 sends a driving signal in high voltage state to the switch transistor 105', which in turn electrically disconnects the source (S) and drain (D) of the switch transistor 105' to cutoff the current path from the power source (12V) to the ground.

Figure 1C:
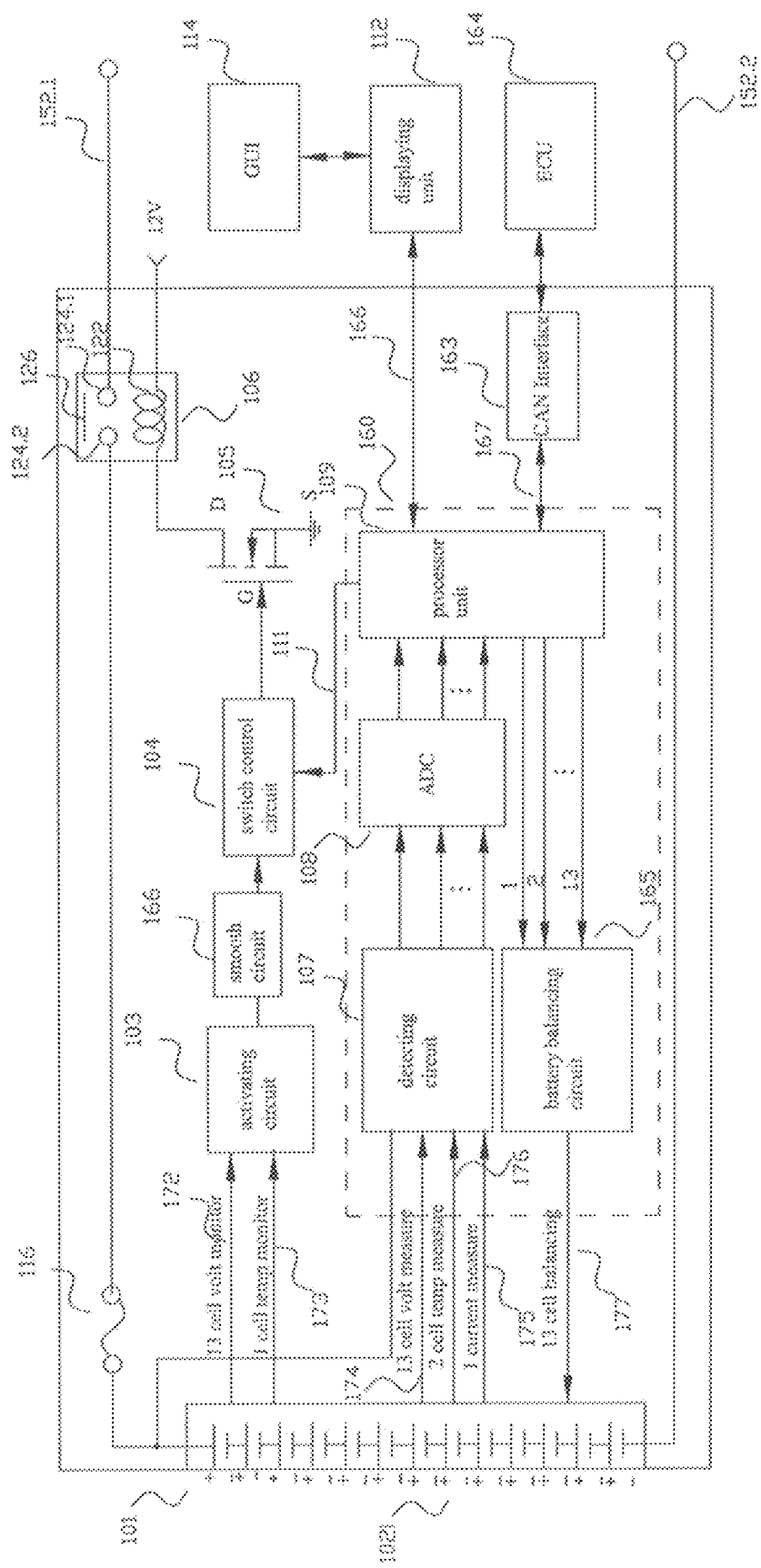
FIG. 1C shows a battery management system 100" according to a third embodiment of the present invention.

FIG. 1C shows a battery management system 100" according to a third embodiment of the present invention. All components in the battery management system 100" shown in FIG. 1C are same with those in the battery management system 100 shown in FIG. 1A, except that the battery management system 100" shown in FIG. 1C adds a smooth circuit (or a filter) 166 that is connected between the activating circuit 103 and the switch control circuit 104. The function of the smooth circuit 166 is to immune from transients occurring at the battery cell inputs. If a transient voltage at a high or low enough level, which could trip an alarm to the switch control circuit 104 if the sampled signals were directly sent to the witch control circuit 104, the alarm state does not occur if the transient voltage is present for less than the selected deglitch time. The deglitching time is adjustable by circuit designer per the requirement specified. As one embodiment, the present invention can use a standard deglitching circuitry to perform the function of the smooth circuit (or filter) 166.

Figure 2:
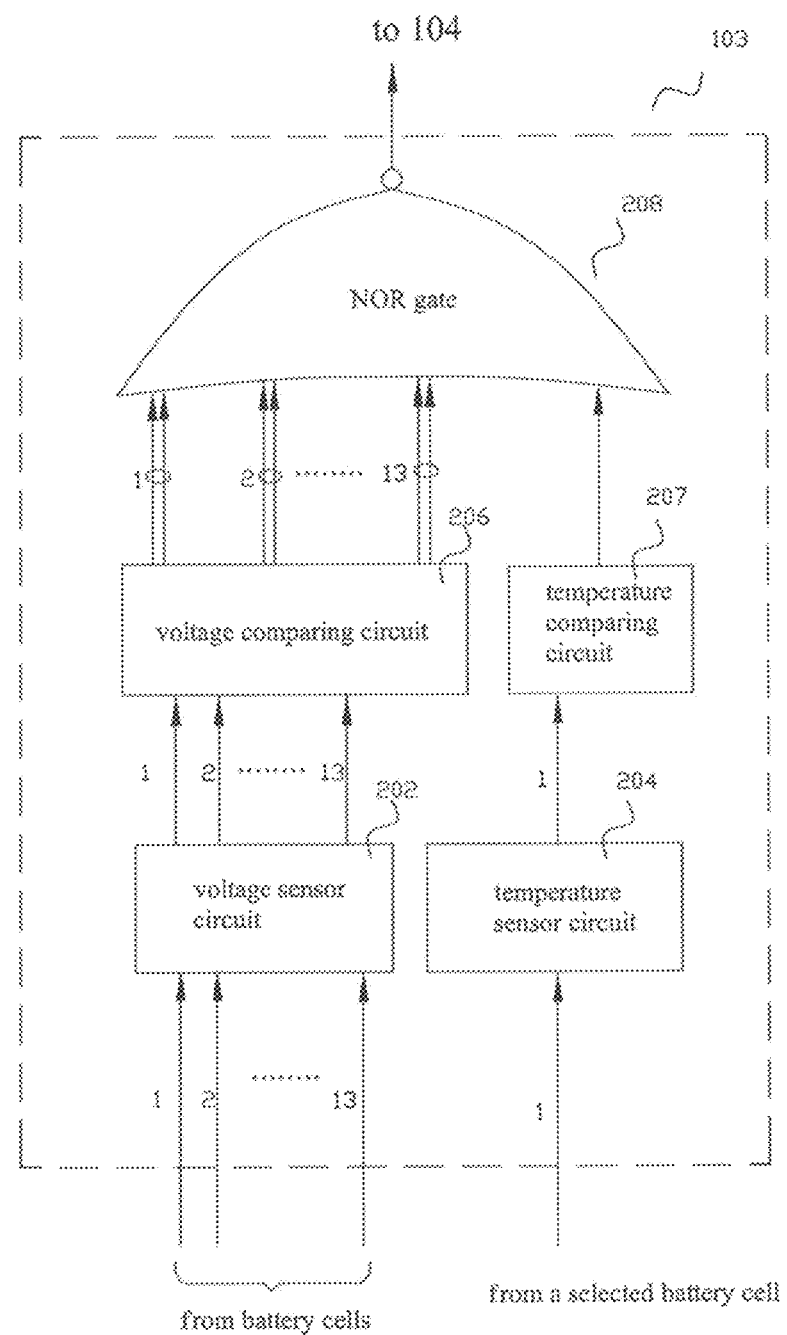
FIG. 2 is a block diagram to show the structures of the activating circuit 103 in FIGS. 1A-C in great details.

FIG. 2 is a block diagram to show the structures of the activating circuit 103 shown in FIGS. 1A-C in great details. As shown in FIG. 2, the activating circuit 103 includes a voltage sensor circuit 202, a temperature sensor circuit 204, a voltage comparison circuit 206, a temperature comparison circuit 207, and a NOR gate 208. The voltage sensor circuit 202 converts the sampled voltages from the 13 battery cells into analog signals (which may be presented as voltage values that are proportional to the operation voltages of the 13 battery cells). The temperature sensor circuit 204 converts the sampled temperature into analog signal (which may be presented as voltage values that are proportional to the operation temperatures of the selected of the battery cells). The voltage sensor circuit 202 has 13 inputs, which are connected to the 13 battery cells in the battery pack 101, for measuring (or sampling) the operation (working) voltages of the 13 battery cells and has 13 outputs that are connected to the comparing circuit 206 to provide the 13 sampled voltages as 13 inputs for the comparing circuit 206. The temperature sensor circuit 204 has one input, which is connected to a selected one of the 13 battery cells in the battery pack 101, for measuring (or sampling) the temperature of the selected battery cell and has one input that is connected to the voltage comparing circuit 207 to provide the sampled temperature as one input for the voltage comparing circuit 207.

In FIG. 2, as one embodiment of the present invention, the comparing circuit 206 internally sets one or more critical thresholds, including: the high-critical-voltage threshold, the low-critical-voltage threshold, and/or the high-critical-temperature threshold. After receiving 13 sampled voltages from the voltage sensor circuit 202, the voltage comparing circuit 206 compares each of the 13 sampled voltages with the high-critical-voltage threshold and the low-critical-voltage threshold. If the sampled voltage from any particular battery cell of the 13 battery cells exceeds (or equals to) the high-critical-voltage threshold, the voltage comparing circuit 206 causes the NOR gate 208 to generate an indication signal in a second voltage state (such as a low voltage state 708 as shown in FIG. 7D) to indicate improper (or abnormal) voltage operation (working) condition of the particular battery cell; if all sampled voltages from all 13 battery cells are below (or equal to) the high-critical-voltage threshold, the voltage comparing circuit 206 causes the NOR gate 208 to generate the indication signal in a first voltage state (such as a high voltage state 707 as shown in FIG. 7D) to indicate proper (or normal) voltage operation (working) condition of the particular battery cell. Likewise, if the sampled voltage from the particular battery cell is below (or equals to) the low-critical-voltage threshold, the voltage comparing circuit 206 causes the NOR gate 208 to generate another indication signal in a second voltage state (such as a low voltage state 708 as shown in FIG. 7D) to indicate the improper (or abnormal) voltage operation (working) condition of the particular battery cell; if the sampled voltages from all 13 battery cells are above (or equal to) the low-critical-voltage threshold, the voltage comparing circuit 206 causes the NOR gate 208 to generate the indication signal in a first voltage state (such as a high voltage state 707 as shown in FIG. 7D) to indicate proper (or normal) voltage operation (working) condition of the particular battery cell. In FIG. 2, for any one of the 13 battery cells in the battery pack 101, the voltage comparing circuit 206 has a pair of outputs with one output for comparing the high-critical-voltage threshold and the other output for comparing the low-critical-voltage threshold.

Similarly, if the sampled temperature from the temperature sensor circuit 204 exceeds (or equals to) the high-critical-temperature threshold, the temperature comparing circuit 207 causes the NOR gate 208 to generate an indication signal in a second voltage state (such a low voltage state 708 as shown in FIG. 7D) to indicate the improper (or abnormal) temperature operation (working) condition of the selected battery cell; if the sampled temperature from the temperature sensor circuit 204 is below (or equals to) the high-critical-temperature threshold, the temperature comparing circuit 207 causes the NOR gate 208 to generate the indication signal in a first voltage state (such as a high voltage state 707 as shown in FIG. 7D) to indicate proper (or normal) temperature operation (working) condition of the selected battery cell.

As shown in FIG. 2 the voltage comparing circuit 206 sends 13 pairs of the voltage comparing results and the temperature comparing circuit 207 sends the temperature comparing result to the NOR gate 208. In responding to the 13 pairs of voltage comparing results and the one temperature comparing result, the NOR gate 208 generates (or sets) a control signal (the first control signal) into a first voltage state (such as a high voltage state 707 as shown in FIG. 7D) when all of the 13 pairs of voltage comparing results and the one temperature comparing result are in proper (or normal) operation condition; the NOR gate 208 generates (or sets) the first control signal in a second voltage state (such a low voltage state 708 as shown in FIG. 7D) when any of the 13 pairs of voltage comparing results and the one temperature comparing result is in improper (or abnormal) operation condition. In FIG. 2, the output of the NOR gate 208 is connected or sent to the switch control circuit 104 as the input of the switch control circuit 104.

Figure 3A:
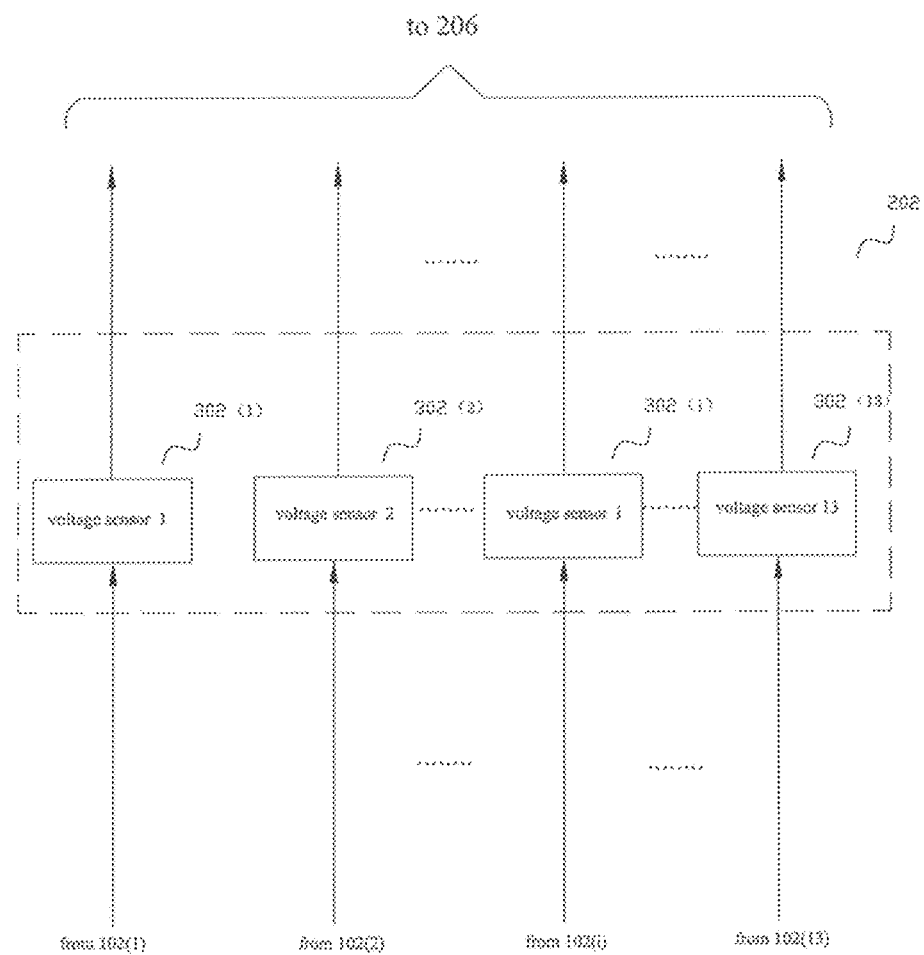
FIG. 3A is a block diagram to show the structures of the voltage sensor circuit 202 shown in FIG. 2 in greater details.

FIG. 3A is a block diagram to show the structures of the voltage sensor circuit 202 shown in FIG. 2 according to one embodiment of the present invention. As shown in FIG. 3A, the voltage sensor circuit 202 includes 13 voltage sensor 302($i$) with the input of each of the voltage sensor 302($i$) being connected to its respective battery cell 102($i$) and with the output of each of the voltage sensor 302($i$) being connected to the comparing circuit 206 as an input ($i=1, 2, \ldots, 13$).

Figure 3B:
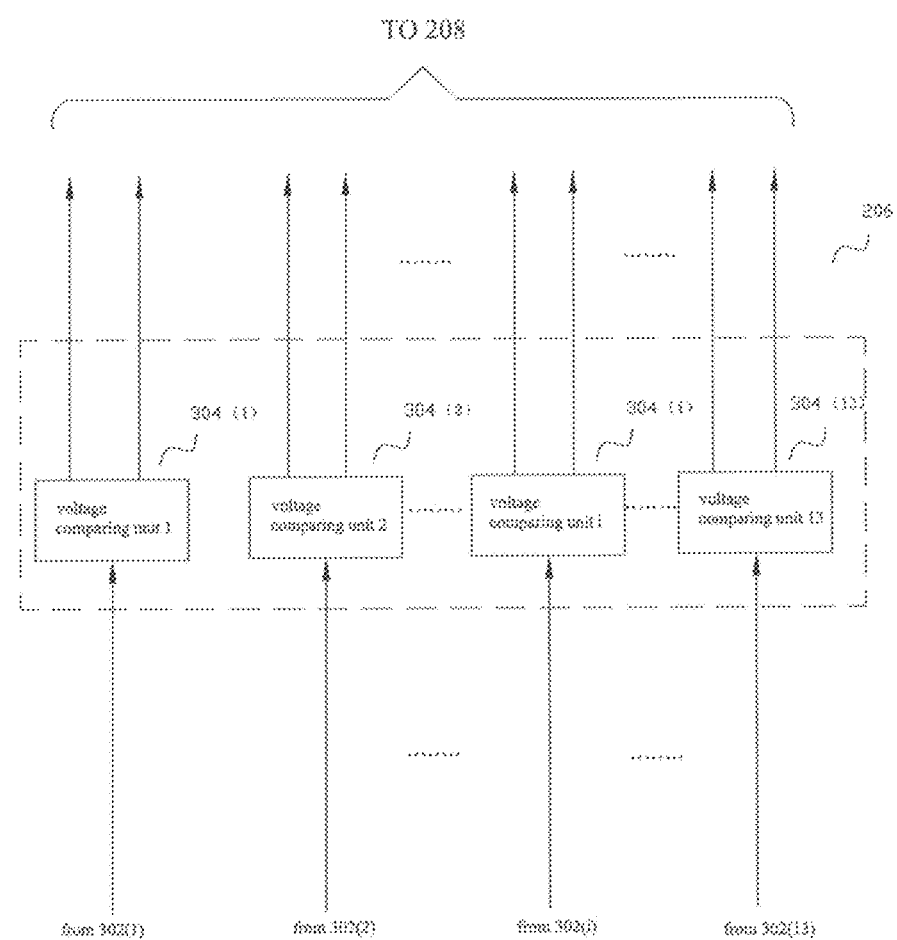
FIG. 3B is a block diagram to show the structures of the comparing circuit 206 shown in FIG. 2 in greater details.

FIG. 3B is a block diagram to show the structures of the voltage comparing circuit 206 shown in FIG. 2 in greater details. As shown in FIG. 3B, the voltage comparing circuit 206 includes 13 voltage comparing unit 304($i$) ($i=1, 2, \ldots, 13$). The input of a particular voltage comparing unit 304($i$) is connected to the output of its respective voltage sensor 302($i$) and, for each of the input from the voltage comparing unit 304($i$), the particular voltage comparing unit 304($i$) generates a pair of outputs, one output for comparing the high-critical-voltage threshold and the other output for comparing the low-critical-voltage threshold. With the structure as shown in FIG. 3B, each voltage comparing unit 304($i$) compares the measured voltage to the high or low critical threshold voltages. If any of the 13 battery cell voltages is higher than the high critical threshold voltage or lower than the low critical threshold voltage, the corresponding comparing unit 304($i$) triggers over-voltage (OV) or under-voltage (UV) alert.

Figure 4A:
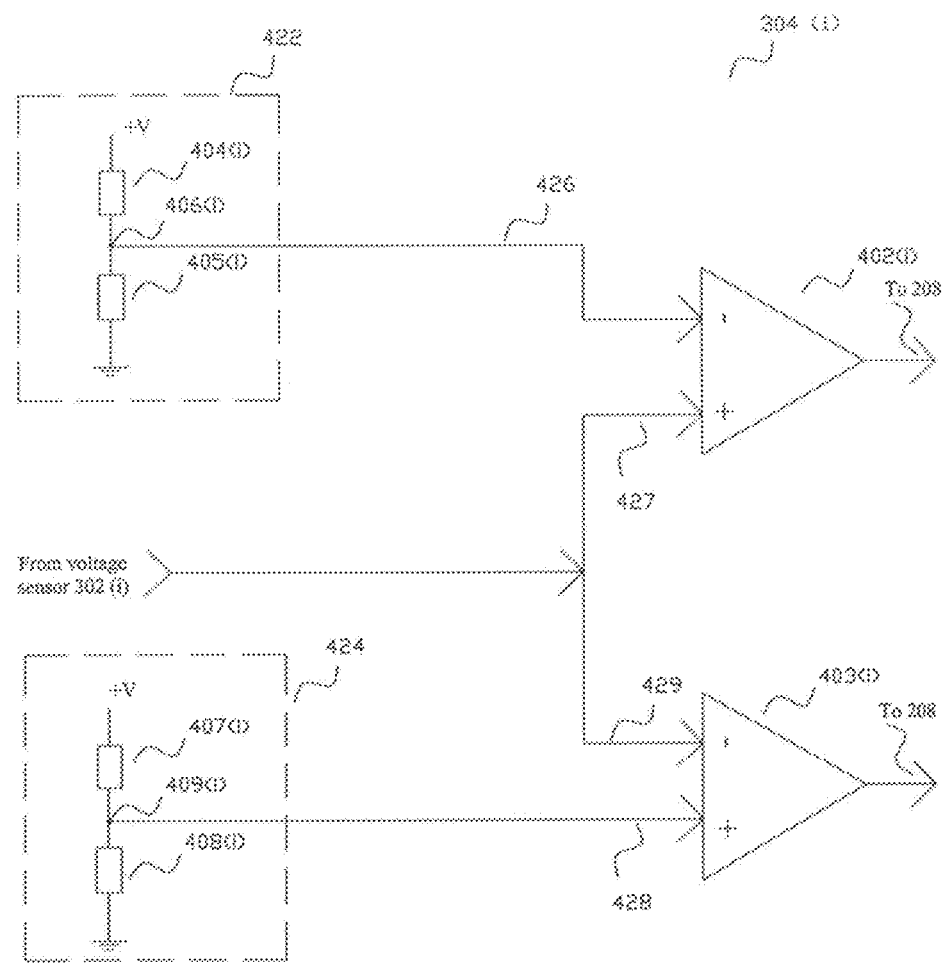
FIG. 4A is a block diagram to show the structures of the voltage comparing unit 304($i$) ($i$=1, 2, . . . , 13) shown in FIG. 3B in greater details.

FIG. 4A is a block diagram to show the structures of a voltage comparing unit 304($i$) ($i=1, 2, \ldots, 13$) shown in FIG. 3B according to one embodiment of the present invention. As shown in FIG. 4A, the voltage comparing unit 304($i$) includes a comparator (or operation amplifier) 402($i$) for comparing the sampled voltage from battery cell 102($i$) with the high-critical-voltage threshold, a comparator (or operation amplifier) 403($i$) for comparing the sampled voltage from battery cell 102($i$) with the low-critical-voltage threshold, a voltage setting device 422 for setting the high-critical-voltage threshold, and a voltage setting device 424 for setting the low-critical-voltage threshold.

In FIG. 4A, the comparator 402($i$) has two inputs (a negative input 426 and a positive input 427) and the voltage setting device 422 has a resistor 404(i) and a resistor 405(i) that are serially connected to from a voltage divider. The values of the resistor 404(i) and resistor 405(i) in the voltage device 422 are selected so that the connecting point 406(i) between the resistor 404(i) and resistor 405(i) is the voltage of the high-critical-voltage threshold. The negative input 426 of the comparator 402(i) is connected to the connecting point 406(i) and the positive input 427 of the comparator 402(i) is connected to the output of the voltage sensor 302(i). In operation, when the sampled voltage from battery cell 102(i) on the input 427 exceeds (or equals to) the high-critical-voltage threshold on the connecting point 406(i), the comparator 402(i) generates (or sets) an output signal (an alert) in a high voltage state; when the sampled voltage on the positive input 427 is below (or equals to) the high-critical-voltage threshold on the connecting point 406(i), the comparator 402(i) generates (or sets) the output signal (the alert) in a low voltage state.

In a similar fashion, the comparator 403(i) has two inputs (a negative input 429 and a positive input 428 and the voltage setting device 424 has a resistor 407(i) and a resistor 408(i) that are serially connected to from a voltage divider. The values of the resistor 407(i) and resistor 408(i) in the voltage setting device 424 are selected so that the connecting point 409(i) of the resistor 407(i) and resistor 408(i) is the voltage of the low-critical-voltage threshold. The positive input 428 of the comparator 403(i) is connected to the connecting point 409(i) and the negative input 429 of the comparator 403(i) is connected to the output of the voltage sensor 302(i). In operation, when the sampled voltage from battery cell 102(i) on the negative input 429 is below (or equals to) the low-critical-voltage threshold on the connecting point 409(i), the comparator 403(i) generates (or sets) an output signal (or an alert) in a high voltage state; when the sampled voltage on the negative input 429 exceeds (or equals to) to the low-critical-voltage threshold on the connecting point 409(i), the comparator 403(i) generates (or sets) the output signal (the alert) in a low voltage state. The two outputs of the comparator 402(i) and comparator 403(i) are both connected to the NOR gate 208 shown in FIG. 2 as its inputs.

Figure 4B:
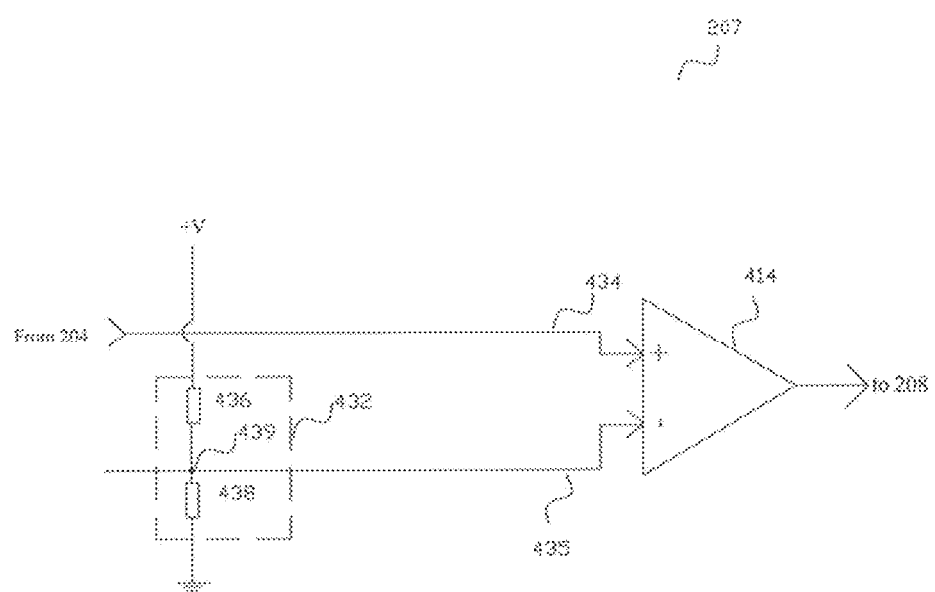
FIG. 4B is a block diagram to show the structures of the temperature comparing circuit 207 shown in FIG. 2 in greater details.

FIG. 4B is a block diagram to show the structures of the temperature comparing circuit 207 shown in FIG. 2 according to one embodiment of the present invention. As shown in FIG. 4B, the temperature comparing circuit 207 includes a voltage setting device 432 and a comparator (or operation amplifier) 414 for comparing the high-critical-temperature threshold with the sampled voltage temperature (presented in a voltage value) from the temperature sensor circuit 204. The comparator 414 has two inputs (a positive input 434 and a negative input 435) and the voltage setting device 432 has a resistor 436 and a resistor 438 that are serially connected to from a voltage divider. The values of the resistor 436 and resistor 438 in the voltage device 432 are selected so that the connecting point 439 between the resistor 436 and resistor 438 is the voltage of the high-critical-temperature threshold. The positive input 434 of the comparator 414 is connected to the output of the temperature sensor circuit 204 and the negative input 435 of the comparator 414 is connected to the connecting point 439. In operation, when the sampled temperature (presented as a voltage value) on the positive input 434 exceeds (or equals) the high-critical-temperature threshold on the connecting point 439, the comparator 414 generates (or sets) an output signal (an alert) in a high voltage state; when the sampled temperature (presented as a voltage value) on the positive input 434 is below (or equals to) the high-critical-temperature threshold on the connecting point 439, the comparator 414 generates (sets) the output signal (the alert) in a low voltage state. The output of the comparator 414 is connected to the NOR gate 208 shown in FIG. 2 as its input.

It should be noted that structures shown in FIGS. 4A-B are illustrative embodiments of the present invention and the principles of the present invention can be implemented in different variations to a person skilled in the art. For example, according to the principles of the present invention, the structures in the activating circuit 103 as shown in FIGS. 2 and 4A-B can be changed to generate the first control signal. Specifically, in the embodiment shown in FIG. 4A, the links 426 and 429 can be changed to respectively connect the positive inputs of the comparators 402(i) and 403(i), while links 427 and 428 can be changed to respectively connect the negative inputs of the comparators 402(i) and 403(i). Similarly, the links 434 and 435 can be changed to respectively connect the negative input and positive input of the comparator 414. Corresponding to the changes made to the structures in FIGS. 4A-B, the NOR gate 208 in FIG. 2 can be replaced by an AND gate 208' (not shown). With such changes to FIGS. 2 and 4A-B, the activating circuit 103 shown in FIG. 1A can also generate the first control signal for the switch transistor 105.

Figure 5:
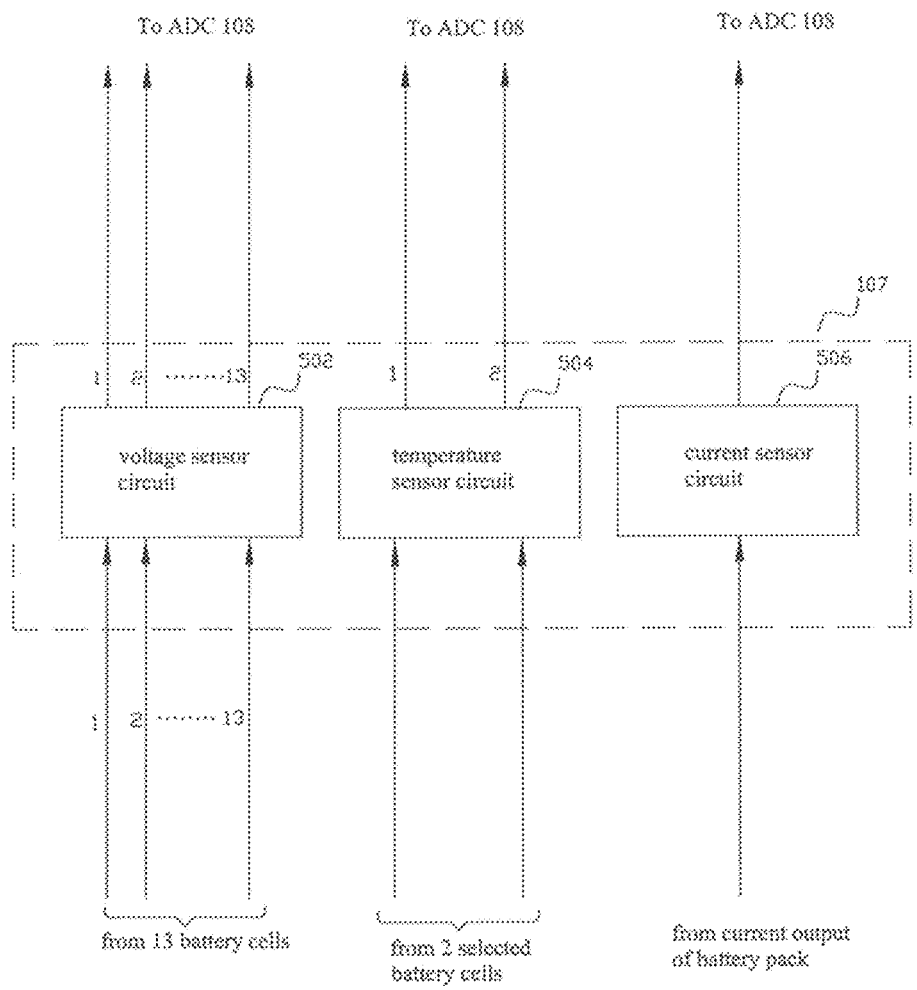
FIG. 5 is a block diagram to show the structures of the detecting circuit 107 shown in FIGS. 1A-C in greater details.

FIG. 5 is a block diagram to show the structures of the detecting circuit 107 shown in FIGS. 1A-C in greater details. As shown in FIG. 5, the detecting circuit 107 includes a voltage sensor circuit 502 for continuously measuring (or sampling) the operation (working) voltages of the 13 battery cells 102(i) (i=1, 2, . . . , 13) in the battery pack 101, a temperature sensor circuit 504 for continuously measuring (or sampling) the operation (working) temperatures of the two selected battery cells from the 13 battery cells 102(i) and a current sensor circuit 506 for continuously measuring (or sampling) the operation (working) current provided by the battery pack 101. The 13 outputs from the voltage sensor circuit 502, the two outputs from the temperature sensor circuit 504 and the output from the current sensor circuit 506 are all connected to the ADC (A-D converter) 108 as its inputs. All these outputs from the voltage sensor circuit 502, the temperature sensor circuit 504 and the current sensor circuit 506 are presented as analog signals (which can be presented as voltages). After converting these analog signals into digital signals, the ADC (A-D converter) 108 sends these digitized signals to the processor unit 109 as the inputs of the processor unit 109 for further processing.

Figure 6A:
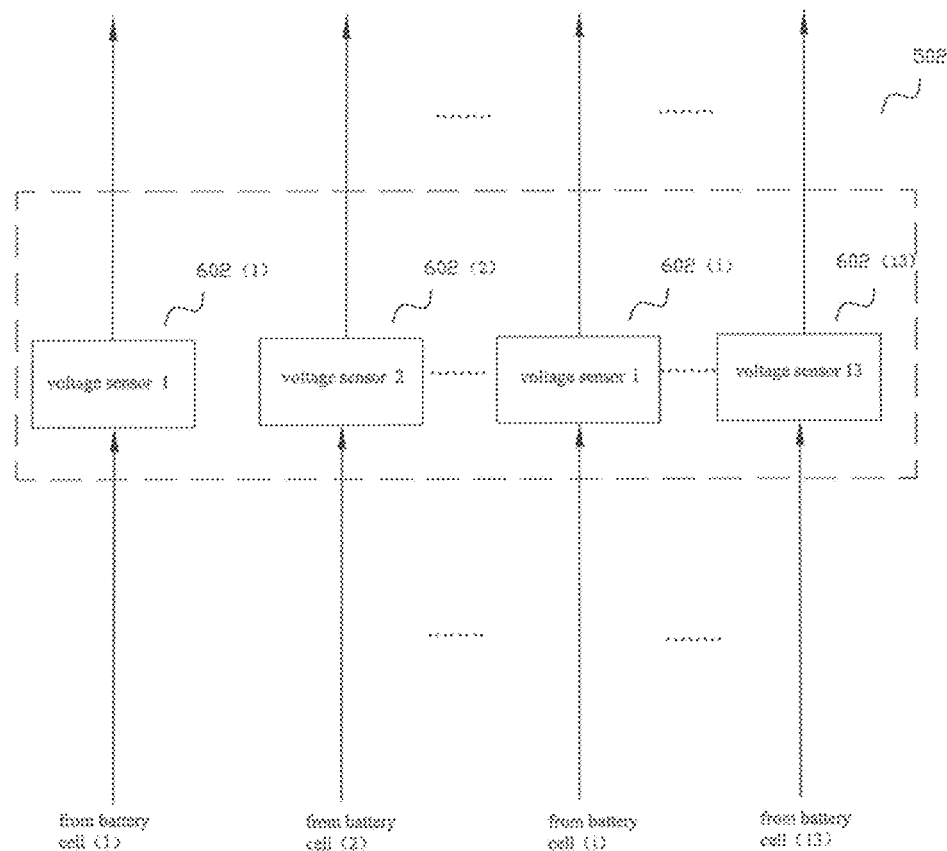
FIG. 6A is a block diagram to show the structures of the voltage sensor circuit 502 shown in FIG. 5 in greater details.

FIG. 6A is a block diagram to show the structures of the voltage sensor circuit 502 shown in FIG. 5 in greater details. As shown in FIG. 6A, the voltage sensor circuit 502 includes 13 voltage sensor 602(i) (i=1, 2, . . . , 13). Each input of the voltage sensor 602(i) is connected to its respective battery cell 102 (i) and each output of the voltage sensor 602(i) is connected to the ADC (A-D converter) 108 as the input of the ADC 108.

Figure 6B:
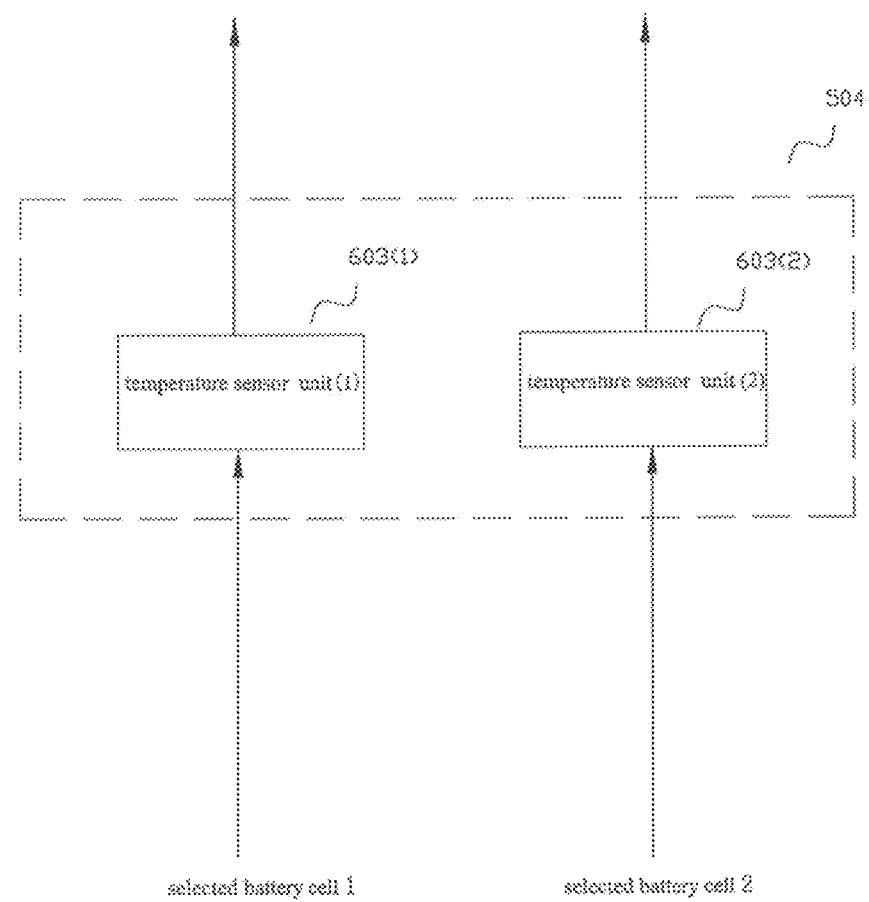
FIG. 6B is a block diagram to show the structures of the temperature sensor circuit 504 shown in FIG. 5 in greater details.

FIG. 6B is a block diagram to show the structures of the temperature sensor circuit 504 shown in FIG. 5 in greater details. As shown in FIG. 6B, the temperature sensor circuit 504 includes two temperature sensors 604(1), 604(2). Each input of the two temperature sensors is connected to its respective selected battery cell and each output of the two temperature sensors is connected to the ADC (A-D converter) 108 as the input of the ADC 108.

Figure 7A:
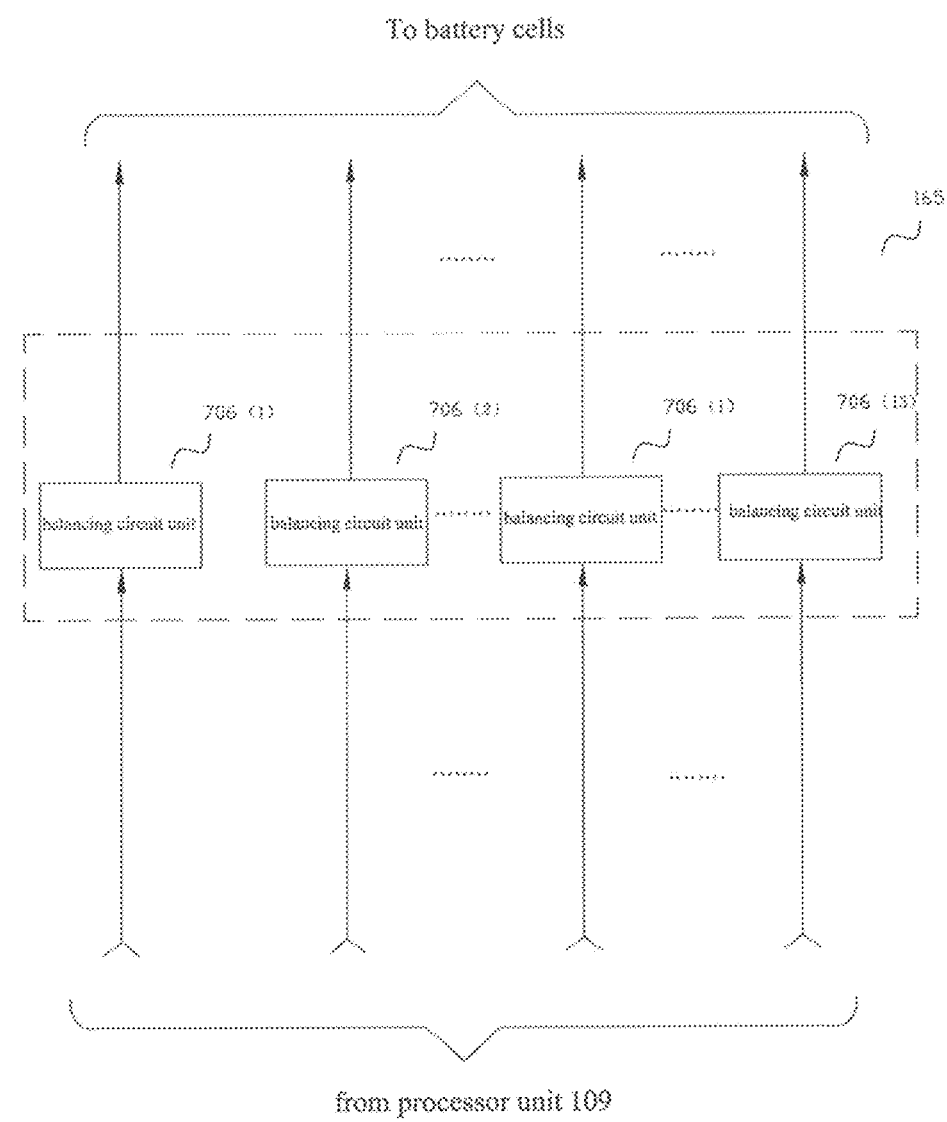
FIG. 7A is a block diagram to show the structures of the battery cell balancing circuit 165 shown in FIGS. 1A-C in greater details.

FIG. 7A is a block diagram to show the structures of the battery cell balancing circuit 165 shown in FIGS. 1A-C in greater details. As shown in FIG. 7A, the battery cell balancing circuit 165 includes 13 balancing circuit unit 702(i) (i=1, 2, . . . , 13). Each input of the 13 balancing circuit unit 702(i) receives a respective balancing control signal from the processor unit 109 and each output of the 13 balancing circuit unit 702(i) is connected to a respective battery cell(i) to adjust the voltage for the respective battery cell (i), when needed (i=1, 2, . . . , 13).

Figure 7B:
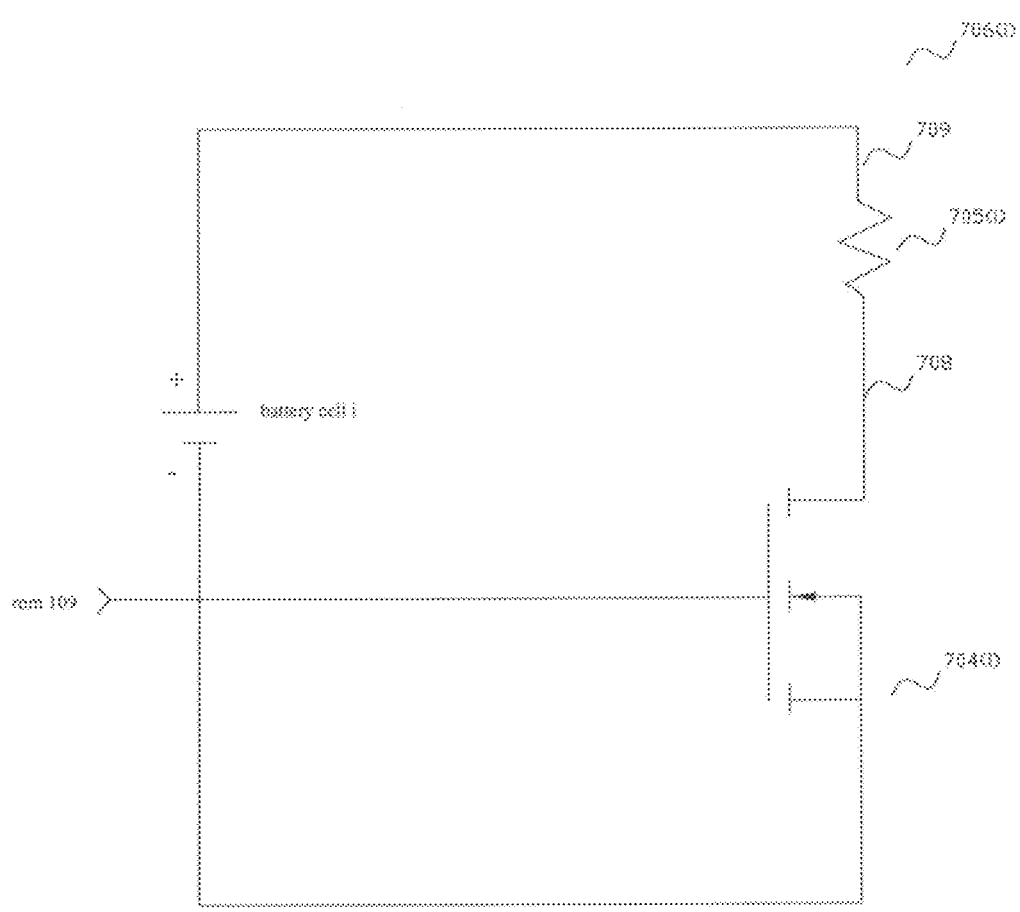
FIG. 7B is a block diagram to show the structures of the balancing circuit unit 706($i$) shown in FIG. 7A in greater details.
Figure 7D:
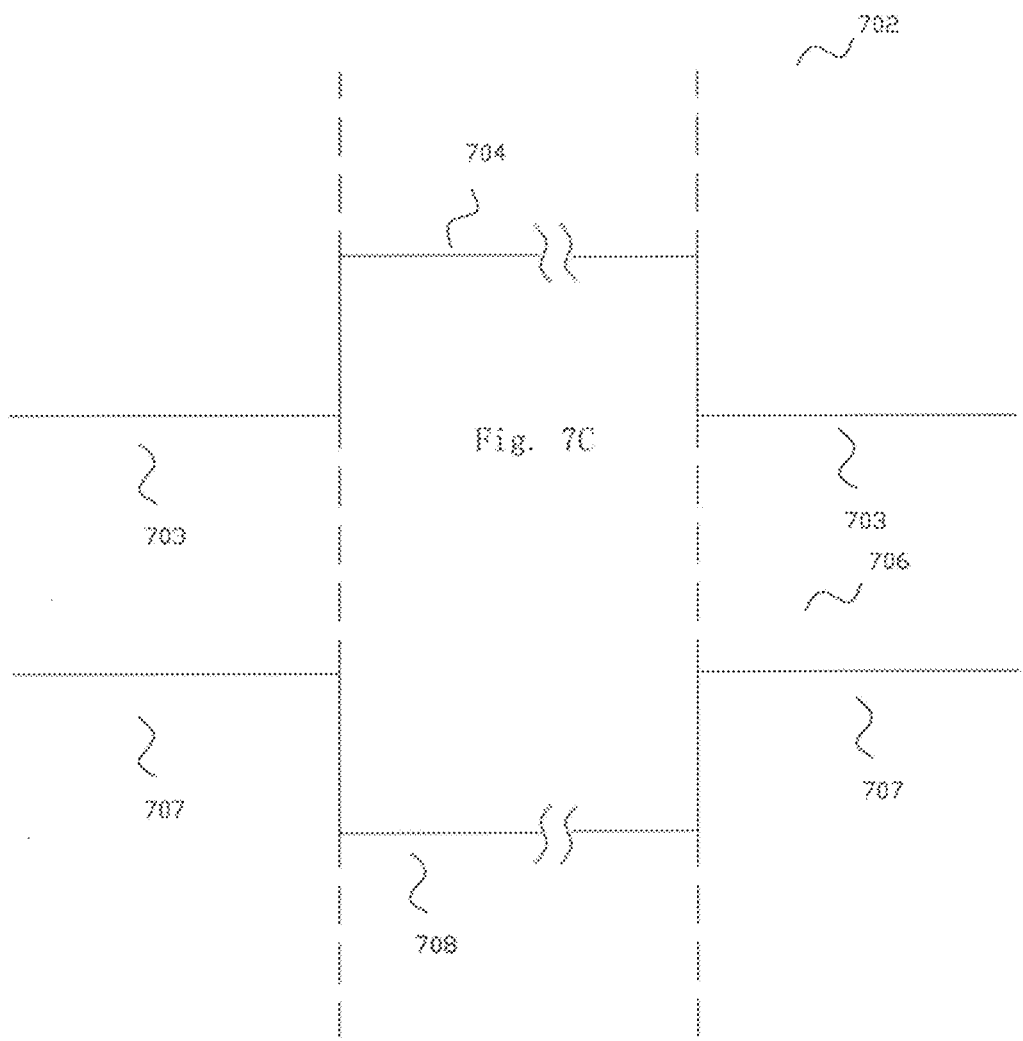

FIG. 7B is a block diagram to show the structures of the balancing circuit unit 706(i) (i=1, 2, . . . , 13) shown in FIG. 7A in great detail. As shown in FIG. 7B, the balancing circuit unit 706(i) includes an n-channel field-effective transistor 704(i) and a resistor 705(i). For the transistor 704(i), its gate (G) is connected to the processor unit 109 to receive a balancing control signal therefrom, its drain (D) is connected to one terminal 708 of the resistor 704(i), and its source (S) is connected to the negative terminal of the respective battery cell 102(i) (i=1, 2, . . . , 13). The other terminal 709 of the resistor 705(i) is connected to the positive terminal of the respective battery cell 102(i). When the operation voltage of the respective battery cell 102(i) is too high comparing with the other battery cells in the battery pack 101, the processor unit 109 sends a balancing control signal in a high voltage state to the gate (G) of the transistor 704(i) to form a current path for the respective battery cell 102(i) between the drain (D) and source (S) of the field-effective transistor 704(i) so that current can circulate around the positive terminal and the negative terminal of the respective battery cell 102(i) to reduce the operation (working) voltage of the battery cell 102(i). When the operation voltage of the respective battery cell 102(i) is reduced to a desired level, the processor unit 109 generates (or sets) the balancing control signal in a low voltage state so that the current path for the respective battery cell 102(i) is cutoff to stop the voltage balancing process for the battery cell (i).

FIGS. 7C-D show a wave form of the first controls signal and/or the second control signal. Specifically, the wave form in FIG. 7D shows a binary state signal 706 for the first control signal on the connection 153 from the activating circuit 103, the second control signal on the connection 111 from the supervision unit 160 and the driving signal from the switch control circuit 104 shown in FIG. 1A. As shown in FIG. 7D, the first control signal, the second control signal or the driving signal is in a high voltage state in section 707, while it is in a low voltage state in section 708. A high voltage state of the binary state signal conducts the switch transistor 105 in FIG. 1A, while a low voltage state of the binary state signal cuffs of the switch transistor 105 in FIG. 1A. In FIG. 7D, a high voltage can be deemed as a first voltage state of the binary state signal, which reflects a proper (or normal) operation condition; while a low voltage can be deemed as a second voltage state of the binary state signal, which reflects an improper (or abnormal) operation condition.

FIG. 7C shows a wave form of a binary state signal 702 for the driving signal from the inverter 169 shown in FIG. 1B. As shown in FIG. 7C, the driving signal is in a low voltage state in section 703, but is in a high voltage state in section 704. A low voltage state of the binary state signal conducts the switch transistor 105' in FIG. 1B, while a high voltage of the binary state signal cuffs of the switch transistor 105' in FIG. 1B. In FIG. 7C, because the inverter 169 has inverted the binary state signal 706 shown in FIG. 7D, a low voltage can be deemed as a first voltage state of the binary state signal, which reflects a proper (or normal) operation condition; while a high voltage can be deemed as a second voltage state of the binary state signal, which reflects an improper (or abnormal) operation condition.

Figure 8:
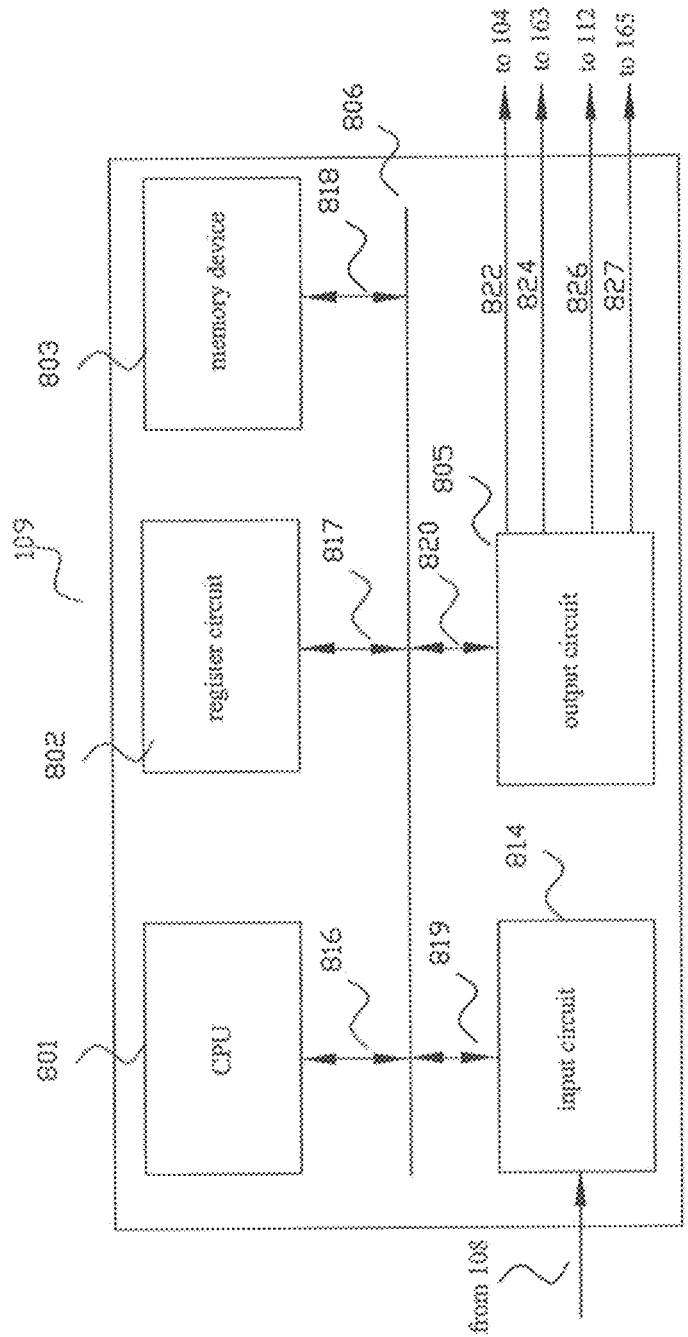
FIG. 8 is a block diagram to show the structures of the processing unit 109 shown in FIGS. 1A-C in greater details.

FIG. 8 is a block diagram to show the structures of the processing unit 109 shown in FIGS. 1A-C in greater details.

As shown in FIG. 8, the processing unit 109 includes a CPU 801, a register circuit 802, a memory device 803, an input circuit 804, an output circuit 805 and a bus 806. The CPU 801, register circuit 802, memory device 803, input circuit 804 and output circuit 805 are connected to the bus 806 via their respective connections (816, 817, 818, 819 and 820) so that the CPU 801 can communicate with and control the operations of the control register circuit 802, memory device 803, input circuit 804 and output circuit 805 via the bus 806. More specifically, the memory device 803 can store instructions (programs) and data (such as the high-cap-voltage threshold, the low-cap-voltage threshold, the high-cap-temperature threshold, and/or the high-cap-current threshold). The CPU 801 can read the data and instructions (or programs) from the memory device 803, execute the instructions (or programs) to perform desired tasks, and stores operation results into the memory device 803. Under the control of the CPU 801, the register circuit 802 can be set in a first voltage state or a second voltage state for a control signal (the second control signal). The input circuit 814 receives the digitized signals from the ADC 108 and sends them to the CPU 801 for processing. Under the control of the CPU 801, the output circuit 805 receives the outputs from the CPU 801 and the register circuit 802 and sends them to the respective components (including the displaying unit 112 through the connection 166, the CAN Interface 163 through the connection 167, the battery balancing circuit 165 and the switching control circuit 104 through the connection 111, as shown in FIGS. 1A-C).

The present invention classifies battery fault conditions and diagnosis into several hierarchy categories, which require different responses. As one embodiment, the present invention classifies any fault conditions that are generated by comparing with the high-critical-voltage threshold, low-critical-voltage threshold and high-critical-temperature threshold as an urgent-level fault condition, which needs immediate response. In addition, the present invention classifies any fault conditions that are generated by comparing with the high-cap-voltage threshold, low-cap-voltage threshold, high-cap-temperature threshold and high-cap-current as an adjustable-level fault condition, which needs response within a certain period of time (such within 2 seconds).

In the present invention, the activating circuit 103 and the supervision unit 160 can work together so that, in the most urgent fault conditions, the activating circuit 103 can instantly disconnect the battery pack 101 (through hardware approach) from the output terminals 152.1, 152.2, while in less urgent fault conditions, the supervision unit 160 may adjust the operation (working) conditions and environment of the battery pack 101 so that the fault conditions of the battery pack 101 may never reach the most urgent level. The supervision unit 160 disconnects the battery pack 101 (through software approach) from the output terminals 152.1, 152.2 when it deems the fault conditions of the battery pack 101 is unable to be adjusted to a proper working condition. Alternatively, in the present invention, the activating circuit 103 and the supervision unit 160 can work separately. Specifically, the activating circuit 103 can perform its function without the supervision unit 160. Likewise, the supervision unit 160 can perform its functions without the activating circuit 103.

In a joint-operation mode, the supervision unit 160 sets the values of the high-cap-voltage threshold, low-cap-voltage threshold, high-cap-temperature threshold more lenient than those of the high-critical-voltage threshold, low-critical-voltage threshold and high-critical-temperature threshold due to the redundant control by the activating circuit 103. When working independently, the supervision unit 160 sets the values of the high-cap-voltage threshold, low-cap-voltage threshold, high-cap-temperature threshold to the values of the high-critical-voltage threshold, low-critical-voltage threshold and high-critical-temperature threshold due to lacking the redundant control by the activating circuit 103. According to one embodiment of the present invention, in the joint-operation mode, the threshold ranges for the operation (working) parameters should be arranged in a suitable hierarchy, such as the defined ranges of the cap values for the supervision unit 160 should be narrower than the defined ranges of the critical values for the activating circuit 103 to realize the dual protection (i.e., the hardware and software dual protection).

Figure 9:
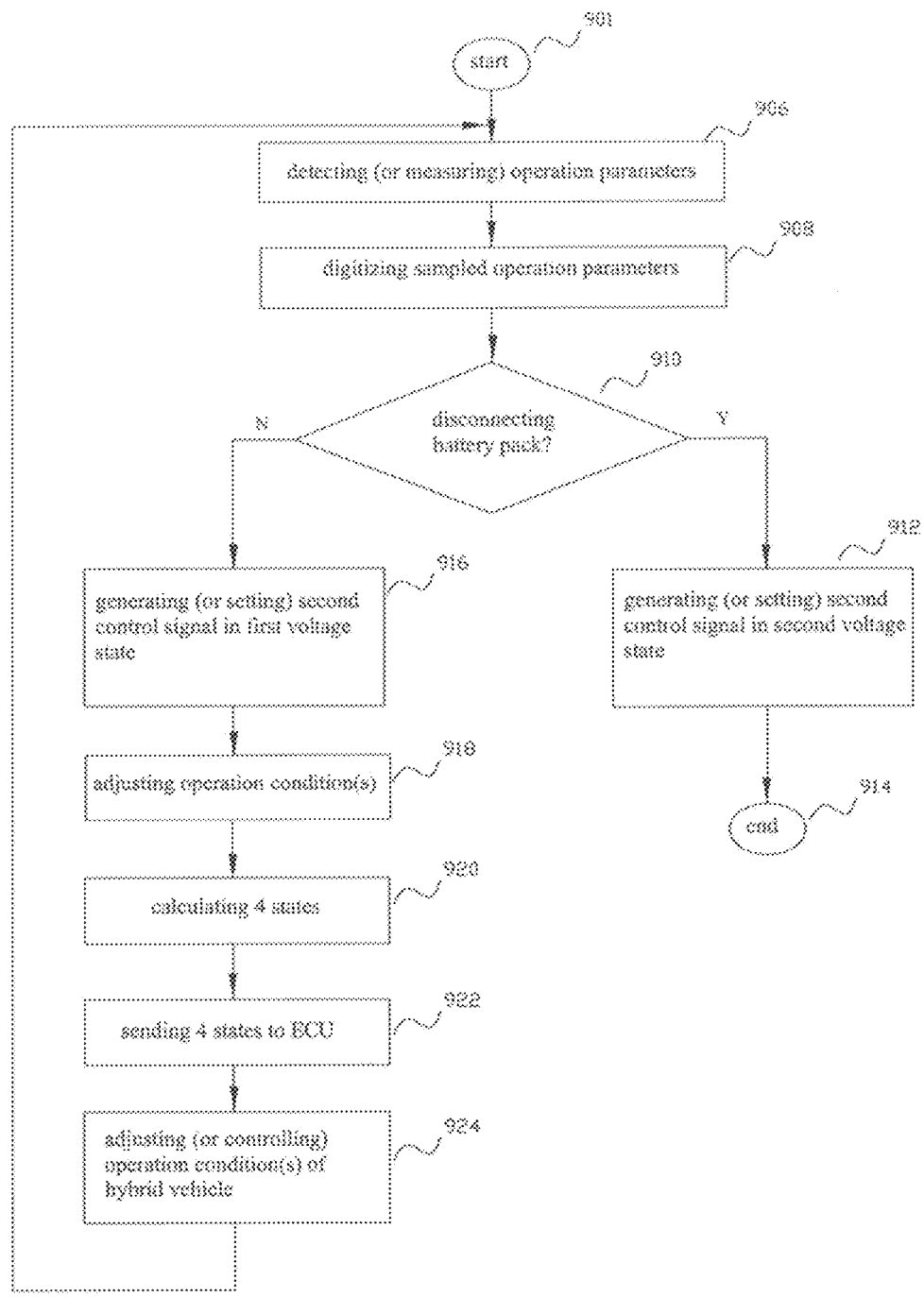
FIG. 9 is a flowchart to show the steps of monitoring, managing and adjusting the operation conditions of the battery pack 101 by the supervision circuit (or battery management circuit) 160 according to the present invention.

FIG. 9 is a flowchart 900 to show the steps of monitoring, managing and adjusting the operation conditions of the battery pack 101 by the supervision unit 160 according to the present invention.

In step 906, the detecting circuit (the second detecting circuit) 107 shown in FIGS. 1A-C detects (measures or samples) one or more operation (working) parameters of the battery pack 101, including the operation (working) voltages of the 13 battery cells, the operation (working) temperatures of the two selected battery cells and the operation (working) current of the battery pack 101, and sends the sampled one or more operation (working) parameters to the ADC 108.

In step 908, the ADC 108 digitizes the detected (measured or sampled) one or more operation (working) parameters and sends the digitized one or more operation (working) parameters to the processor unit 109 shown in FIGS. 1A-C. More specifically, the digitized one or more operation (working) parameters are sent to the CPU 801 of the processor unit 109 through input circuit 804 shown in FIG. 8. After receiving the digitized one or more operation (working) parameters, the CPU 801 stores them in the memory device 803 shown in FIG. 8.

In step 910, the CPU 801 determines whether it is needed to disconnect the battery pack 101 from the output terminals (152.1, 152.2). If it is needed to disconnect the battery pack 101 from the output terminals (152.1, 152.2) (Yes), the operation is led to step 912; if it is not needed to disconnect the battery pack 101 from the output terminals (152.1, 152.2) (No), the operation is led to step 916

Specifically, in step 910, the CPU 801 compares the sampled one or more working parameters (including the 13 sampled working voltages from the 13 battery cells, the sampled the 2 working temperatures from the two selected battery cells and the sampled working current from the battery pack 101) with the high-cap-voltage threshold, the low-cap-voltage threshold, the high-cap-temperature threshold, and/or the high-cap-current threshold.

In step 910, the operation is led to step 912, when: (1) any of the 13 sampled operation (working) voltages exceeds (or equals to) the high-cap-voltage threshold, (2) any of the 13 sampled operation (working) voltages is below (or equals to) the low-cap-voltage threshold, (3) any of the 2 sampled operation (working) temperatures exceeds (or equals to) the high-cap-temperature threshold or (4) the sampled operation (working) current exceeds (or equals to) the high-cap-current threshold. In step 912, the CPU 801 generates (or sets) the output of the register 802 (as the second control signal) into a second voltage state and sends the output of the register 802 to the switch control circuit 104 via the output circuit 805. The output of the register 802 in the second voltage state cuts off the current path of the switch transistor 105 (or 105') to cause the switch device 106 to disconnect the battery pack 101 from the two output terminals 152.1 and 152.2. The operation is then led to step 914 to end the operation.

In step 910, the operation is led to step 916 when: (1) all of the 13 sampled operation (working) voltages are below (or equal to) the high-cap-voltage threshold, (2) all of the 13 sampled operation (working) voltages exceed (or equal to) the low-cap-voltage threshold, (3) all of the two selected battery cells are below (or equal to) the high-cap-temperature threshold, and (4) the sampled operation (working) current is below (or equals to) the high-cap-current threshold. In step 916, the CPU 801 generates (sets or maintains) the output of the register 802 (as the second control signal) into a first voltage state and sends the output of the register 802 to the switch control circuit 104 via the output circuit 805. The output of the register 802 in the first voltage state connects the current path of the switch transistor 105 to cause (or keep) the switch device 106 to connect the battery pack 101 to the two output terminals 152.1 and 152.2. The operation is then led to step 918 to end the operation process of the hybrid vehicle.

In step 918, the supervision unit 160 adjusts the operation conditions for the battery pack 101 based on the sampled one or more operation (working) parameters. Specifically, the CPU 801 can calculate the voltage differences among the 13 sampled operation (working) voltages for the 13 battery cells and select a particular battery cell(i) (i=1, 2, . . . , 13) that has too high voltage over the other battery cells in the battery pack 101. As one embodiment, the present invention can set the minimum cell balance triggering threshold as 20 mv. To perform the battery balancing process for the selected battery cell(i), the CPU 801 sends a balancing control signal (via connection 827) in a high voltage state to the gate (G) of the balancing transistor 752(i) shown in FIG. 7B via the output circuit 805 for the selected battery cell(i) to form a current path so that the current can circulate around the positive terminal and the negative terminal of the selected battery cell 102(i). During the battery balancing process, the supervision unit 160 keeps monitoring the sampled operation (working) voltage for the selected battery cell 102(i). When the sampled operation (working) voltage for the selected battery cell 102(i) is reduced to a desired level, the CPU 801 generates (or sets) the balancing control signal in a low voltage state and sends the balancing control signal to the gate (G) of the balancing transistor 752(i) via the output circuit 805 so that the current path for the respective battery cell 102(i) is cutoff to stop the voltage balancing process. The purpose of battery cell balancing is to enable the battery cells to return to a relatively balanced health state when large voltage differences exist among the battery cells in the battery pack 101. When the voltages among the serially-connected battery cells in the battery pack 101 become too large, some of the battery cells may be over-charged/over-discharged in the operation of the hybrid vehicle.

Because the battery balancing process is accomplished by discharging current in the embodiment of the present invention, the battery balancing process may generate heat and reduce the State of Charge (SOC). Therefore, before starting the battery balancing process, the CPU 801 needs to determine the operation conditions of the battery pack 101, including whether the operation temperature is within a temperature range, whether the current SOC of the battery cell is within a range, the operation current is bellow a current value (such as 200 Amp) and whether fault conditions have previous occurred. The proper conditions are mainly to ensure the system is secure and reliable before the battery balancing process starts. For example, the proper operation current condition is to ensure all battery cells in the battery pack 101 are in relatively electrochemically stable conditions when battery balancing is performed.

In step 920, based on the sampled operation (working) voltages and the sampled operation (working) current, the supervision unit 160 (including the CPU 801 together with the software resided in the supervision unit 160) calculates 4 operation states of the battery pack 101, including state of charge (SOC), state of health (SOH), state of function (SOF), and state of Power Limit of the battery pack 101.

The SOC indicates the available capacity of the battery expressed as a percentage of its actual capacity. An SOC of 0% indicates that the available capacity of the battery is zero. An SOC of 100% indicates that the available capacity of the battery is at its highest level. This indication of the available capacity of the battery assists in protecting the battery against over-charging and deep discharging.

The present invention provides the feature for calculating of the traction battery and cell state of health (SOH). The SOH presents the battery health situation including such as voltage, current, power, and resistance of the pack at the time. The values of the battery and cell internal resistances, capacities, some time including the powers, are the characteristics of the battery and cell state of health. The concept of battery and cell SOH is different from the faults or SOC of the battery and cell in usages. The faults of the battery and cell are defined the abnormal performances in usages, SOC of battery and cell refers to their characteristic parameter changes in short term of the usages. However, SOH is the health symbol of the battery and cell. SOH describes the battery and cell long term change, as same as the life of the automotive. Regularly, SOH is defined the ratio of the measured capacity with regard to the nominal capacity of the battery and cell, and it is used to prognosis the life of the battery and cell.

The SOF is a set of parametric measurements that determine the state of the function of the battery (i.e., the ability of the battery to provide electrical power under a range of conditions). The SOF indicates the pack life for the reference of the vehicle operation and maintenances. The vehicle uses the SOF to assist it in power management of the various power sources in the vehicle for optimum performance. The parametric measurements which define the SOF are the voltage limits, current limits and power limits that a battery can provide at various time periods: Instantaneous (dynamic), short, medium, long and continuous.

The Power Limit refers to an available power that can be currently supplied by the pack 101. Power limitation is compounds of pack voltage and current. It is defined related to the period of pack used. For example, the calculated pack power for 2 seconds used and 10 second used are different. If, in operation, the hybrid vehicle uses power exceeding the Power Limit of the battery pack 101, the service life of the battery pack 101 might be shortened and battery failure might be caused.

These 4 operation (working) states can be stored in the memory device 803 after calculation and enable the ECU 164 to optimize their use of the battery for the hybrid vehicle without damaging the battery pack 101.

In step 922, the CPU 801 sends the 4 operation states (including SOC, SOH, SOF and Power Limit) to ECU 164 via Can Interface 163. In operation of the hybrid vehicle, the ECU 164 performs real-time monitoring the operation (working) states so as to control the hybrid vehicle to properly use battery pack 101. For example, the ECU 164 can control the hybrid vehicle not to use the power of the battery pack 101 that exceeds the Power Limit.

In step 924, the CPU 801 sends the one or more operation (working) parameters (such as battery temperatures) and the 4 operation states to the displaying unit 112 via the link 166. The displaying unit 164 then displays the one or more operation (working) parameters and the 4 operation states onto the GUI 114 so that the operator of the hybrid vehicle can observe the operation (working) condition of the battery pack 101 and perform intervention, if needed, via the GUI 114.

In step 926, the operation is led back to step 906 for repeating the process for monitoring, managing and adjusting the operation (working) conditions of the battery pack 101 in the operation of the hybrid vehicle.

It should be noted that the program (or instructions) of the flowchart 900 can be stored in the memory 803 and executed by the CPU 801.

The advantageous technical effects of the present invention include as follows:

a. the system configuration includes multiple design concepts;
b. high efficient balancing strategy;
c. the control system have dual protections including hardware protection and software protection, but the hardware or the software protection can implement pack protection independently, if needed;
d. the control system have multiple grades diagnostics;
e. low cost and low power consumption;
f. history data record;
g. high accuracy SOC strategy, and
h. flexible scalability in battery management schemes and functions.

FIG. 10 depicts a battery 1000 that comprises an upper (or top) housing 1001 and a lower (or bottom) housing 1002 according to the present invention. A positive post 1003.1 and a negative post 1003.2 are inserted through the two holes (1005.1, 1005.2) on the top housing 1001 as the power output terminals of the battery 1000. 10 clips (1022.1, 1022.2, 1022.3; 1024.1, 1024.2) and (1023.1, 1023.2, 1023.3; 1025.1, 1025.2) are disposed (or molded) on the 4 edges on the openings of the upper housing 1001. In FIG. 10, the 5 clips (1023.1, 1023.2, 1023.3; 1025.1, 1025.2) cannot be seen because they are located on the opposite of the upper housing 1001.

Figure 11A:
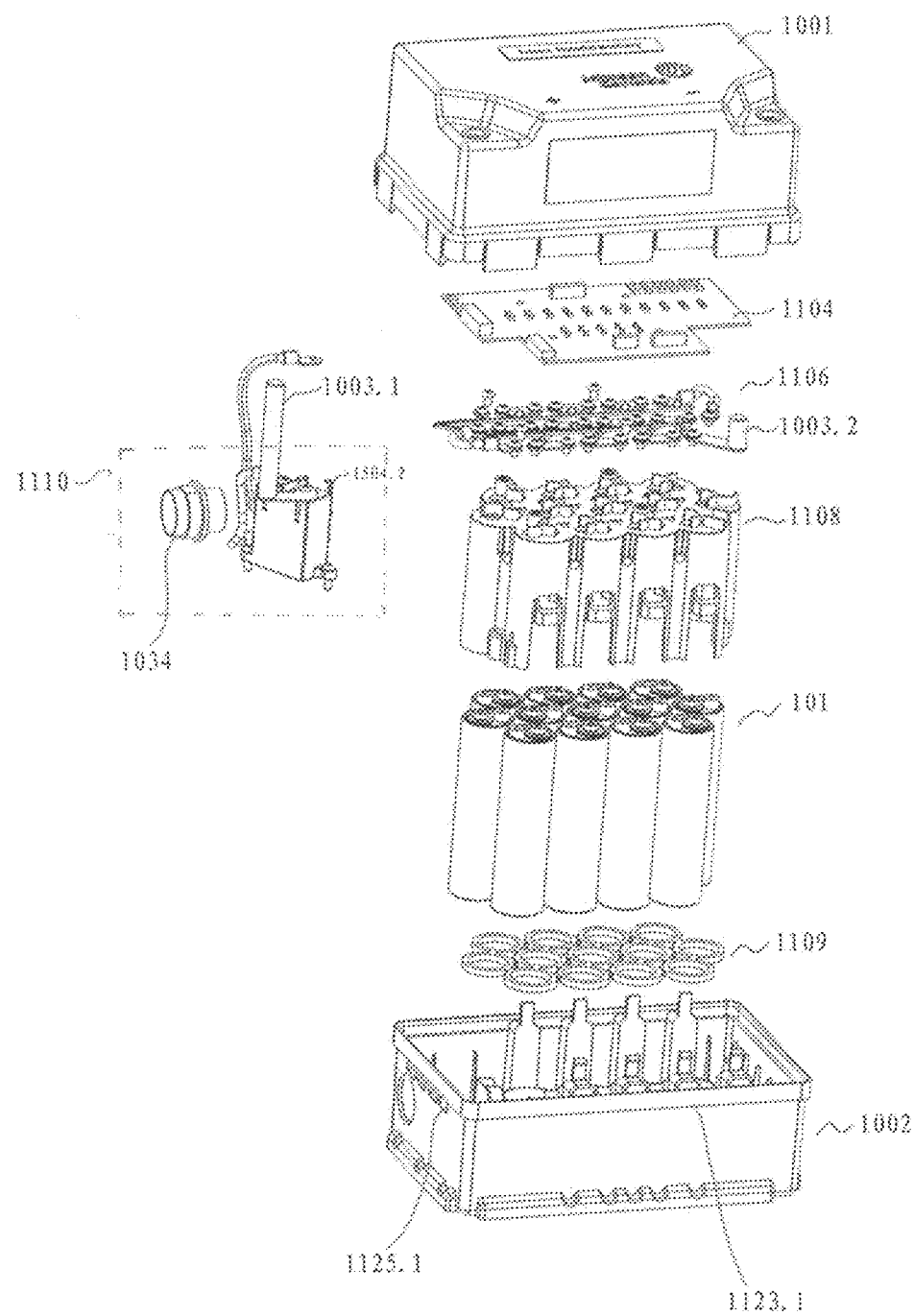
FIG. 11A is the explosive view of the battery 1000 shown in FIG. 10 according to the present invention.

FIG. 11A is the explosive view of the battery 1000 shown in FIG. 10 according to the present invention. As shown in FIG. 11A, the battery 1000 includes a PCB board 1104, a wire harness assembly 1106, a middle housing 1108, a battery pack 101 (including 13 serially-connected battery cells 102($i$) ($i$=1, 2, . . . , 13) that can be accommodated within the cell chambers in the middle housing 1108), cell bottom foam 1109, and connection assembly 1110. Also as shown in 11A, around the top 4 edges of the lower (or bottom) housing 1002, there are disposed (molded) 4 taper flanges (1123.1, 1123.2; 1125.1, 1125.2) so that in the process of assembling the battery 1000, the 10 clips on the upper housing 1001 can lock the 4 taper flanges on the top edges of the lower housing 1002. In FIG. 11A, the 2 taper flanges (1123.2; 1125.2) cannot be seen because they are located on the opposite of the lower housing 1002.

Figure 11B:
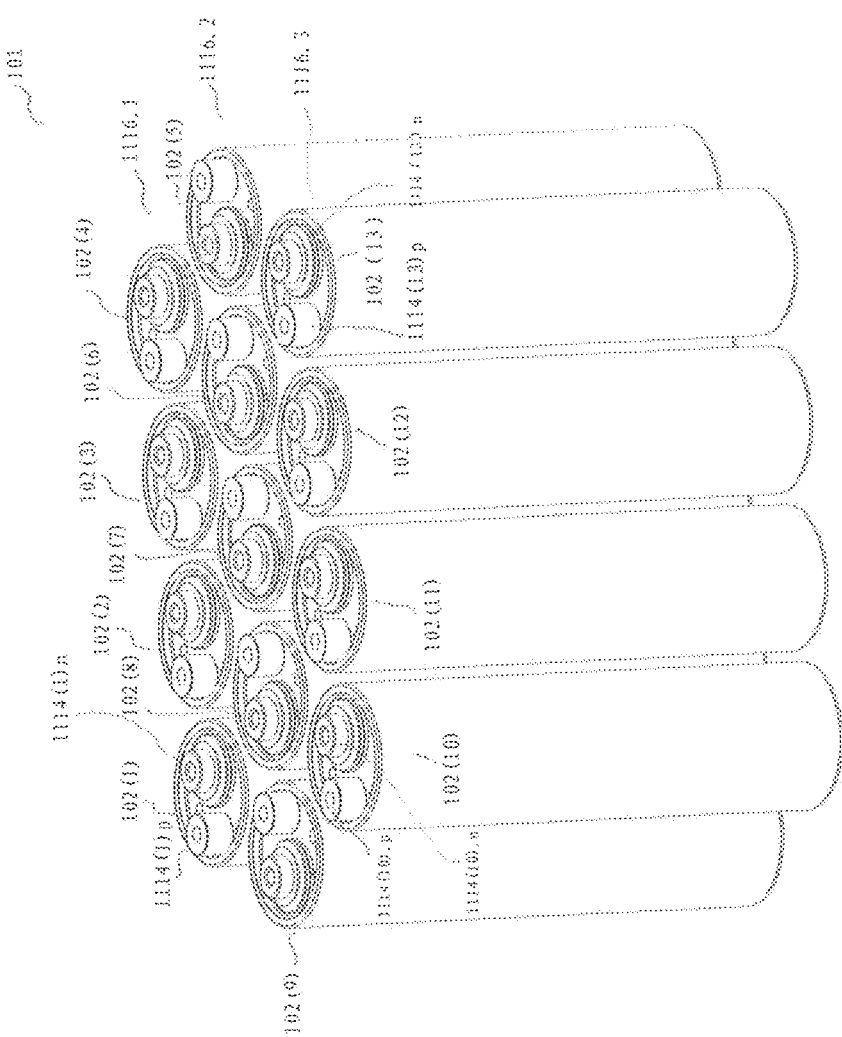
FIG. 11B depicts the battery pack 101 shown in FIG. 11A in greater details.

FIG. 11B depicts the battery pack 101 shown in FIG. 11A in great details. As shown in FIG. 11B, the 13 battery cells 102($i$) ($i$=1, 2, . . . , 13) in the battery pack 101 are arranged in three rows, including a first lateral row (or a first outside row) 1116.1, a second lateral row (or a second outside row) 1116.3 and a middle row 1116.2, which is located between the first lateral row 1116.1 and the second lateral row 1116.3. Each of the first lateral row 1116.1 and second lateral row 1116.3 of the battery pack 101 has 4 battery cells (102(1), 102(2), 102(3), 102(4)); or (102(10), 102(11), 102(12), 102(13)). The middle row of the battery pack 101 has 5 battery cells (102(5), 102(6), 102(7), 102 (8), 102 (9)). Each of the 13 battery cells 102($i$) has a positive terminal 1114($i$).$p$ and a negative terminal 1114($i$).$n$ of the top surface ($i$=1, 2, . . . , 13).

Figure 11C:
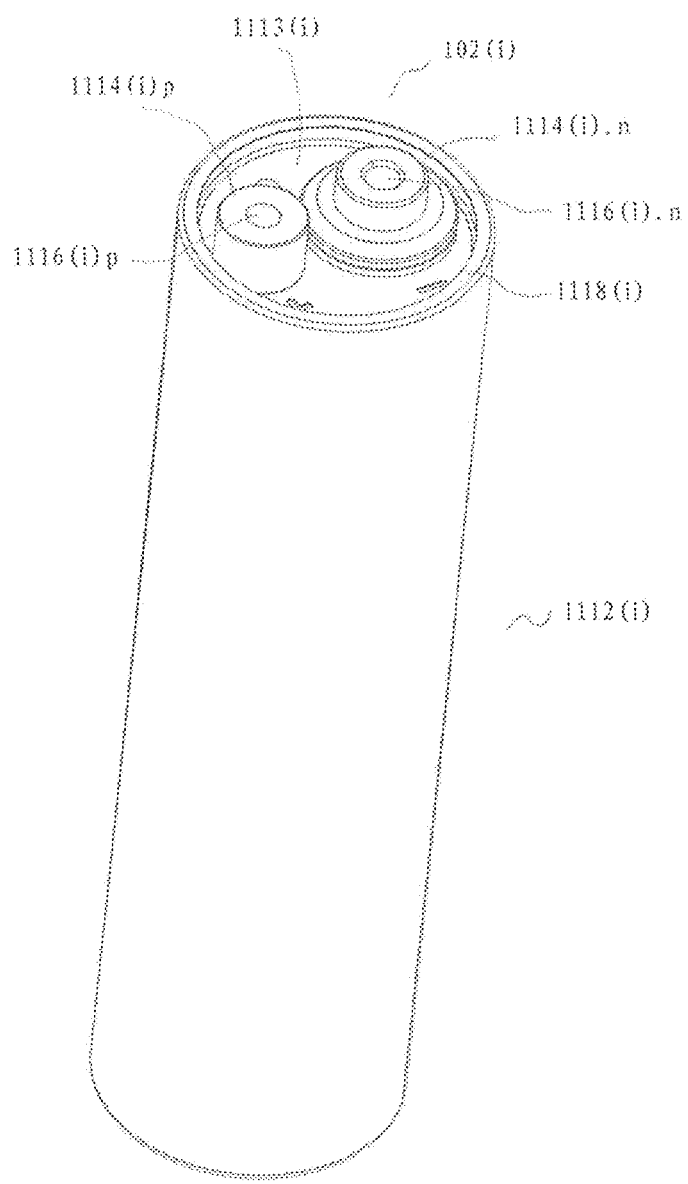
FIG. 11C depicts one individual battery cell 102($i$) ($i$=1, 2, . . . , 13) as shown in FIG. 11B in greater details.

FIG. 11C depicts one individual battery cell 102($i$) ($i$=1, 2, . . . , 13) as shown in FIG. 11B in greater details. As shown in FIG. 11C, the battery cell 102($i$) has a cylinder-shaped body 1112($i$) and includes a pair of terminals including a positive terminal 1114($i$).$p$ and a negative terminal 1114($i$).$n$ that extend out from the top surface 1113($i$) of the battery cell 102($i$) ($i$=1, 2, . . . , 13). On the tops of the pair of the positive terminal 1114($i$).$p$ and negative terminal 1114($i$).$n$, there has a pair of threaded holes (1116($i$).$p$, 1116($i$).$p$), respectively. A circular ring 1118($i$) extends out of the top surface 1113($i$) of the battery cell 102($i$) and circularly surrounds the positive terminal 1114($i$).$p$ and negative terminal 1114($i$).$n$. The height of the positive terminal 1114($i$).$p$ and negative terminal 1114($i$).$n$ on the top surface 1113($i$) of the battery cell 102($i$) is taller than that of the circular ring 1118($i$).

Figure 11D:
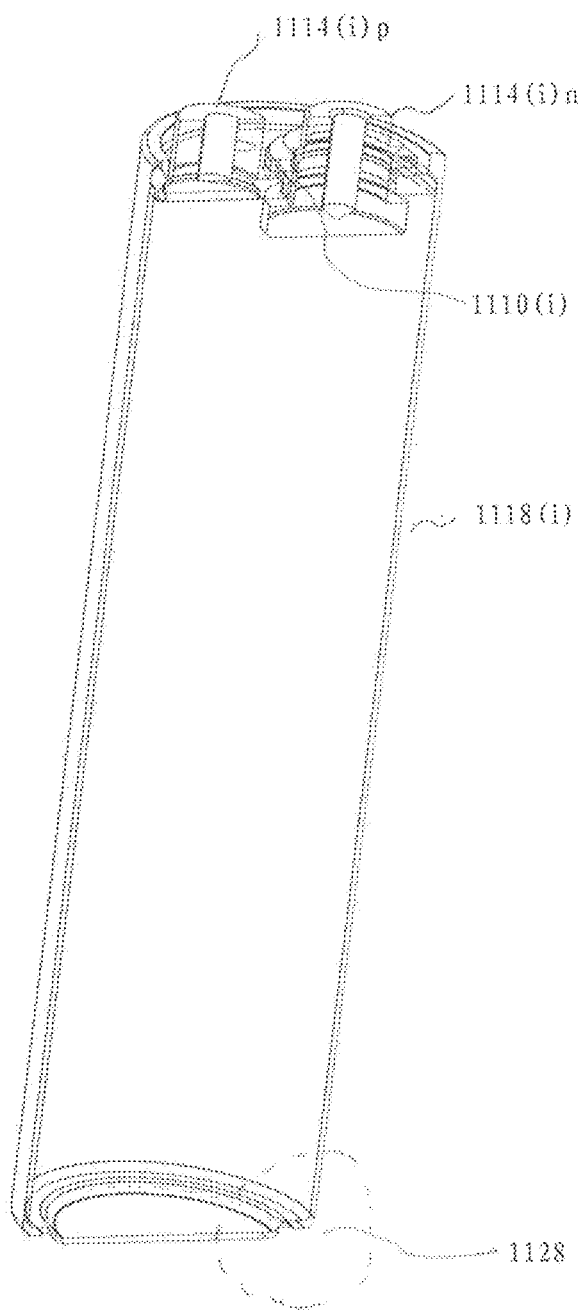
FIG. 11D is the section view of the battery cell 102($i$) ($i$=1, 2, . . . , 13) shown in FIG. 11C.

FIG. 11D is the section view of the battery cell 102($i$) ($i$=1, 2, . . . , 13) shown in FIG. 11C. As shown in FIG. 11D, the battery cell 102($i$) has a metal can (or shell) 1118($i$). The positive terminal 1114($i$).$p$ of the battery cell 102($i$) is connected (or electrically connected) to the metal can (or shell) 1118($i$), while the negative terminal 1114($i$).$n$ is electrically insulated from the metal can (or shell) 1118($i$) by the insulation ring 1118($i$), which is made from insulation material. A breakable vent (or stage) 1128($i$) is disposed on the bottom edge on the battery cell 102($i$) for accommodating the cell foam 1109 shown in FIG. 11A. If the internal pressure of the battery cell 102($i$) exceeds a predetermined value, the breakable vent (or stage) 1128($i$) breaks, which may release the leaking substance (such as gas) from the inside of the battery cell($i$).

FIGS. 12A-E depict the middle housing 1108 shown in FIG. 11A in greater details.

Figure 12A:
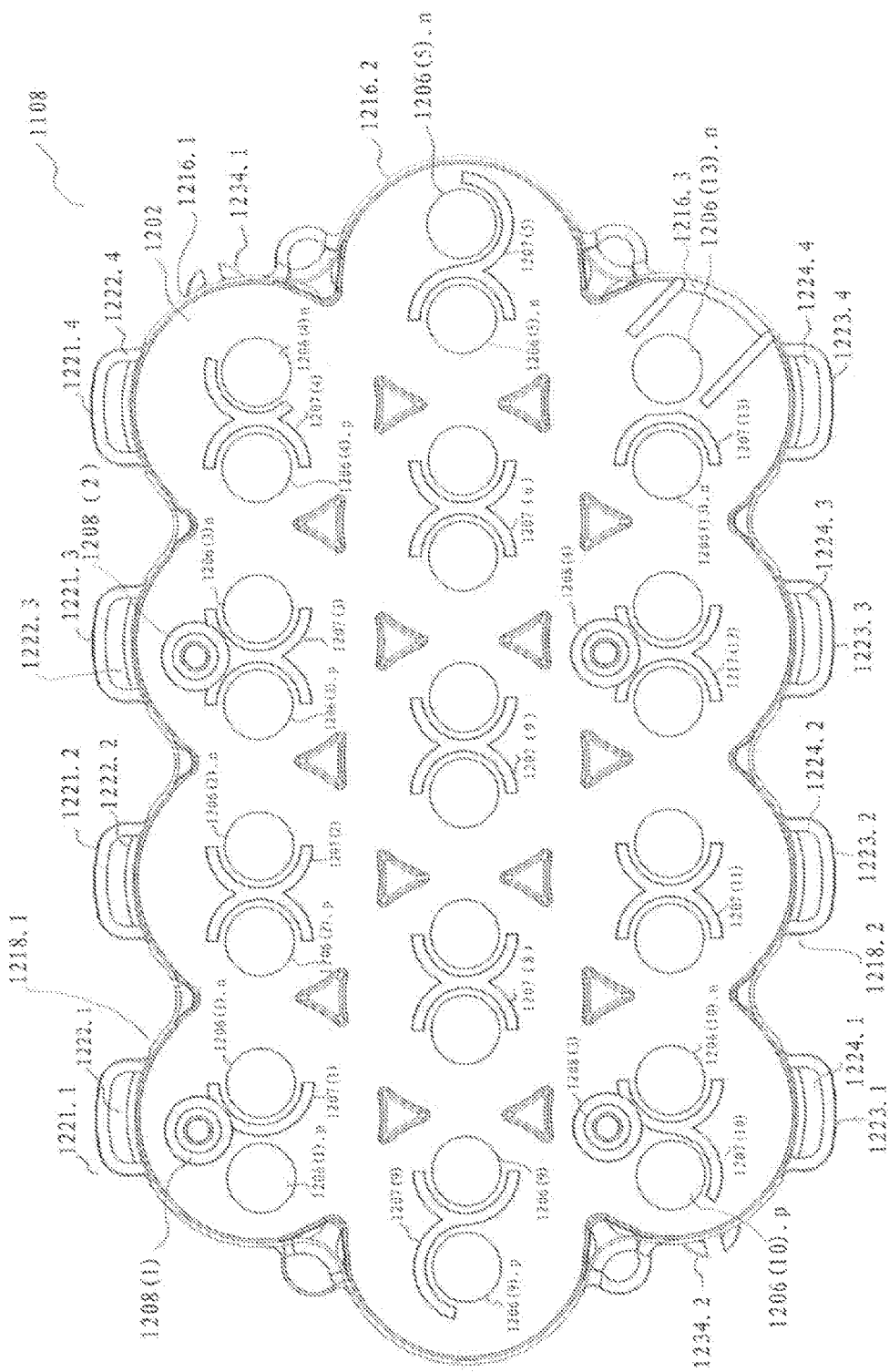
FIGS. 12A-E depict the middle housing 1108 shown in FIG. 11A in greater details.

Reference is made to FIG. 12A, the middle housing 1108 has a top surface 1202, on which the PCB board 1104 and the wire harness assembly 1106 are installed. As shown in FIG. 12A, the top surface 1202 has 4 installation bosses (or holes) (1208(1), 1208(2), 1208(3), 1208(4)) for fixing the PCB board 1104 thereon. The top surface 1202 also has 13 pairs of installation holes (1206($i$).$p$, 1206($i$).$n$; $i$=1, 2, . . . , 13), which are arranged in three rows, including a first lateral row 1216.1, a middle row 1216.2 and a second lateral row 1216.3, for accommodating the 13 pairs of the positive terminals 1114($i$).$p$ and negative terminal 1114($i$).$n$ of the 13 battery cells 102($i$) in the battery pack 101 ($i$=1, 2, . . . , 13).

In FIG. 12A, the first lateral row 1216.1 on the top surface 1202 of the middle housing 1108 has 4 pairs of installation holes (1206(1).$p$, 1206(1)$n$; 1206(2).$p$, 1206(2).$n$; 1206(3).$p$, 1206(3).$n$; 1206(4).$p$, 1206(4).$n$) for accommodating the 4 pairs of positive terminals and negative terminals (1114(1).$p$ 1114(1).$n$; 1114(2).$p$ 1114(2).$n$; 1114(3).$p$ 1114(3).$n$; 1114(4).$p$ 1114(4).$n$) in the first lateral row 1116.1 of the 4 battery cells in the battery pack 101, respectively. The middle row on the top surface 1202 of the middle housing 1008 has 5 pairs of installation holes (1206(5).$p$, 1206(5)$n$; 1206(6).$p$, 1206(6).$n$; 1206(7).$p$, 1206(7).$n$; 1206 (8).$p$, 1206(8).$n$; 1206(9).$p$, 1206(9).$n$) for accommodating the 5 pairs of positive terminals and negative terminals (1114(5).$p$ 1114(5).$n$; 1114(6).$p$ 1114(6).$n$; 1114(7).$p$ 1114 (7).$n$; 1114(8).$p$ 1114(8).$n$; 1114(9).$p$ 1114(9).$n$) in the middle row 1116.2 of the 5 battery cells in the battery pack 101. The second lateral row 1216.2 on the top surface 1202 of the middle housing 1008 has 4 pairs of installation holes (1206(10).$p$, 1206(10)$n$; 1206(11).$p$, 1206(11).$n$; 1206(12).$p$, 1206(12).$n$; 1206(13).$p$, 1206(13).$n$) for accommodating the 4 pairs of positive terminals and negative terminals (1114(10).$p$ 1114(10).$n$; 1114(11).$p$ 1114(11).$n$; 1114(12).$p$ 1114(12).$n$; 1114(13).$p$ 1114(13).$n$) in the second lateral row 1116.3 of the 4 battery cells in the battery pack 101, respectively.

In FIG. 12A, the top surface 1202 of the middle housing 1108 also has 13 isolation flanges (or plates) (1207(1), 1207(2), . . . , 1207(13)), which are made by insulation materials and are located between the 13 pairs of the installation holes (1206(1).$p$, 1206(1)$n$; 1206(2).$p$, 1206(2).$n$; . . . , 1206(13).$p$, 1206(13).$p$), respectively, for preventing the 10 bus bars (in the wire harness assembly 1006, as shown in FIG. 14, from contacting with each other when serially connecting the 13 battery cells in the assembly process of the battery 1000. The top surface 1202 of the middle housing 1108 further has 4 internally-threaded holes (1208.1, 1208.2, 1208.3, 1208.4) for installing the PCB board 1004 on the top surface 1202 of the middle housing 1108. The middle housing 1108 also has a first lateral side wall 1218.1 and second lateral side wall 1118.2. Each of the first and second lateral side walls (1218.1 or 1118.2) has 4 ears (1221.1, 1221.2, 1221.3, 1221.4) or (1223.1, 1223.2, 1223.3, 1223.4) for attaching the middle housing 1108 onto the lower housing 1102.

Each of the ears (1221.1, 1221.2, 1221.3, 1221.4) on the first lateral side wall 1218.1 has an open pocket (1222.1, 1222.2, 1222.3, 1222.4). Similarly, each of the ears (1223.1, 1223.2, 1223.3, 1223.4) on the second lateral side wall 1218.2 has an open pocket (1224.1, 1224.2, 1224.3, 1224.4). The 4 open pockets (1222.1, 1222.2, 1222.3, 1222.4) or (1224.1, 1224.2, 1224.3, 1224.4) on the first lateral wall 1218.1 or on the second lateral wall 1218.2 are used to respectively accommodating the 4 wings (1822.1, 1822.2, 1822.3, 1822.4) or (1824.1, 1824.2, 1824.3, 1824.4) shown in FIG. 18A in battery assembling process of the battery 1000.

Figure 12B:
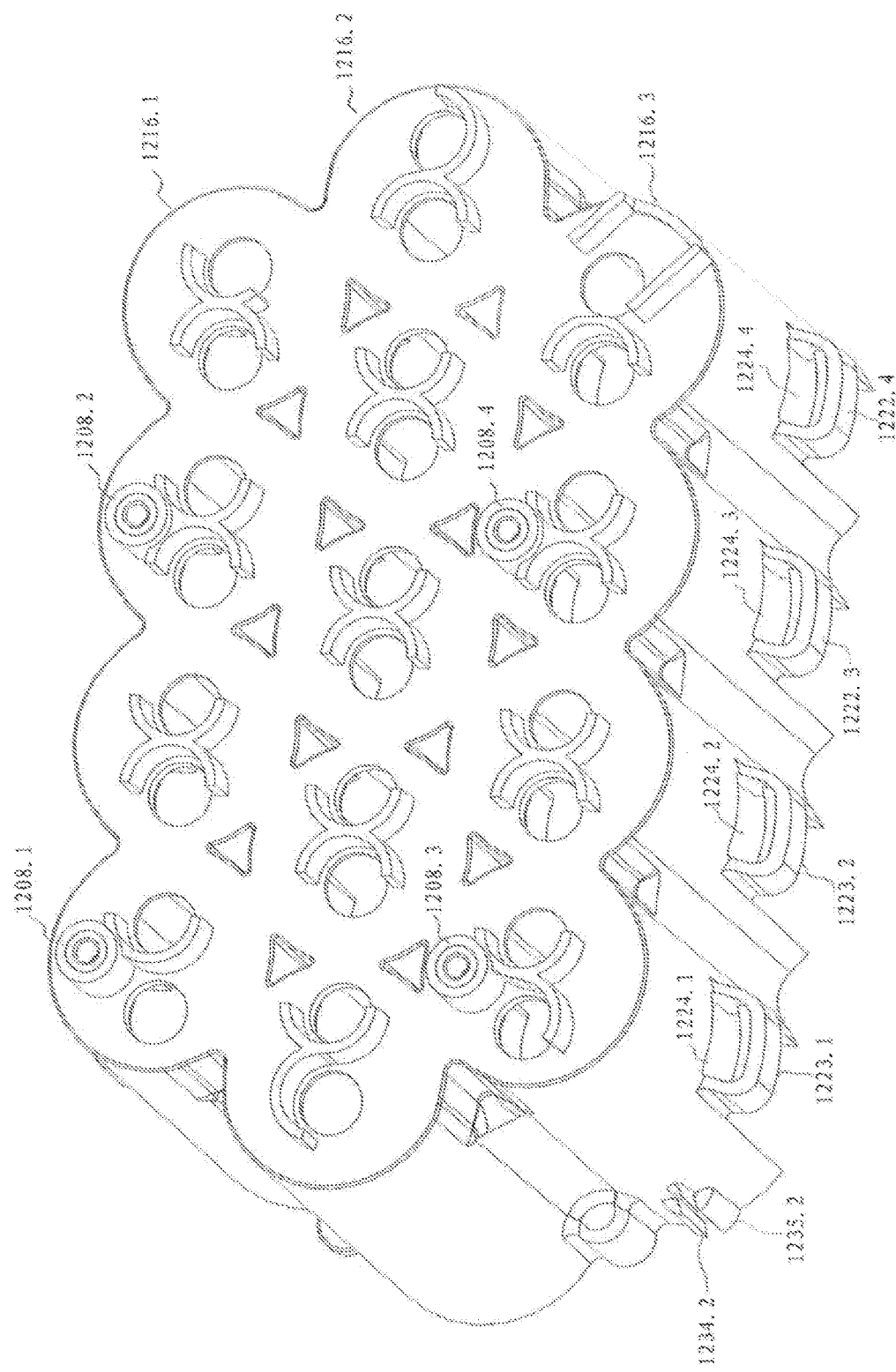
Figure 16:
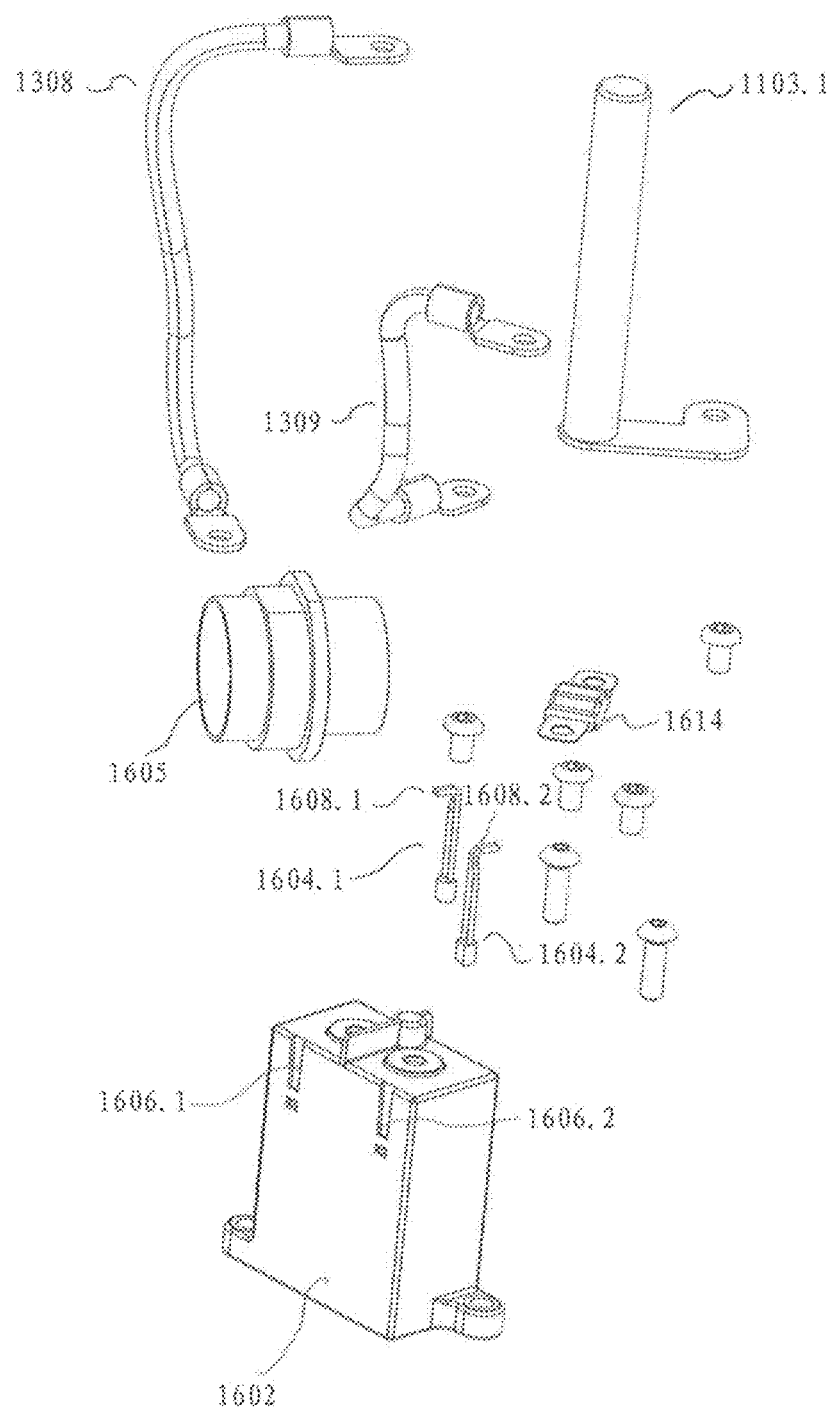
FIG. 16 depicts the connection assembly 1110 shown in FIG. 11 greater details.

In FIG. 12A, the middle housing 1108 further has 2 holding notches (1234.1, 1234.2), which is adjacent and led to the cell chamber 1208(1) and cell chamber 1208(13) (as shown in FIG. 12B), respectively. The 2 holding notches (1234.1, 1234.2) are used to attach the 2 temperature sensors (1608.1, 1608.2 as shown in FIG. 16) onto the walls of the middle housing 1108 so that the 2 temperature sensors (1608.1, 1608.2) can physically contact the two adjacent battery cells ((102(1), 102(13)) through the holding notches (1234.1, 1234.2), respectively, so that the temperature sensors (1608.1, 1608.2) can detect (measure or sample) the operation (working) temperatures of the two battery cells ((102(1), 102(13)) as the representative operation (or working) temperature of the battery 1000. The two of the outputs of the 2 temperature sensors (1608.1, 1608.2) are sent to the ADC 108 shown in FIG. 1 and one output from the 2 temperature sensors is sent to the temperature comparing circuit 207 shown in FIG. 2.

Figure 18A:
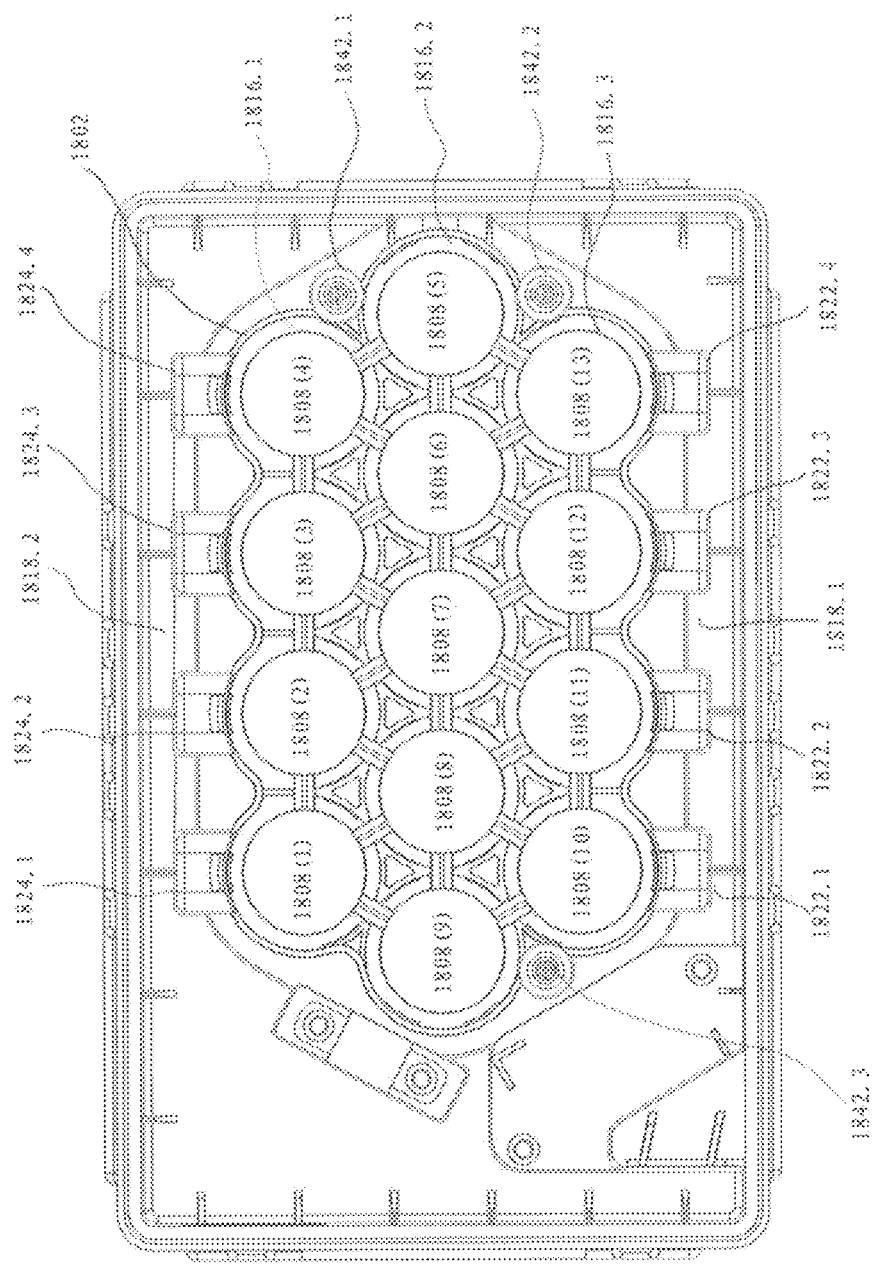
FIG. 18A depicts the top view of the lower (or bottom) housing 1002 as shown in FIG. 10.

FIG. 12B depicts a top perspective view of the middle housing 1108 to batter illustrate some of the components on the top surface 1202 and on the walls of the middle housing 1008. More specifically, FIG. 12B shows the holding notch 1234.2 and the 4 ears (1223.1, 1223.2, 1223.3, 1223.4) on the second lateral side wall 1118.2. As shown in FIG. 12B, the holding notch 1234.2 has a slot 1235.2 for sliding the temperature 1608.2 into the slot 1235.2; the 4 ears (1223.1, 1223.2, 1223.3, 1223.4) on the second lateral side 1118.2 has 4 open pockets (1224.1, 1224.2, 1224.3, 1224.4), respectively, for inserting the 4 wings (1822.1, 1822.2, 1822.3, 1822.4) as shown in FIG. 18A in battery assembly process.

The holding notch 1234.1 and the 4 ears (1221.1, 1221.2, 1221.3, 1221.4) on the first lateral side wall 1118.1 are not shown in FIG. 12B because they are located on the opposite side wall of the top perspective view of the middle housing 1108, but they have the similar structures as the holding notch 1224.2 and as the 4 ears on the second lateral side wall 1118.2 in FIG. 12B. Specifically, the holding notch 1234.1 has a slot 1235.1 for sliding the temperature sensor 1608.1 (shown in FIG. 16) into the slot 1235.1; the 4 ears (1221.1, 1221.2, 1221.3, 1221.4) on the fist lateral side wall 1118.1 has 4 open pockets (1222.1, 1222.2, 1222.3, 1222.4), respectively, for inserting the 4 wings (1824.1, 1824.2, 1824.3, 1824.4) as shown in FIG. 18A in battery assembly process.

Figure 12C:
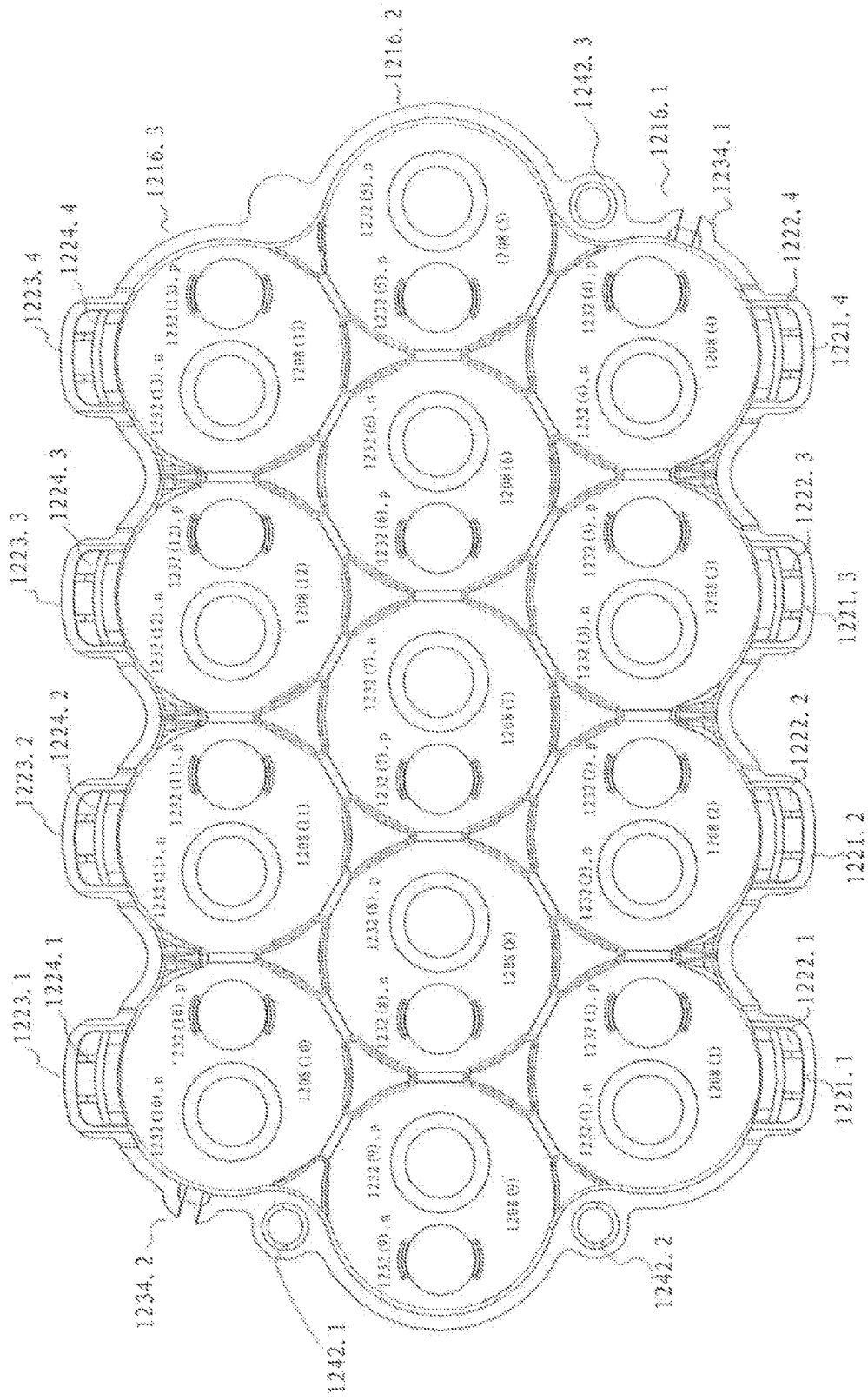

FIG. 12C depicts a bottom view of the middle housing 1108 shown in FIG. 11A. As shown in FIG. 12C, the middle housing 1108 has 13 cell chambers 1208($i$) ($i$=1, 2, . . . , 13) beneath the top surface 1202, which are arranged as three rows, including a first lateral row (or a first outside row) 1216.1, a middle row 1216.2, a second lateral row (or a second outside row) 1216.3, for accommodating the top sections of the 13 battery cells 102($i$) in the battery pack 101. The first lateral row 1216.1 of the middle housing 1008 has 4 cell chambers (1208(1), 1208(2), 1208(3), 1208(4)) for accommodating the top sections of 4 respective battery cells (102(1), 102(2), 102(3), 102(4)) of the battery pack 101. The middle row of the middle housing 1008 has 5 cell chambers (1208(5), 1208(6), 1208(7), 1208(8), 1208(9)) for accommodating the top sections of 5 respective battery cells (102(5), 102(6), 102(7), 102(8) and 102(9)) of the battery pack 101. The second lateral row 1216.3 of the middle housing 1008 has 4 cell chambers (1208(10), 1208(11), 1208(12), 1208(13)) for accommodating the top sections of 4 respective battery cells (102(10), 102(11), 102(12), 102(13)) of the battery pack 101.

Figure 18D:
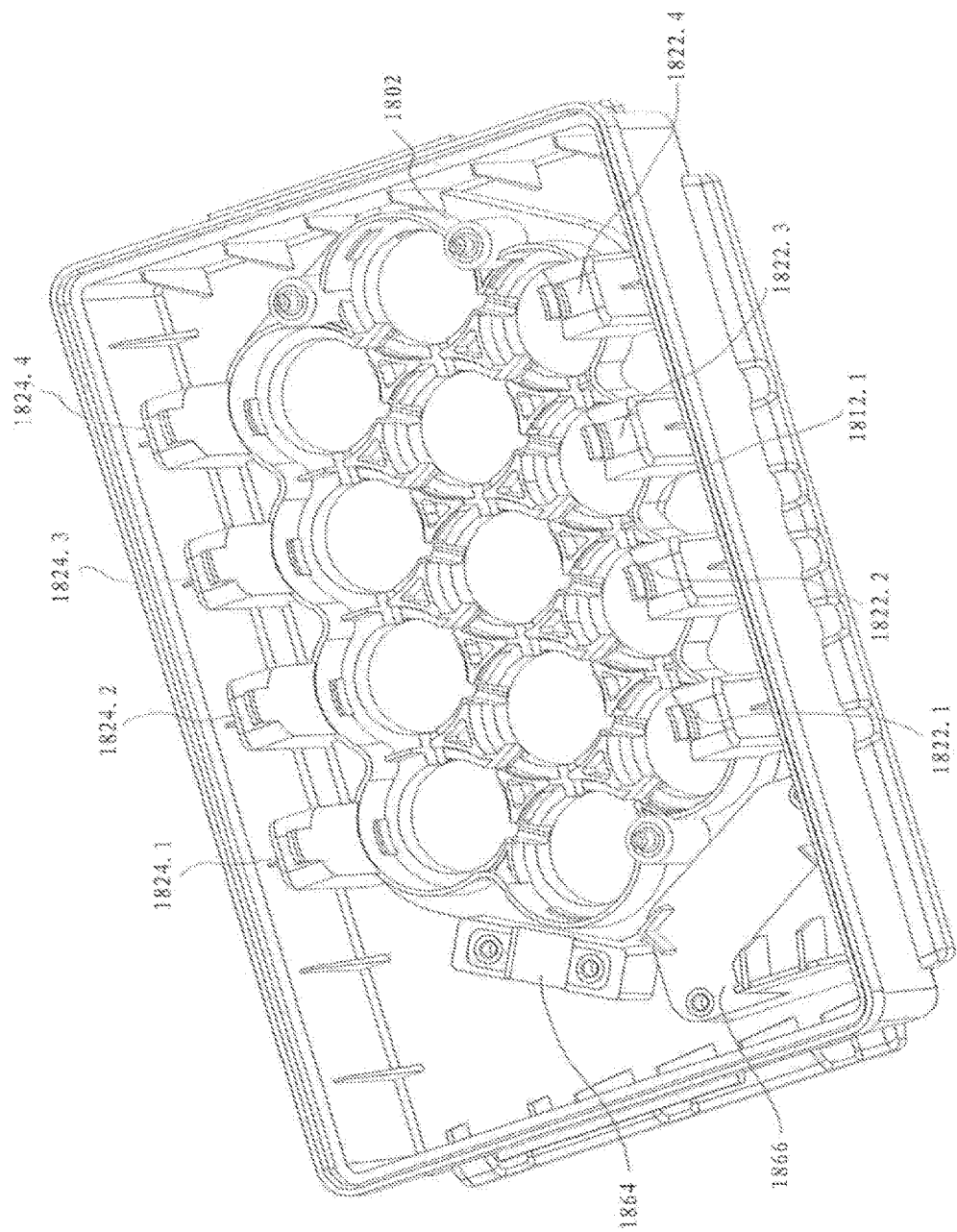
FIG. 18B depicts the top perspective view of the lower housing 1002 as shown in FIG. 18A2.
FIG. 18C shows the section view of the middle housing 1108 after the middle housing is installed onto the internal housing 1808 of the lower housing 1002 to better show some components of the battery 1000.

In FIG. 12C, each of the 13 cell chambers 1208($i$) has a pair of holes (1232($i$).$p$, 1232($i$).$n$) located on the top surface 1202 of the middle housing 1108 for accepting a respective pair of the positive terminal and negative terminal (1114($i$).$p$, 1114($i$).$n$) of the battery cell 102($i$) ($i$=1, 2, . . . , n). 3 installation holes (1242.1, 1242.2, 1242.3) are disposed on the bottom edge of the middle housing 1108 for accepting the three installation posts (1842.1, 1842.2, 1842.3) on the top edge of the middle housing 1108 onto the internal housing 1802 in battery assembling process (as shown in FIG. 18).

Figure 12D:
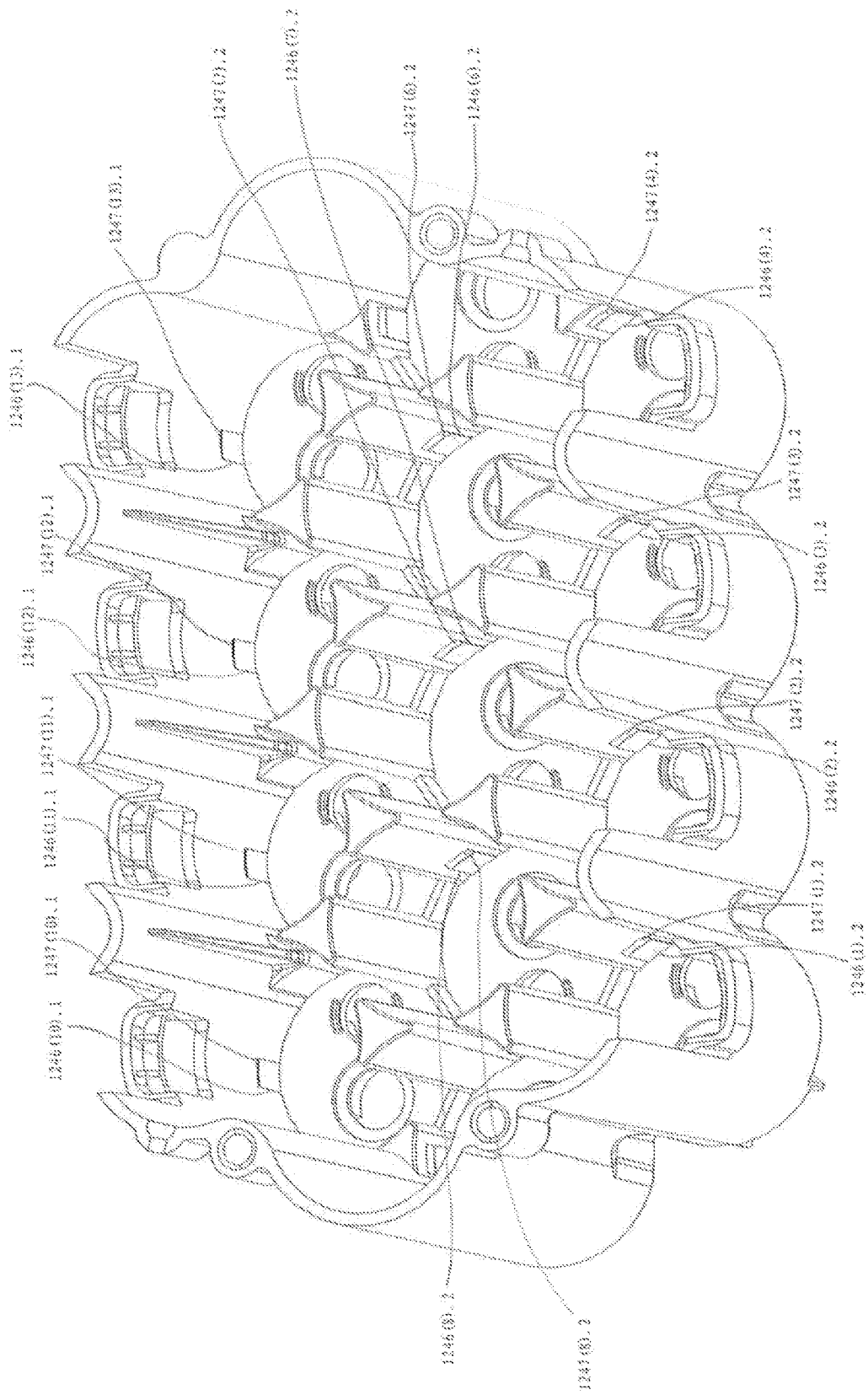

FIG. 12D depicts a bottom perspective view of the middle housing 1108 shown in FIG. 11A to better illustrate some of the components in the middle housing 1108. As shown in FIG. 12D, each of the cell chamber 1208($i$) has 3 position slabs (1246($i$).1, 1246($i$).2, 1246($i$).3), and the 3 position slabs (1246($i$).1, 1246($i$).2, 1246($i$).3) form a circular contour (or profile), which matches the external cylindrical shape of the battery cells 102($i$), for positioning a respective cells 102($i$) into the desirable position in the assembling process of the battery 1000. The 3 position slabs (1246($i$).1, 1246($i$).2, 1246($i$).3) equally divide 360 degree; or they are equally spaced (or distributed) with each other by 120 degree.

Figure 12E:
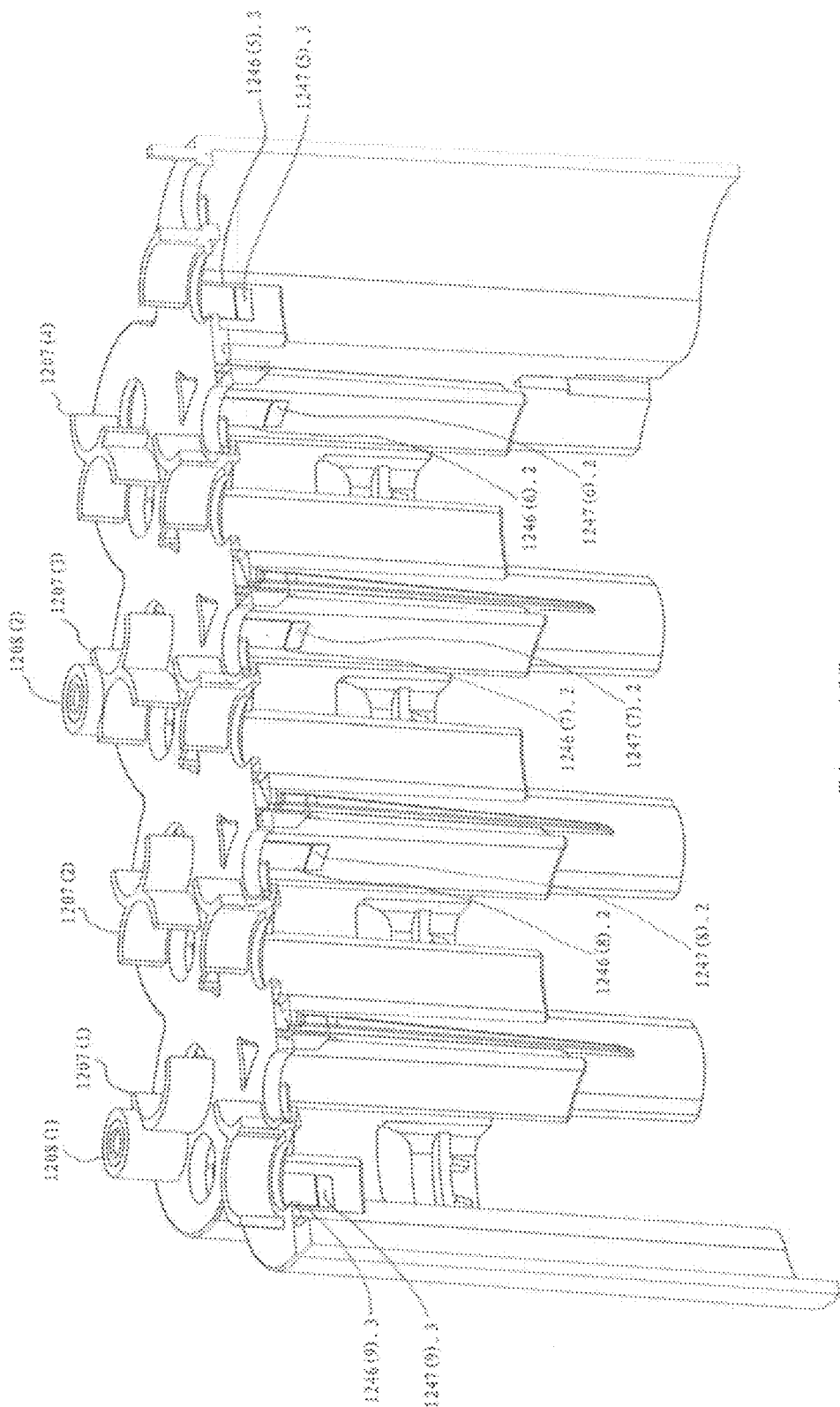

FIG. 12E depicts a section view of the middle housing 1108 shown in FIG. 12B to better illustrate some of the components in the middle housing 1108. FIG. 12E shows some of the 3 position slabs (1246($i$).1, 1246($i$).2, 1246($i$).3) in some of the cell chambers 1208($i$). As shown in FIGS. 12D-E, starting from the tip on each of the three position slabs (1246($i$).1, 1246($i$).2, 1246($i$).3), there is a guidance slope 1247 for guiding a respective battery cell 102($i$) into a desired position in the assembling process for the battery 1000.

Figure 13:
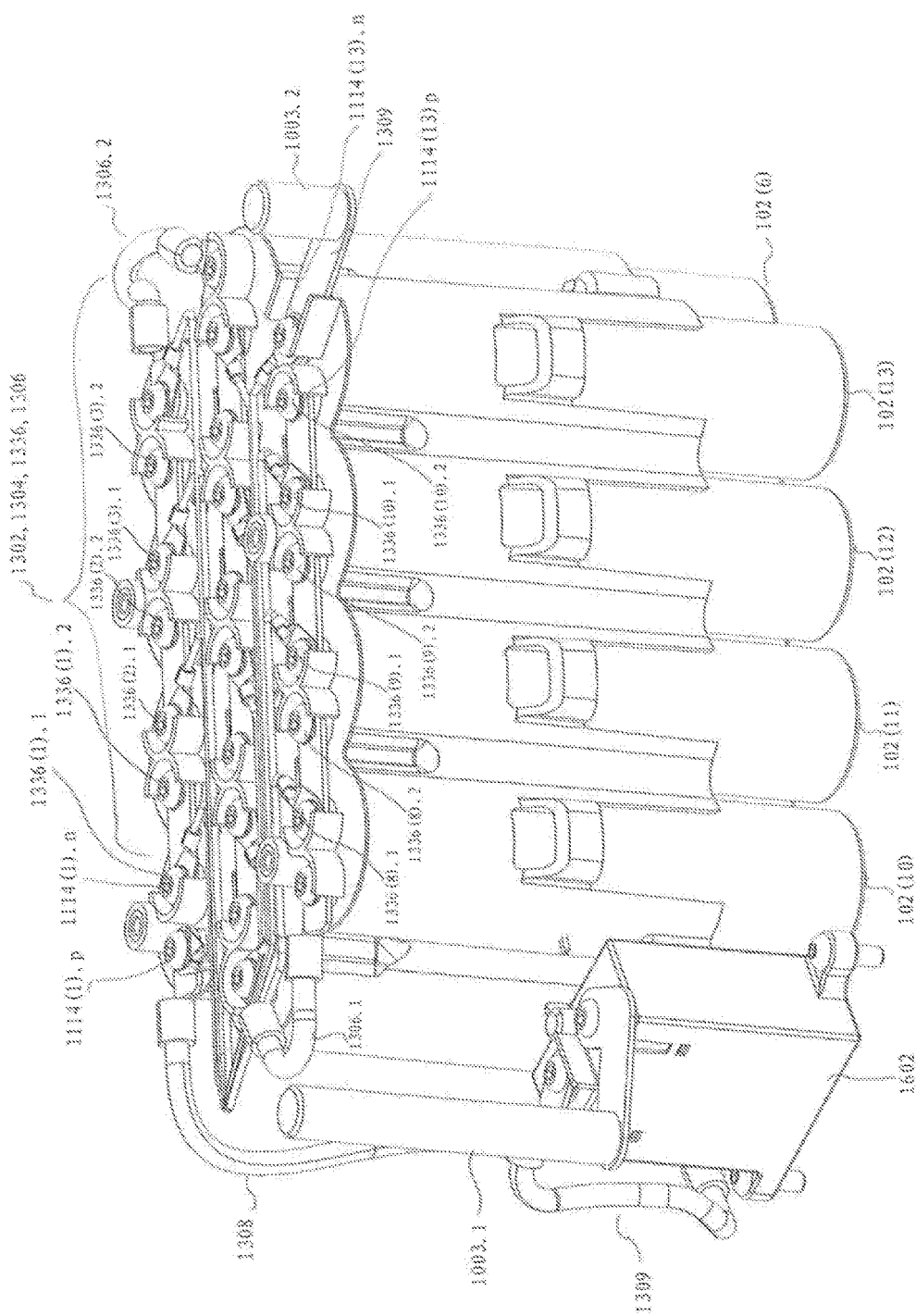
FIG. 13 depicts a top perspective view of the middle housing 1108.

FIG. 13 depicts a top perspective view of the middle housing 1108, where the wire harness assembly 1106 is installed onto the top surface 1202 of the middle housing 1108. In FIG. 13, the 13 battery cells 102($i$) of the battery pack 101 have been installed into the 13 cell chambers of the middle housing 1108; the connection wires in the wire harness assembly 1106 are fixed into the 13 pairs of holes (1116($i$).$p$, 1116($i$).$n$) on the 13 pairs of positive terminals and negative terminals (1114($i$).$p$ 1114($i$).$n$) ($i$=1, 2, . . . , 13). The wire harness assembly 1106 includes a bus-bar harness 1302 including 10 bus bars, a voltage-sense-wire harness 1304 including 13 voltage-sense wires, a terminal-out harness 1306 including one pair of terminal-out cables (1306.1, 1306.2) and a post-out cable 1308 for electrically connecting the positive post 1103.1, which is installed onto the housing 1602 as shown in FIG. 16.

In FIG. 13, the bus-bar harness 1302 is used for serially connecting the 13 battery cells in the battery pack 101; the voltage-sense-wire harness 1304 for connecting the positive terminals of the 13 battery cells to the 13 voltage sensor circuit 202 shown in FIG. 2; the terminal-out harness 1306 (1306.1, 1306.2) for connecting the battery cell outs between the first lateral row 1116.1 and the middle row 1116.2 and for connecting the battery cell outs between the middle row 1116.2 and the second lateral row 1116.3. The 10 bus bar in the bus-bar harness 1302 are fixed on the positive and negative terminals by 10 pair of screws (1336($j$).1, 1336($j$).2) ($j$=1, 2, . . . , 10). The positive post 1003.1 is installed on the connection assembly 1110 and electrically connected to the positive terminal 1114(1).$p$ of the battery cell 102(1) by the post-out cable 1308; the negative terminal 1003.2 is connected to the negative terminal 1114(13).$n$ of the battery cell 102(13) by a bar 1309.

Figure 14A:
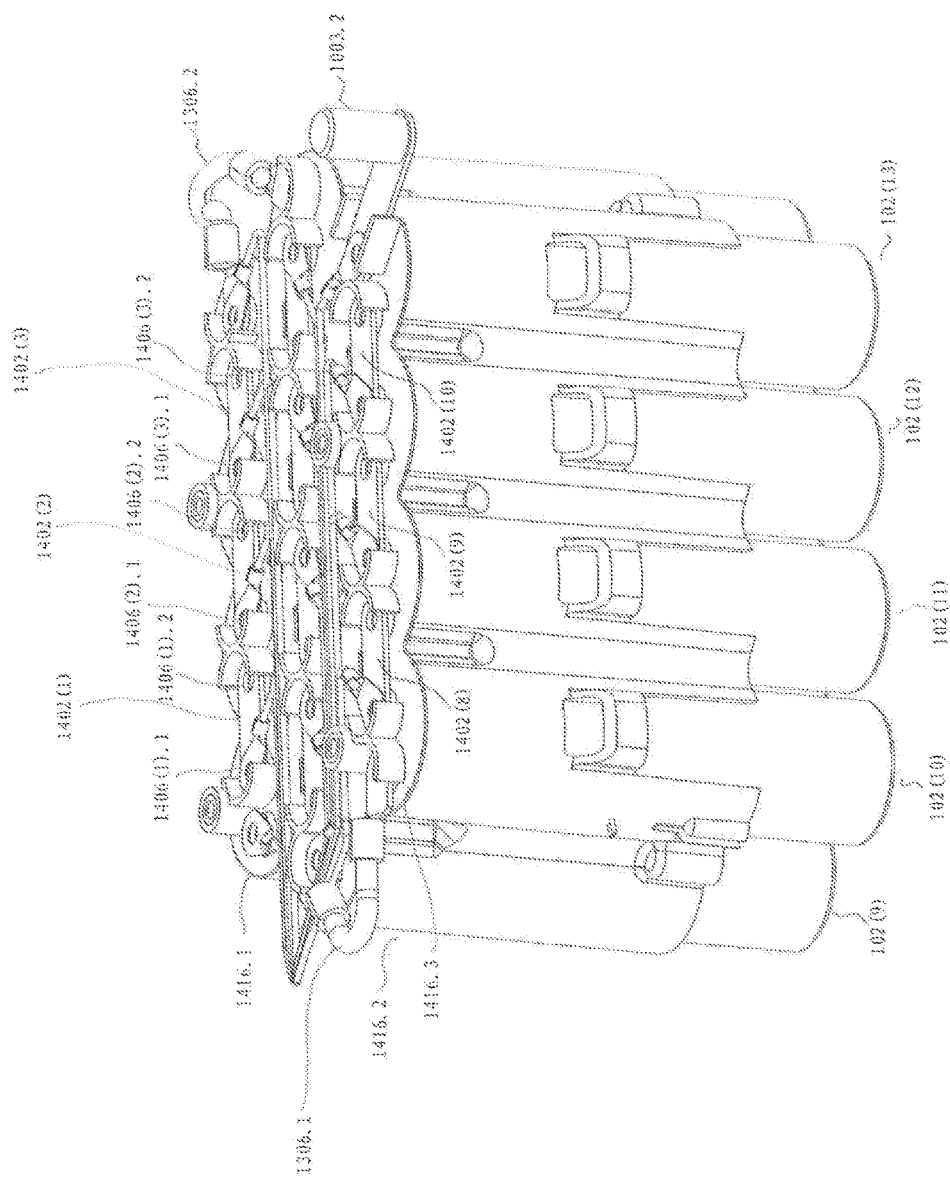
FIG. 14A depicts a top perspective view of the middle housing 1108 shown in FIG. 13 to more clearly show some components therein.

FIG. 14A depicts a top perspective view of the middle housing 1108 shown in FIG. 13 to more clearly show some components therein. In FIG. 14A, the wire harness assembly 1106 is laid onto the top surface 1202 prior to installing it onto the top surface 1202 of the middle housing 1108. As shown in FIG. 14A, the bus-bar harness 1302 includes 10 bus bars 1402($j$) ($j$=1, 2, . . . , 10). Each of the 10 bus bars 1402($j$) has a pair of holes (1406($j$).1, 1406($j$).2) for accepting a pair of screws (1336($j$).1, 1336($j$).2 as shown in FIG. 13) to fix the bus bars 1402($j$) onto the two battery terminals of the two battery cells (102($i$), 102($i$+1)) that are adjacent to each other ($j$=1, 2, . . . , 10; $i$=1, 1, . . . , 13). In FIG. 14, the bus-bar harness 1302 is divided into three rows (1416.1, 1416.2 and 1416.3), including a first lateral row (or a first outside row) 1416.1, a middle row 1416.2 and second lateral row (or a second outside row) 1416.3.

The first lateral row 1416.1 of the bus-bar harness 1302 has 3 bus bars (1402(1), 1402(2), 1402(3)), with each of them having a pair of holes (1406(1).1, 1406(1).2; 1406(2).1, 1406(2).2; or 1406(3).1, 1406(3).2) for accepting a pair of screws (1336(1).1, 1336(2).2; 1336(2).1, 1336(2).2; or 1336(3).1, 1336(3).2 as shown in FIG. 13) to fix the respective bus bar (1402(1), 1402(2), or 1402(3)) onto the two battery terminals of the two adjacent battery cells (102(1), 102(2); 102(2), 102(3); or 102(3), 102(4)) in the first lateral row 1116.1 of the battery pack 101.

The middle row 1416.2 of the bus-bar harness 1302 has 4 bus bars (1402(4), 1402(5), 1402(6), 1402(7)), with each of them having a pair of holes (1406(4).1, 1406(4).2;

1406(5).1, 1406(5).2; 1406(6).1, 1406(6).2; or 1406(7).1, 1406(7).2) for accepting a pair of screws ((1336(4).1, 1336(4).2; 1336(5).1, 1336(5).2; 1336(6).1, 1336(6).2; or 1336(7).1, 1336(7).2 as shown in FIG. 13) to fix the respective bus bar (1402(4), 1402(5), 1402(6) or 1402(7)) onto the two battery terminals of the two adjacent battery cells (102(5), 102(6); 102(6), 102(7); 102(7), 102(8); or 102(8), 102(9)) in the middle row 1116.2 of the battery pack 101. The negative terminal of battery cell 102(4) in the first lateral row 1416.1 is connected to the positive terminal of the battery cell 102(5) in the middle row 1416.2 by the terminal-out cable 1306.2.

The second lateral row 1416.3 of the bus-bar harness 1302 has 3 bus bars (1402(8), 1402(9), 1402(10)), with each of them having a pair of holes (1406(8).1, 1406(8).2; 1406(9).1, 1406(9).2; or 1406(10).1, 1406(10).2) for accepting a pair of screws (1336(8).1, 1336(8).2; 1336(9).1, 1336(9).2; or 1336(10).1, 1336(10).2 as shown in FIG. 13) to fix a respective bus bar (1402(8), 1402(9), or 1402(10)) onto the two battery terminals of the two adjacent battery cells (102(10), 102(11); 102(11), 102(12); or 102(12), 102(13)) in the second lateral row 1116.3 of the battery pack 101. The negative terminal of battery cell 102(9) in the middle row 1416.2 is connected to the positive terminal of the battery cell 102(10) in the second lateral row 1416.3 by the terminal-out cable 1306.1.

Referring to FIG. 14A, the voltage-sense-wire harness 1304 including 13 voltage sense wires 1404(i) (i=1, 2, . . . , 13). The distal end in each of the voltage sense wires 1304(i) has a tag 1426(i) with a hole 1428(i) on it for accepting one of the screws to fix the distal end of the voltage sense wires 1404(i) onto the positive terminal of the respective battery cell 102(i) in the battery pack 102 (i=1, 2, . . . , 13). The other ends of the 13 voltage sense wires 1404(i) (i=1, 2, . . . , 13) are connected to the activating circuit 103 and the detecting circuit shown in FIGS. 1A-C.

In FIG. 14A, the voltage-sense-wire harness 1304 is divided into three rows (1436.1, 1436.2 and 1436.3 as shown in FIG. 14B), including a first lateral row 1436.1, a middle row 1436.2 and second lateral row 1436.3. The voltage-sense-wire harness 1304 in the first lateral row 1436.1 has 4 voltage sense wires (1404(1), 1404(2), 1404(3), 1404(4)) for connecting the positive terminals of the 4 battery cells (102(1), 102(2), 102(3), 102(4)), respectively, in the first lateral row 1116.1 of the battery pack 101. The voltage-sense-wire harness 1304 in the middle row 1436.2 has 5 voltage sense wires (1404(5), 1404(6), 1404(7), 1404(8), 1401(9)) for connecting the positive terminals of the 5 battery cells (102(5), 102(6), 102(7), 102(8), 102(9)), respectively, in the middle row 1116.2 of the battery pack 101. The voltage-sense-wire harness 1304 in the second lateral row 1436.3 has 4 voltage sense wires (1404(10), 1404(11), 1404(12), 1404(13)) for connecting the positive terminals of the 4 battery cells (102(10), 102(11), 102(12), 102(13)), respectively, in the second lateral row 1116.3 of the battery pack 101.

FIG. 14B shows the voltage-sense-wire harness 1304 and one bus bar 1402(j) in the bus-bar harness 1302 in greater details.

Figure 15:
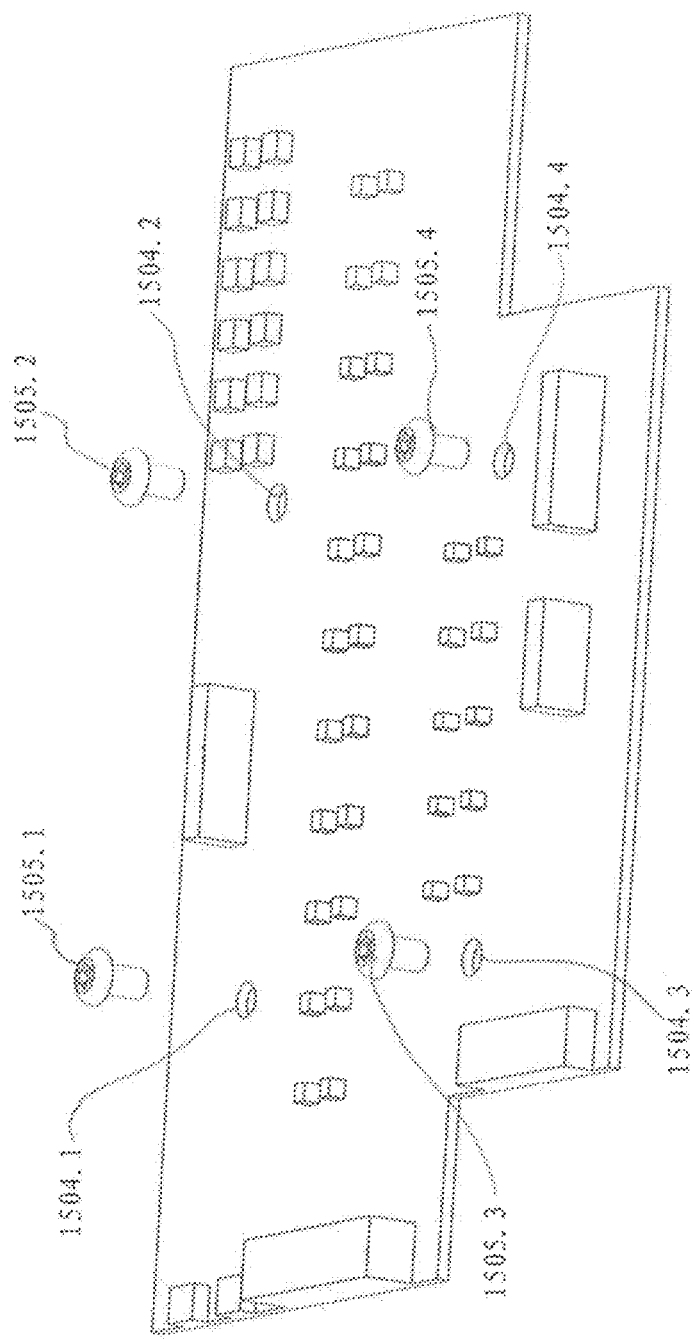
FIG. 15 depicts the PCB board 1004 shown in FIG. 11 in greater details.

FIG. 15 depicts the PCB board 1004 shown in FIG. 11 in greater details. As shown in FIG. 15, the PCB board 1004 installs (or assembles) the activating circuit 103, supervision circuit 160, smooth circuit 166, inverter 169, switch transistor (105, 105') and CAN interface 163 that are shown in FIGS. 1A-C. Corresponding to the 4 installation holes (1208(1), 1208(2), 1208(3), 1208(4)) on the top surface 1202 of the middle housing 1108, the PCB board 1004 has 4 installation holes (1508.1, 1508.2, 1508.3, 1508.4) thereon to fix the PCB board 1004 attached or affixed onto the top surface 1202 of the middle housing 1108.

FIG. 16 depicts the connection assembly 1110 shown in FIG. 11 in greater details. As shown in FIG. 16, the connection assembly 1110 includes a housing 1602, in which the switch device 106 is accommodated, 2 temperature sensors (1604.1, 1604.2), a wire connector 1605 and a bridge plate 1614. The 2 temperature sensors (1604.1, 1604.2) are accommodated in the 2 slots (1235.1, 1235.2) on the 2 holding notches (1234.1, 1234.2) of the middle housing 1108 shown in FIG. 12B so that the 2 distal tips (1608.1, 1608.2) of the 2 temperature sensors (1604.1, 1604.2) can contact the two selected battery cells in the battery pack 101. The other 2 ends (or one of the 2 ends) of the 2 temperature sensors (1604.1, 1604.2) are electrically connected to the activating circuit 103 or to the detecting circuit 107 shown in FIG. 1A by 2 wires (not shown).

FIG. 17 depicts the cell bottom foam 1109 shown in FIG. 11A in greater details. As shown in FIG. 17, the cell bottom foam 1109 includes 13 cushion ring 1702(i) for accommodating the bottom edges of the 13 battery cell 102(i) to provide cushion and sealing function to the battery cell 102(i) (i=1, 2, . . . , 13).

FIG. 18A depicts the top view of the lower (or bottom) housing 1002 as shown in FIG. 10. As shown in FIG. 18A, corresponding to the 13 cell chambers 1204(i) on the middle housing 1108, the lower housing 1002 has an internal housing 1802 which has 13 cell chambers 1804(i) (i=1, 2, . . . , 13), which are arranged as three rows, including a first lateral row (or a first outside row) 1816.1, a middle row 1816.2, a second lateral row (or a second outside row) 1816.3, for accommodating the bottom-half sections of the 13 battery cells 102(i) in the battery pack 101. The first lateral row 1816.1 of the lower housing 1002 has 4 cell chambers (1808(1), 1808(2), 1808(3), 1808(4)) for accommodating the bottom sections of 4 respective battery cells (102(1), 102(2), 102(3), 102(4)) of the battery pack 101. The middle row 1816.2 of the lower housing 1002 has 5 cell chambers (1808(5), 1808(6), 1808(7), 1808(8), 1808(9)) for accommodating the bottom sections of 5 respective battery cells (102(5), 102(6), 102(7), 102(8) and 102(9)) of the battery pack 101. The second lateral row 1816.3 of the lower housing 1002 has 4 cell chambers (1808(10), 1808(11), 1808(12), 1808(13)) for accommodating the bottom sections of 4 respective battery cells (102(10), 102(11), 102(12), 102(13)) of the battery pack 101.

In FIG. 18A, corresponding to the first lateral side wall 1218.1 and the second lateral side wall 1118.2 of the middle housing 1108 as shown the FIG. 12A, the internal housing 1802 of the lower housing 1002 has a first lateral side wall 1818.1 and second lateral side wall 1818.2. Corresponding to the 4 ears (1221.1, 1221.2, 1221.3, 1221.4) on the first lateral side wall 1218.1 of the middle housing 1108, the first lateral wall 1818.1 on the internal housing 1802 of the lower housing 1002 has 4 wings (1822.1, 1822.2, 1822.3, 1822.4), which can be inserted into the 4 open pockets (1222.1, 1222.2, 1222.3, 1222.4) shown in FIG. 12A in battery assembly process. Corresponding to the 4 ears (1224.1, 1224.2, 1224.3, 1224.4) on the second lateral side wall 1218.2 of the middle housing 1108, the second lateral wall 1818.2 on the internal housing 1802 of the lower housing 1002 has 4 wings (1824.1, 1824.2, 1824.3, 1824.4), which can be inserted into the 4 open pockets (1224.1, 1224.2, 1224.3, 1224.4) shown in FIG. 12A in battery assembly process.

FIG. 18B depicts the top perspective view of the lower housing 1002 as shown in FIG. 18A to better illustrate the structures of the lower housing 1002. As shown in FIG. 18B, the lower housing 1002 has a bridge base 1864 for installing the bridge plate 1614 and a housing base 1866 for installing the connection housing 1110.

Figure 18C:
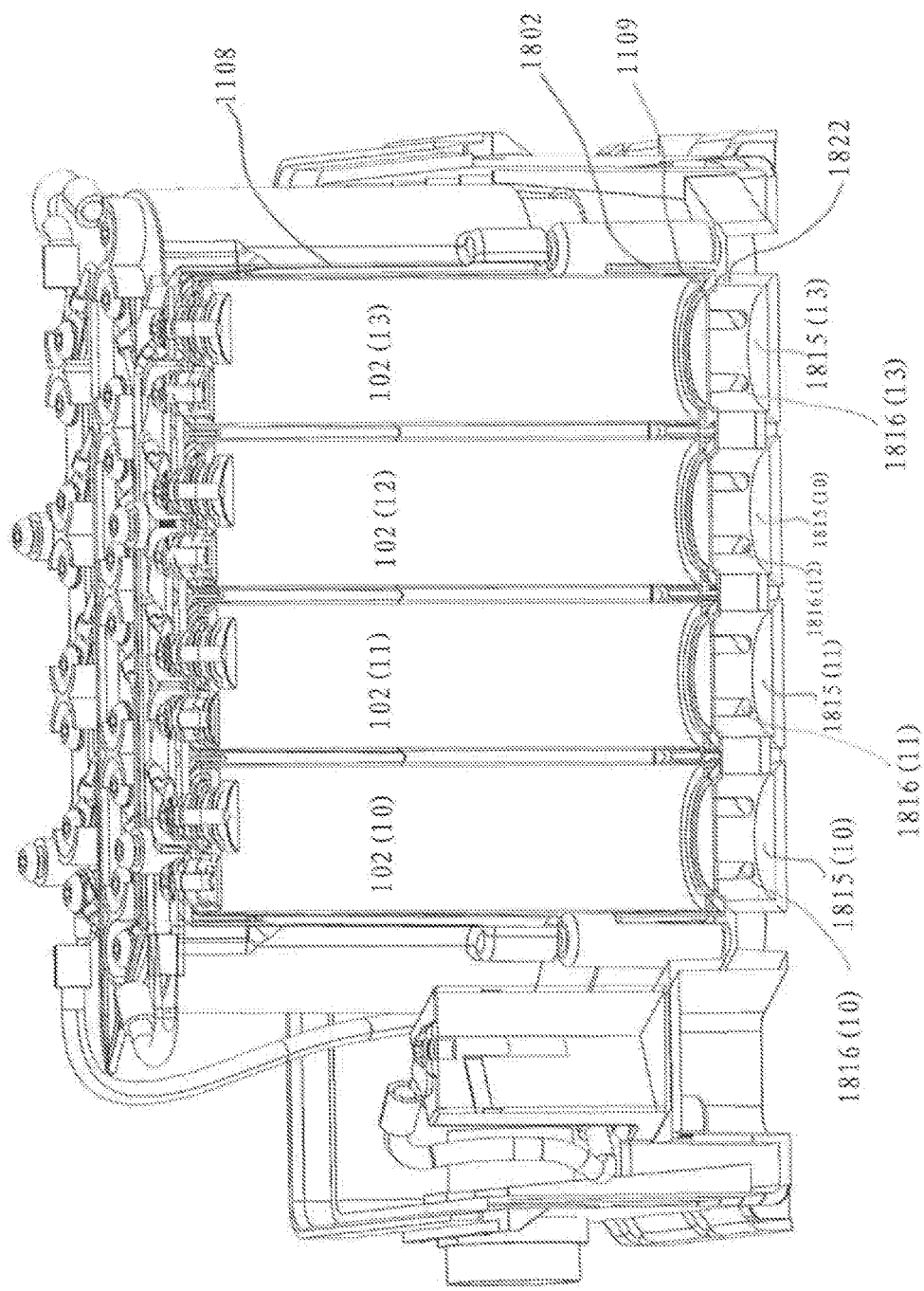

FIG. 18C shows the section view of the middle housing 1108 and the lower housing 1002 after the middle housing is installed onto the internal housing 1808 of the lower housing 1002 to better show some components of the battery 1000. As shown in FIG. 18C, after the middle housing 1108 is installed on the internal housing 1808 of the lower housing 1002, each of the cell chamber 1805($i$) has a room 1815($i$) between the bottom of the battery cell 102($i$) and the bottom of the cell chamber (i) (i=1, 2, . . . , 13). Each of the room 1815($i$) has a through-hole 1816($i$) so that all rooms 1815($i$) (i=1, 2, . . . , 13) are fluidly-connected with each other via the through-hole (1816($i$)) to a pass-channel leading to an outlet 1822 on the lower housing 1002. When any one of the battery cell 102($i$) leaks gas into the room 1515($i$), the gas can flow out of the battery 1000 through the outlet 1822.

Figure 19:
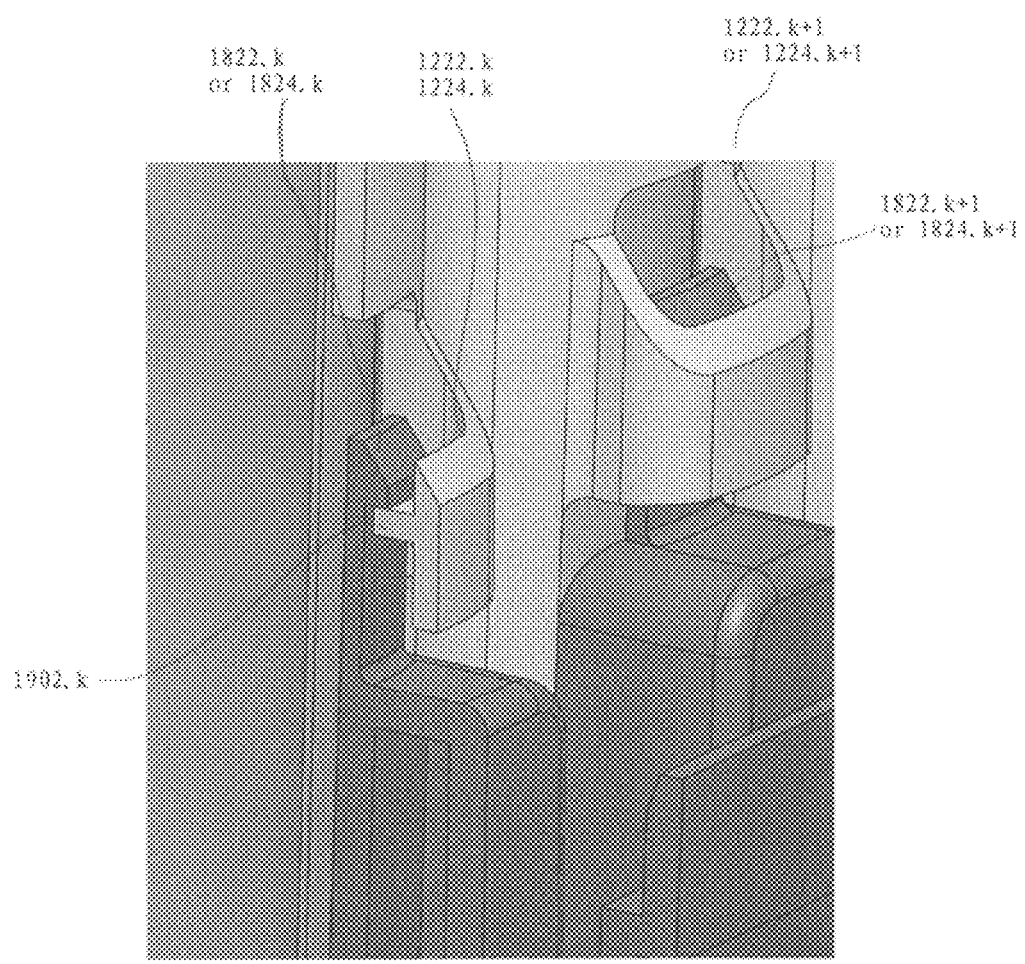
FIG. 19 shows the structures and installation relationships for the 4 ears (1221.k or 1223.k; k=1, 2, 3, 4) and the 4 wings (1822.k or 1824.k) (k=1, 2, 3, 4)

FIG. 19 depicts partial section views of the middle housing 1108 and the internal housing 1808 of the lower housing 1002 after the middle housing is installed onto the internal housing 1808 of the lower housing 1002 to show the installation relationships (or structures) for the 4 ears (1221.$k$ or 1223.$k$; k=1, 2, 3, 4) on the first lateral side wall 1218.1 or the second lateral side wall 1218.2 shown in FIG. 12A and the 4 wins (1822.$k$ or 1824.$k$) (k=1, 2, 3, 4) on the first lateral side wall 1818.1 or on the second lateral side wall 1818.2.

As shown in FIG. 19, the wing (1822.$k$+1 or 1824.$k$+1) is inserted into the respective open pocket (1222.$k$+1 or 1224.$k$+1) in the assembling process for the battery 1000. As shown in the section views of the ear (1221.$k$ or 1223.$k$) and wing (1822.$k$ or 1824.$k$), the ear (1221.$k$ or 1223$k$) has a flange (or stage) (1902.$k$ or 1904.$k$) that extends out from its internal wall; the wing (1822.$k$ or 1824.$k$) has a taper snap (hook) at its distal end. When the middle housing 1108 is being pushed towards the internal housing 1802 of the lower housing 1002, the wing (1822.$k$ or 1824.$k$) is inserted into the open pocket (1222.$k$+1 or 1224.$k$+1) on the ear (1221.$k$ or 1223.$k$). With further pushing forward, the taper snap (or hook) at the distal end of the wing (1822.$k$ or 1824.$k$) bites onto (or grasps) on the top surface of the flange (or stage) (1902.$k$ or 1904.$k$) to fix (or attach) the middle housing 1108 onto the internal housing 1802.

In the present invention, the upper housing 1001, lower housing 1002 and middle housing 1108 can be made by plastic materials through modeling.

FIGS. 20A-J show the steps of assembling the components shown in FIGS. 10-19 into the battery 1000 according to the present invention.

Figure 20B:
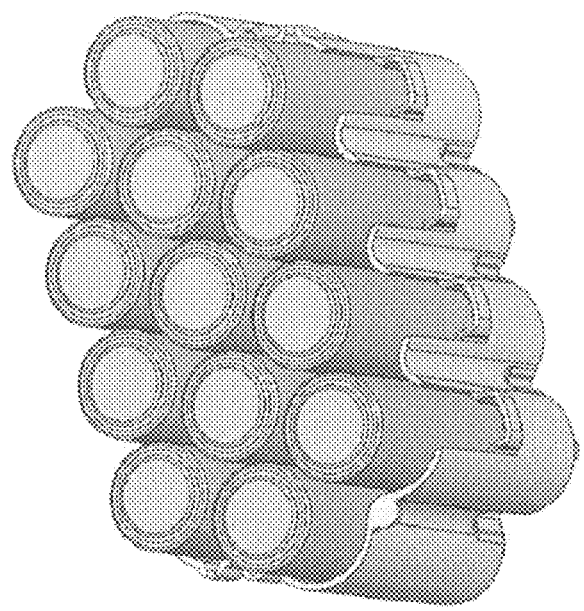
Figure 20A:
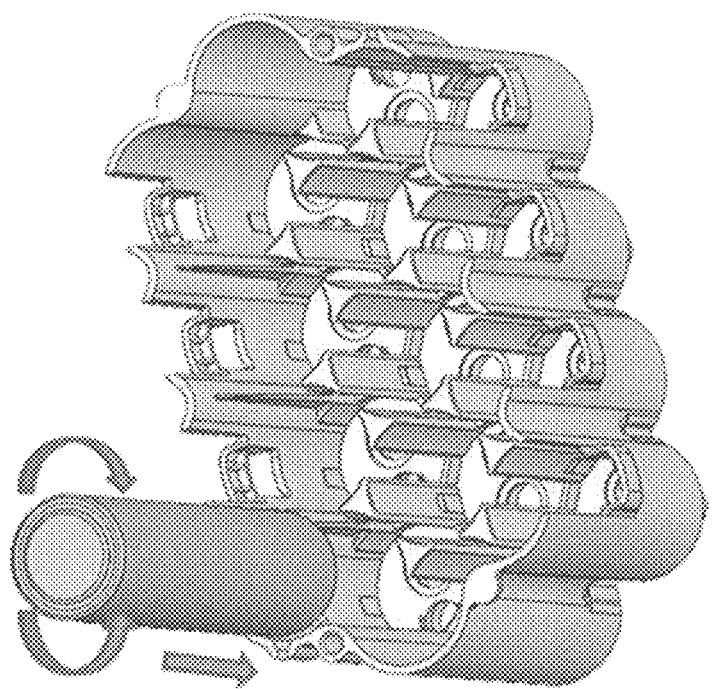

In FIG. 20A, the top surface 1202 on the middle housing 1108 is faced down so that a particular battery cell (such as battery cell 102(13)) can be pushed into the cell chamber 1208(13). As shown in FIG. 20A, the operator rotates the particular battery cell clockwise and counter-clockwise so that, with the guidance of the guiding slopes 1247 on the 3 position slabs (1246(13).1, 1246(13).2, 1246(13).3), the battery cell 102(13) can be fitly inserted into the desirable position within the cell chamber 1208(13).

In FIG. 20B, all 13 battery cells 102($i$) are inserted into the 13 the respective cell chambers 1208($i$) (i=1, 2, . . . , 13) by repeating the process shown in FIG. 20A 13 times.

Figure 20D:
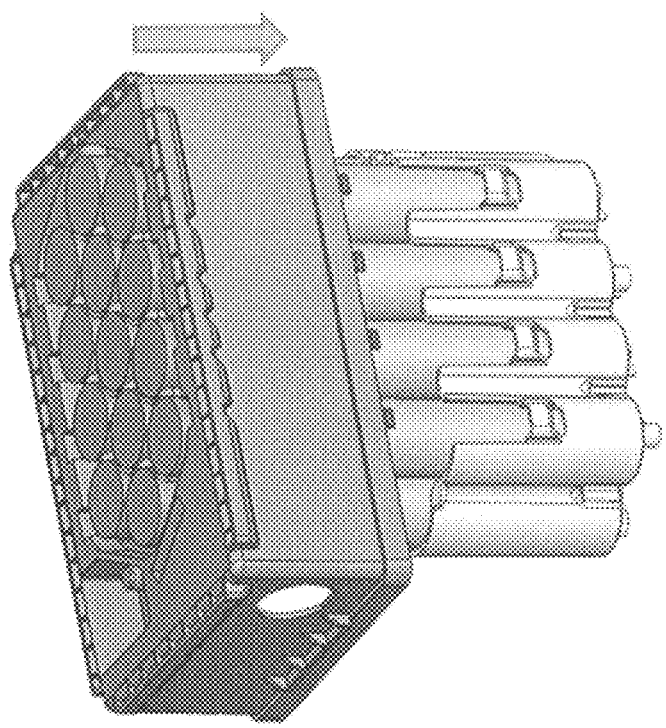
Figure 20C:
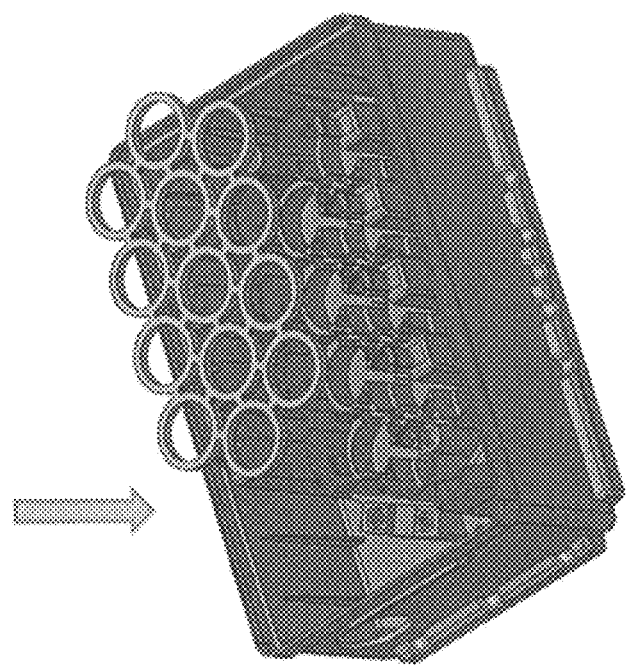

In FIG. 20C, the lower housing 1002 is faced up so that the cell bottom foam 1109 can be installed into the cell chambers in the internal housing 1802 of the lower housing 1002. Each of the 13 cushion ring 1702($i$) are accommodated into the respective cell chambers 1808($i$), (i=1, 2, . . . , 13).

In FIG. 20D, the bottom surface of the lower housing 1002 is turned faced down and the lower housing 1002 is then pushed down towards the middle housing 1108 so that the 4 wings (1822.1, 1822.2, 1822.3, 1822.4) on the first lateral wall 1818.1 of the internal housing 1802 are being inserted into the 4 open pockets (1222.1, 1222.2, 1222.3, 1222.4) on the first lateral wall 1218.1 on the middle housing 1108. In the meantime, the 4 wings (1824.1, 1824.2, 1824.3, 1824.4) on the second lateral wall 1818.2 of the internal housing 1802 are inserted into the 4 open pockets (1224.1, 1224.2, 1224.3, 1224.4) on the first lateral wall 1218.2 on the middle housing 1108. Continuously pushing down the lower housing 1002 towards the middle housing 1108, the taper snaps (or hook) 1902.$k$ on the first lateral wall 1818.1 on the internal housing 1802 of the lower housing 1002 bite into (or grasp onto) the top surfaces of the flanges (or stages) 1912.$k$ (k=1, 2, 3, 4) on the internal walls of the ears 1221.$k$ (k=1, 2, 3, 4). In the mean time, the taper snaps (or hook) 1904.$k$ on the second lateral wall 1818.2 on the internal housing 1802 of the lower housing 1002 bite into (or grasp onto) the top surfaces of the flanges (or stages) 1914.$k$ (k=1, 2, 3, 4) on the internal walls of the ears 1223.$k$ (k=1, 2, 3, 4) to fix the middle housing 1108 onto the internal housing 1802 of the lower housing 1012.

Figure 20E:
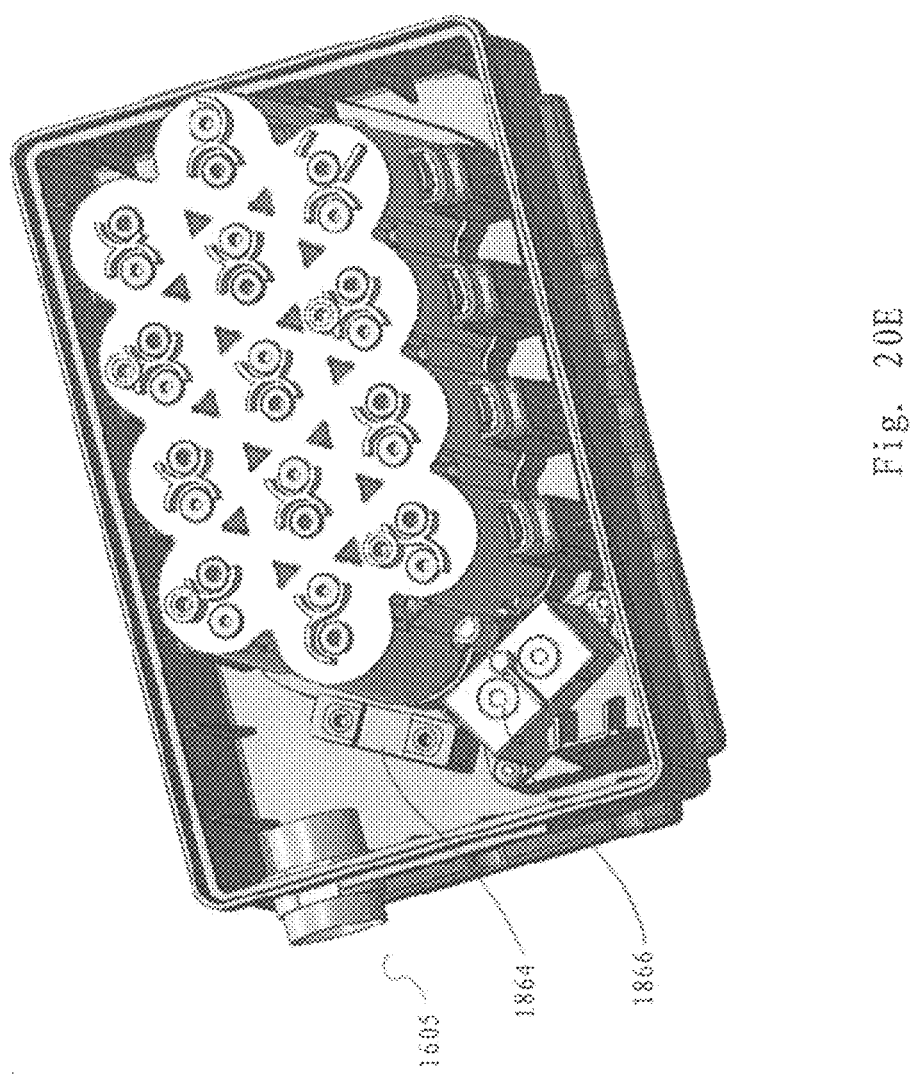

In FIG. 20E, the bottom surface of the lower housing 1002 is turned faced down so that the top surface 1202 of the middle housing 1108 is also turned faced up. The wire cap 1605 is then installed onto the lower housing 1102. In the step shown in FIG. 20E, the 2 temperature sensors (1604.1, 1604.2) are also installed into the 2 slots (1234.1, 1234.2) on the middle housing 1108.

Figure 20F:
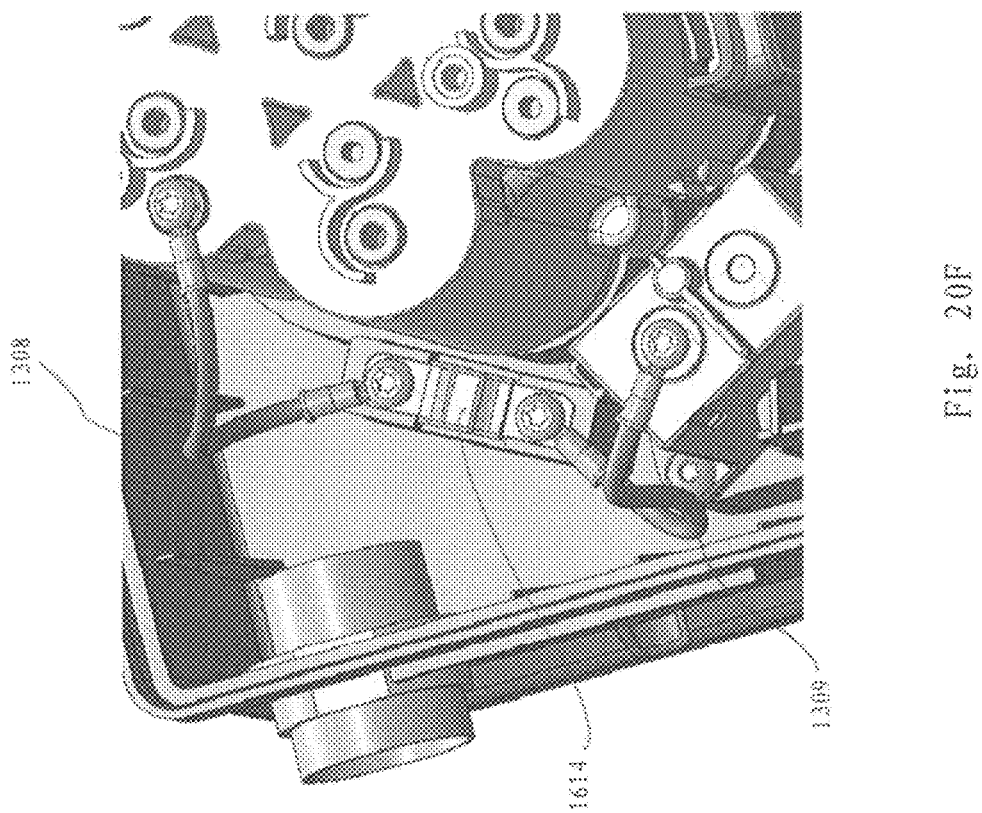

In FIG. 20F, the bridge plate 1614 is installed onto the bridge base 1864 and the connection housing 1110 is installed on to the housing base 1866 on the bottom surface of the lower housing 1002. The positive terminal of the battery cell (1) is connected to the one end of the bridge plate 1614 by the cable 1308; the other end of the cable 1308 is connected to the one end of the bridge plate 1314. The other end of the bridge plate 1314 is connected to the connection housing 1110 by the cable 1309.

Figure 20G:
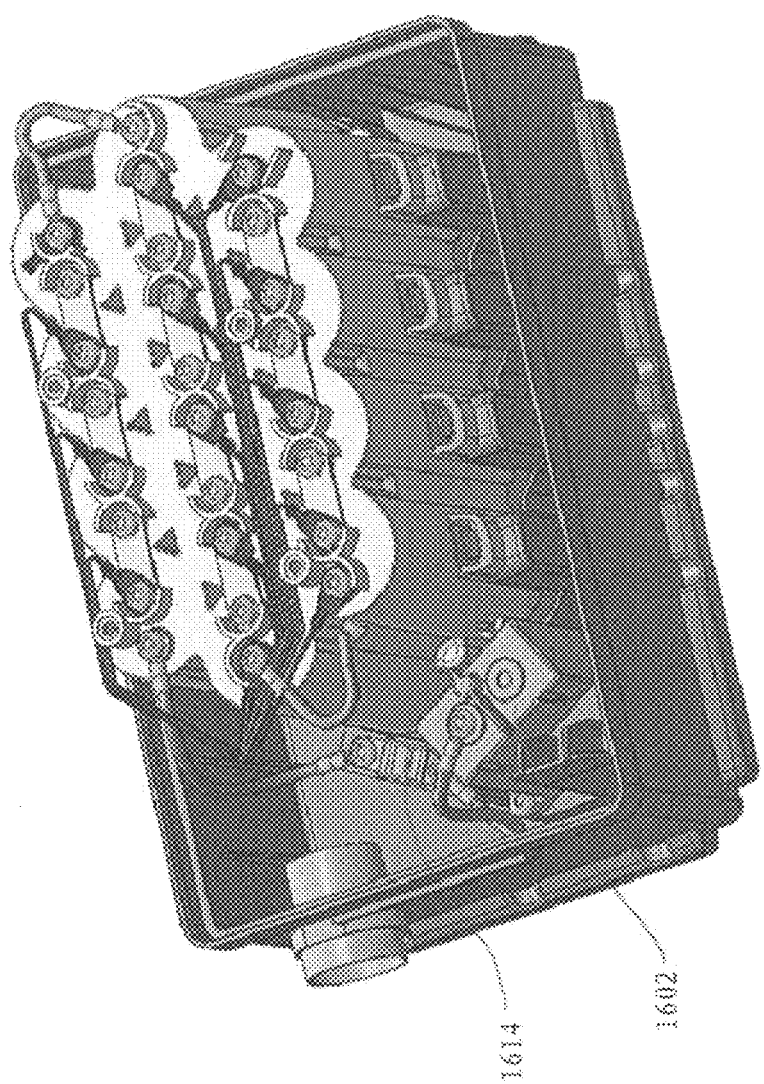

In FIG. 20G; the wire harness assembly 1106 is installed onto the top surface 1202 of the middle housing 1108 by using the screws shown in FIG. 13.

Figure 20H:
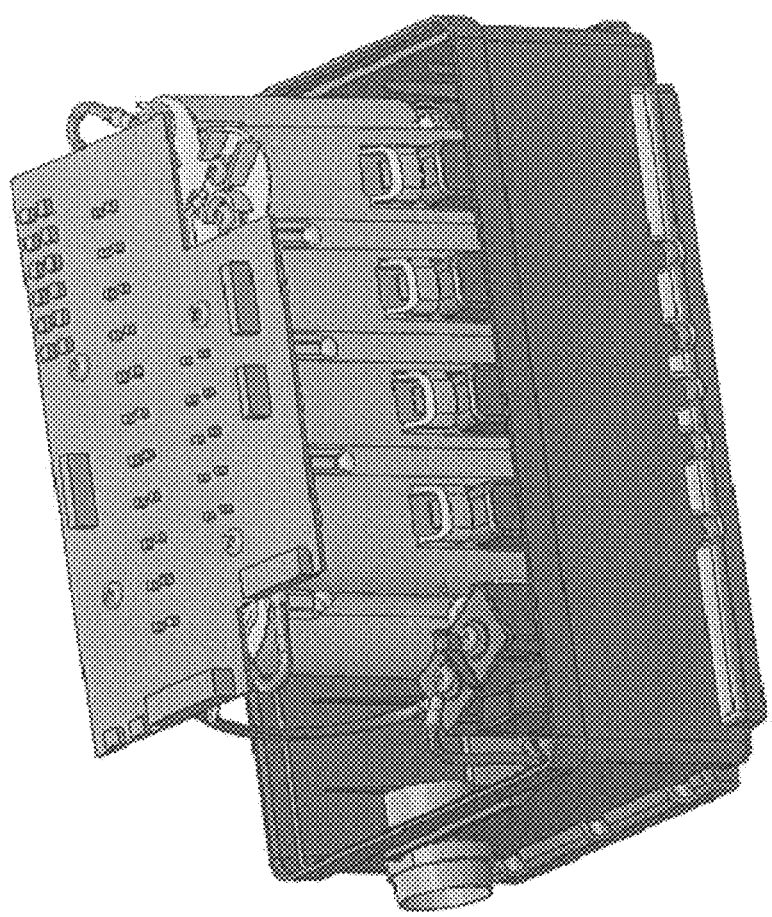
Figure 201:
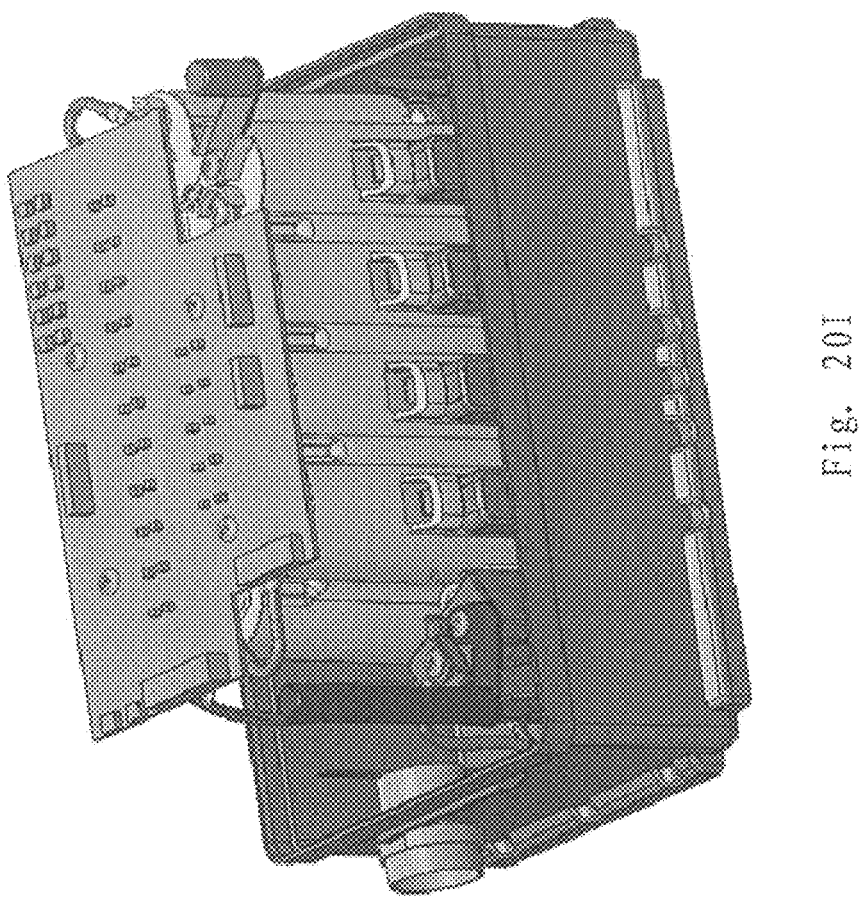

In FIG. 20H, PCB board 1104 is installed on the top surface 1102 of the middle housing 1108.

In FIG. 20I, the positive post 1003.1 is installed on the top of the connection housing 1602; the negative post 1003.2 is installed on the negative terminal of the battery cell 102(13) on the top surface 1102 of the middle housing 1108.

Figure 20J:
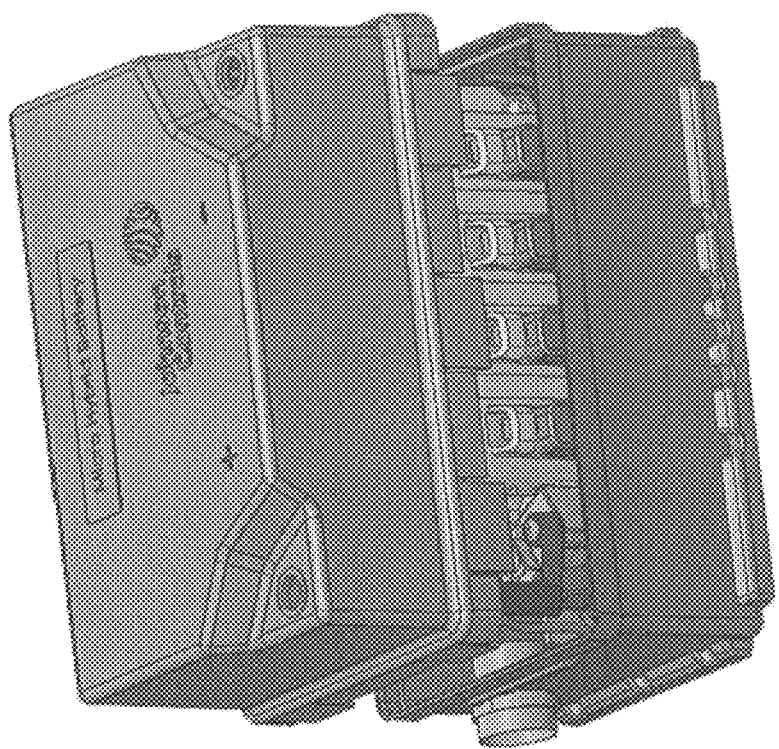

As shown in FIG. 20J, the top housing 1001 is pushed downwards towards the lower housing 1001 until the 10 clips (1022.1, 1022.2, 1022.3; 1024.1, 1024.2) and (1023.1, 1023.2, 1023.3; 1025.1, 1025.2) on the top housing 1001 lock into the 4 taper flanges (1123.1, 1123.2; 1125.1, 1125.2) so that the top housing 1001 is fixed onto the lower housing 1002 to form the battery 1000 without using screw and bolts.

The battery 1000 of the present invention includes the advantages as follows:
(1). It has more compacted size comparing with the existing batteries;
(2). It is easy to assembly the components together; and
(3). It is suitable for using in assembling lines for assembling the battery 1000 by using both human and machine resources because the assembly process can be divided into time-even assembling steps, which provide the feasibility of efficiently using manual and machine resource and effectively allocate time in the assembling process.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

The invention claimed is:

1. A battery including a plurality of serially connected battery cells, the battery comprising:
    an upper housing;
    a lower housing directly engaged with the upper housing;
    a wire harness assembly; and
    a middle housing that includes a plurality of top cell chambers, with each of the plurality of top cell chambers accommodating a top section of a corresponding one of the plurality of serially connected battery cells;
    wherein the lower housing includes a plurality of bottom cell chambers, with each of the plurality of bottom cell chambers for accommodating a bottom section of a corresponding one of the plurality of serially connected battery cells;
    wherein the middle housing has a top surface configured to allow installation of the wire harness assembly and the plurality of top cell chambers beneath the top surface of the middle housing and wherein the middle housing is contained within the upper housing and the lower housing;
    wherein the wire harness assembly includes a bus-bar assembly and a voltage-sense-wire harness; and
    wherein the bus-bar assembly and voltage-sense-wire harness are installed on the top surface of the middle housing.

2. The battery according to claim 1,
    wherein each of the plurality of cell chambers has a pair of installation holes for accommodating a pair of positive terminal and negative terminals of the battery cell.

3. The battery according to claim 1, wherein the bus-bar assembly includes a plurality of bus bars connecting the positive terminals or the negative terminals of a pair of adjacent battery cells; and
    wherein the voltage-sense-wire harness includes a plurality of voltage sense wires for connecting the positive terminals.

4. The battery according to claim 3,
    wherein each of the plurality of bus bars has a pair of installation holes connecting the positive terminals or the negative terminals of a pair of adjacent battery cells; and
    wherein each of the voltage sense wires has an installation hole on its distal end for connection with the positive terminals.

5. The battery according to claim 1,
    wherein the middle housing has means for attaching at least one temperature sensor so that the at least one temperature sensor can contact one of the 13 battery cells to measure the operation (working) temperature of the battery cell.

6. The battery according to claim 1,
    wherein each of the cell chambers has a plurality of position slabs, the plurality of position slabs forms a circular contour, which matches the external cylindrical shape of the battery cells, for positioning a respective cells into the desirable position in the assembling process of the battery.

7. The battery according to claim 1,
    wherein, after of the plurality of the battery cells is installed into the plurality of the cell chambers of the lower housing, there are a plurality of rooms between the bottoms of the plurality the battery cells and the bottom surfaces of the plurality of the cell chambers.

8. The battery according to claim 7,
    wherein each of the plurality of rooms has a through-hole on it; and
    wherein all of the plurality of rooms are fluidly-connected with each other via the through-hole to a channel leading to an outlet on the lower housing.

9. The battery according to claim 1,
    wherein the lower housing has an internal housing;
    wherein the middle housing has a first lateral side wall and a second lateral side wall with each of the first lateral side wall and the second lateral side wall having a plurality of ears;
    wherein each of the plurality of ears has an open pocket; and
    wherein the internal housing has a first lateral side wall and a second lateral side wall with each of the first lateral side wall and the second lateral side wall having a plurality of wings.

10. The battery according to claim 1, further comprising:
    a PCB board that is installed on the top surface of the middle housing.

11. The battery according to claim 1, further comprising:
    a connection housing that is attached onto the lateral side of the middle housing.

12. The battery according to claim 11, comprising:
    a positive post that is connected to the wire harness assembly and attached onto the top surface of the middle housing; and
    a negative post that is connected to the wire harness assembly and attached onto the top surface of the connection housing.

13. The battery according to claim 1,
    wherein the top housing has 4 edges defining an opening of the top housing, each of the 4 edges having a plurality of clips; and
    wherein the lower housing has 4 edges defining an opening of the lower housing, each of the 4 edges having a taper flange.

14. The battery according to claim 1, wherein each of the plurality of top cell chambers is cylinder-shaped, and wherein each of the plurality of bottom cell chambers is cylinder-shaped.

* * * * *